United States Patent
Ito et al.

(10) Patent No.: US 9,235,117 B2
(45) Date of Patent: Jan. 12, 2016

(54) PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE, AND ELECTRONIC DEVICE

(71) Applicant: FUJIFILM Corporation, Tokyo (JP)

(72) Inventors: Junichi Ito, Shizuoka (JP); Shuhei Yamaguchi, Shizuoka (JP); Hidenori Takahashi, Shizuoka (JP); Kei Yamamoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/550,181

(22) Filed: Nov. 21, 2014

(65) Prior Publication Data

US 2015/0079508 A1    Mar. 19, 2015

Related U.S. Application Data

(63) Continuation of application No. PCT/JP2013/064967, filed on May 23, 2013.

(60) Provisional application No. 61/650,710, filed on May 23, 2012.

(30) Foreign Application Priority Data

May 23, 2012   (JP) ................................. 2012-118056
Mar. 8, 2013   (JP) ................................. 2013-046376

(51) Int. Cl.
| G03F 7/004 | (2006.01) |
|---|---|
| H01L 21/027 | (2006.01) |
| C08F 220/18 | (2006.01) |
| C08F 220/22 | (2006.01) |
| G03F 7/039 | (2006.01) |
| G03F 7/09 | (2006.01) |
| G03F 7/11 | (2006.01) |
| G03F 7/20 | (2006.01) |
| G03F 7/32 | (2006.01) |
| G03F 7/40 | (2006.01) |
| G03F 7/038 | (2006.01) |

(52) U.S. Cl.
CPC .......... G03F 7/0046 (2013.01); C08F 220/18 (2013.01); C08F 220/22 (2013.01); G03F 7/004 (2013.01); G03F 7/038 (2013.01); G03F 7/039 (2013.01); G03F 7/0397 (2013.01); G03F 7/091 (2013.01); G03F 7/11 (2013.01); G03F 7/2041 (2013.01); G03F 7/32 (2013.01); G03F 7/325 (2013.01); G03F 7/40 (2013.01); H01L 21/027 (2013.01); H01L 21/0273 (2013.01)

(58) Field of Classification Search
CPC ..... G03F 7/038; G03F 7/0388; G03F 7/2041; G03F 7/03; G03F 7/325; G03F 7/0046; G03F 7/11; H01L 21/0273; H01L 21/0274; C08F 220/18; C08F 220/22
USPC ........... 430/270.1, 271.1, 435, 434, 322, 325, 430/330, 331, 396; 526/319, 245
See application file for complete search history.

(56) References Cited

U.S. PATENT DOCUMENTS

| 7,700,260 | B2 * | 4/2010 | Kanna et al. ............. 430/270.1 |
|---|---|---|---|
| 8,389,200 | B2 * | 3/2013 | Kanna et al. ............. 430/270.1 |
| 8,475,997 | B2 * | 7/2013 | Shiono et al. ............ 430/270.1 |
| 8,530,598 | B2 * | 9/2013 | Takeshita et al. ......... 526/329.4 |
| 8,642,244 | B2 * | 2/2014 | Shiono et al. ............ 430/270.1 |
| 8,686,098 | B2 * | 4/2014 | Mori et al. ................. 526/242 |
| 8,703,384 | B2 * | 4/2014 | Kobayashi et al. ........ 430/270.1 |
| 8,993,223 | B2 * | 3/2015 | Anno et al. ................ 430/325 |
| 2005/0287471 | A1 * | 12/2005 | Araki et al. ............. 430/270.1 |
| 2008/0090173 | A1 | 4/2008 | Harada et al. |
| 2010/0136486 | A1 * | 6/2010 | Harada et al. ............. 430/296 |
| 2011/0151381 | A1 | 6/2011 | Hasegawa et al. |
| 2011/0255061 | A1 | 10/2011 | Wang et al. |
| 2011/0294069 | A1 | 12/2011 | Bae et al. |
| 2011/0299832 | A1 * | 12/2011 | Butcher ....................... 386/248 |
| 2011/0311914 | A1 * | 12/2011 | Kamimura et al. ........ 430/270.1 |
| 2012/0003591 | A1 * | 1/2012 | Enomoto et al. ............. 430/325 |

(Continued)

FOREIGN PATENT DOCUMENTS

| JP | 2008-088343 A | 4/2008 |
|---|---|---|
| JP | 2008260931 A * | 10/2008 |

(Continued)

OTHER PUBLICATIONS

Partial Machine Translation of WO 2011/158687 (no date).*

(Continued)

*Primary Examiner* — Amanda C Walke

(74) *Attorney, Agent, or Firm* — Sughrue Mion, PLLC

(57) ABSTRACT

There is provided a pattern forming method comprising (i) a step of forming a film by an actinic ray-sensitive or radiation-sensitive resin composition; (ii) a step of exposing the film; and (iii) a step of performing development by using a developer containing an organic solvent to form a negative pattern, wherein the actinic ray-sensitive or radiation-sensitive resin composition contains (A) a resin capable of increasing the polarity by an action of an acid to decrease the solubility in a developer containing an organic solvent, (B) a compound capable of generating an acid upon irradiation with an actinic ray or radiation, (C) a solvent, and (D) a resin having a repeating unit having a fluorine atom and not having a $CF_3$ partial structure.

16 Claims, No Drawings

(56) References Cited

U.S. PATENT DOCUMENTS

| | | |
|---|---|---|
| 2013/0065183 A1 | 3/2013 | Kobayashi et al. |
| 2013/0316287 A1* | 11/2013 | Sakakibara et al. ....... 430/285.1 |
| 2013/0337385 A1 | 12/2013 | Furukawa et al. |
| 2014/0255854 A1* | 9/2014 | Sakakibara et al. .......... 430/325 |

FOREIGN PATENT DOCUMENTS

| | | |
|---|---|---|
| JP | 2009-025707 A | 2/2009 |
| JP | 2011-132273 A | 7/2011 |
| JP | 2011-197339 A | 10/2011 |
| JP | 2013-057836 A | 3/2013 |
| JP | 2013-057925 A | 3/2013 |
| WO | 20110158687 A1 | 12/2011 |
| WO | 20120114963 A1 | 8/2012 |

OTHER PUBLICATIONS

ISR (PCT/ISA/210) issued Aug. 6, 2013, in related International Application No. PCT/JP2013/064967.

Written Opinion (PCT/ISA/237) issued Aug. 6, 2013, in related International Application No. PCT/JP2013/064967.

Office Action issued on Sep. 15, 2015 by the Japanese Patent Office in counterpart Japanese Application No. 2013-046376.

* cited by examiner

PATTERN FORMING METHOD, ACTINIC RAY-SENSITIVE OR RADIATION-SENSITIVE RESIN COMPOSITION, RESIST FILM, MANUFACTURING METHOD OF ELECTRONIC DEVICE, AND ELECTRONIC DEVICE

CROSS REFERENCE TO RELATED APPLICATION

This is a continuation of International Application No. PCT/JP2013/064967 filed on May 23, 2013, and claims priority from Japanese Patent Application No. 2012-118056 filed on May 23, 2012, U.S. Provisional Application No. 61/650,710 filed on May 23, 2012, and Japanese Patent Application No. 2013-046376 filed on Mar. 8, 2013 the entire disclosures of which are incorporated therein by reference.

TECHNICAL FIELD

The present invention relates to a pattern forming method, an actinic ray-sensitive or radiation-sensitive resin composition, a resist film, a manufacturing method of an electronic device, and an electronic device. More specifically, the present invention relates to a pattern forming method suitably used for lithographic processes in the manufacture of a semiconductor such as IC, the manufacture of a liquid crystal device and a circuit board such as a thermal head, and further other photo-fabrication, an actinic ray-sensitive or radiation-sensitive resin composition, a resist film, a manufacturing method of an electronic device, and an electronic device. Above all, the invention relates to a pattern forming method suitably used in exposure by an ArF exposure apparatus, an ArF immersion-type projection exposure apparatus and an EUV exposure apparatus with a light source that emits a far ultraviolet ray having a wavelength of 300 nm or less, an actinic ray-sensitive or radiation-sensitive resin composition, a resist film, a manufacturing method of an electronic device, and an electronic device.

BACKGROUND ART

Since the advent of the resist for KrF excimer laser (248 nm), an image-forming method utilizing chemical amplification has been used as the image-forming method of a resist so as to compensate for sensitivity reduction due to light absorption. To explain the image-forming method by taking a positive chemical amplification image-forming method as an example, an acid generator in the exposed area decomposes by exposure to generate an acid, an alkali-insoluble group is changed to an alkali-soluble group by utilizing the generated acid as a reaction catalyst in baking after exposure (PEB: Post Exposure Bake), and the exposed area is removed by alkali development. The positive image forming method utilizing chemical amplification mechanism has been now the main stream of image forming method.

Further, for the purpose of increasing resolution by shortening of wavelength, what is called an immersion method of filling the space between the projection lens and the sample with a liquid of high refractive index is known (hereinafter also referred to as "an immersion liquid"). For instance, examples of reducing development defects and reforming surface contact angle and the like by using a specific resin having a fluorinated alkyl group in a positive resist composition are disclosed in Published U.S. Patent Application 2011/0255061, JP-A-2008-88343 (The term "JP-A" as used herein refers to an "unexamined published Japanese patent application".) and JP-A-2011-132273.

However, in the above positive image-forming method, an isolated line or a dot pattern can be successfully formed, but when an isolated space or a fine hole pattern is formed, the profile of the pattern is liable to be deteriorated.

Accordingly, to cope with the demand for further fining of a pattern, not only a positive resist film of now in the main stream but also the technique of resolving a negative pattern of a resist film obtained from a chemical amplification resist composition with an organic developer is also known in recent years. As such technique, for example, in a negative pattern forming method of performing immersion exposure and using an organic developer as the developer, technique of adding a resin containing a repeating unit having a specific alkyl chain in addition to the main resin is known (for example, refer to Published U.S. Patent Application 2011/0294069).

SUMMARY OF INVENTION

However, in recent years, a need for a fine pattern having a line width of 50 nm or less is increasing more and more, and to meet such a need, in the case of forming a negative fine pattern having a line width of 50 nm or less on a resist film by a developing method using an organic developer, further reductions of bridge defect and particle generation are required.

The invention has been done in consideration of these problems, and an object of the invention is to provide a pattern forming method excellent in reduction of bridge defect and restrained in generation of particles in pattern formation of a fine pattern having a line width of 50 nm or less by a developing method using an organic developer, an actinic ray-sensitive or radiation-sensitive resin composition for use in the same method, a resist film, a manufacturing method of an electronic device, and an electronic device.

The invention consists of the following constitutions, and the above objects of the invention are attained by these constitutions.

[1] A pattern forming method comprising:
(i) a step of forming a film by an actinic ray-sensitive or radiation-sensitive resin composition,
(ii) a step of exposing the film, and
(iii) a step of performing development by using a developer containing an organic solvent to form a negative pattern,
wherein the actinic ray-sensitive or radiation-sensitive resin composition contains (A) a resin capable of increasing the polarity by an action of an acid to decrease the solubility in a developer containing an organic solvent, (B) a compound capable of generating an acid upon irradiation with an actinic ray or radiation, (C) a solvent, and (D) a resin having a repeating unit having a fluorine atom and not having a $CF_3$ partial structure.

[2] The pattern forming method as described in [1], wherein the repeating unit having a fluorine atom and not having a $CF_3$ partial structure in the resin (D) is a repeating unit having a fluorinated alkyl group not having a $CF_3$ partial structure.

[3] The pattern forming method as described in [2], wherein the fluorinated alkyl group not having a $CF_3$ partial structure is a linear fluorinated alkyl group.

[4] The pattern forming method as described in any of [1] to [3],
wherein the repeating unit having a fluorine atom and not having a $CF_3$ partial structure in the resin (D) is a repeating unit represented by the following formula (1):

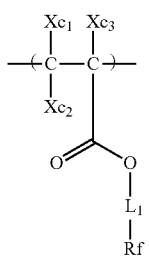

(1)

wherein each of $Xc_1$, $Xc_2$ and $Xc_3$ independently represents a hydrogen atom, a halogen atom, or an alkyl group not having a $CF_3$ partial structure;

$L_1$ represents a single bond or a divalent linking group not having a $CF_3$ partial structure; and Rf represents a fluorinated alkyl group not having a $CF_3$ partial structure.

[5] The pattern forming method as described in [4], wherein the terminal structure of the fluorinated alkyl group Rf not having a $CF_3$ partial structure is a $CH_3$ structure, a $CH_2F$ structure or a $CHF_2$ structure.

[6] The pattern forming method as described in [4] or [5], wherein $L_1$ does not have an ester bond.

[7] The pattern forming method as described in any of [1] to [6],
wherein the resin (D) has a repeating unit represented by the following formula (2):

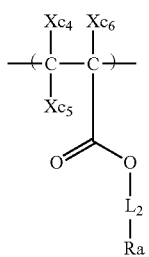

(2)

wherein each of $Xc_4$, $Xc_5$ and $Xc_6$ independently represents a hydrogen atom, a halogen atom, or an alkyl group not having a $CF_3$ partial structure;

$L_2$ represents a single bond or a divalent linking group not having a $CF_3$ partial structure; and Ra represents a group having at least one $CH_3$ partial structure.

[8] The pattern forming method as described in [7], wherein Ra in the repeating unit represented by formula (2) is a group having at least one structure represented by the following any of formulae (D3) to (D6):

(D3)

(D4)

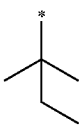

(D5)

(D6)

wherein * represents a bond to be connected to other atom in the group having at least one structure represented by any of formulae (D3) to (D6), or to $L_2$ in the above formula (2).

[9] The pattern forming method as described in [7] or [8], wherein the mass percentage content (%) in the repeating unit represented by formula (2), which is accounted for by the $CH_3$ partial structure of the repeating unit represented by formula (2), is 18.0% or more.

[10] The pattern forming method as described in any of [1] to [9],
wherein the weight average molecular weight of the resin (D) is 15,000 to 40,000.

[11] The pattern forming method as described in any of [1] to [10],
wherein the developer is a developer containing at least one organic solvent selected from the group consisting of a ketone-based solvent, an ester-based solvent, an alcohol-based solvent, an amide-based solvent, and an ether-based solvent.

[12] The pattern forming method as described in any of [1] to [11], which further contains:
(iv) a step of performing rinsing by using a rinsing solution containing an organic solvent.

[13] An actinic ray-sensitive or radiation-sensitive resin composition used for the pattern forming method as described in any of [1] to [12].

[14] A resist film formed with the actinic ray-sensitive or radiation-sensitive resin composition as described in [13].

[15] A method for manufacturing an electronic device, containing the pattern forming method as described in any of [1] to [12].

[16] An electronic device manufactured by the manufacturing method of an electronic device as described in [15].

The invention further preferably consists of the following constitutions.

[17] The pattern forming method as described in any of items [1] to [12],
wherein the exposure in the above process (ii) is immersion exposure.

[18] The pattern forming method as described in any of [1] to [12] and [17],
wherein the exposure in the above process (ii) is ArF exposure.

[19] The actinic ray-sensitive or radiation-sensitive resin composition as described in [13], which is a chemical amplification resist composition for organic solvent development.

[20] The actinic ray-sensitive or radiation-sensitive resin composition as described in item [13] or [19], which is a composition for immersion exposure.

According to the invention, a pattern forming method excellent in reduction of bridge defect and restrained in generation of particles in pattern formation of a fine pattern having a line width of 50 nm or less by a developing method using an organic developer, an actinic ray-sensitive or radiation-sensitive resin composition for use in the same method, a resist film, a manufacturing method of an electronic device, and an electronic device can be provided.

DESCRIPTION OF EMBODIMENTS

The mode for carrying out the invention is described in detail below.

In the description of the invention, when a group (an atomic group) is denoted without specifying whether substituted or unsubstituted, the group encompasses both a group having no substituent and a group having a substituent. For example, "an alkyl group" encompasses not only an alkyl group having no substituent (an unsubstituted alkyl group) but also an alkyl group having a substituent (a substituted alkyl group).

In the description of the invention, the "actinic ray" or "radiation" means, for example, a bright line spectrum of a mercury lamp, a far ultraviolet ray typified by excimer laser, an extreme ultraviolet ray (EUV light), an X-ray or an electron beam (EB). Also, in the present invention, the "light" means an actinic ray or radiation.

Further, the "exposure" in the description of the invention encompasses not only exposure to a mercury lamp, a far ultraviolet ray typified by excimer laser, an extreme ultraviolet ray, an X-ray, EUV light or the like but also lithography with a particle beam such as electron beam and ion beam, unless otherwise indicated.

The pattern forming method of the invention comprises:
a step of forming a film by an actinic ray-sensitive or radiation-sensitive resin composition,
(ii) a step of exposing the film, and
(iii) a step of performing development by using a developer containing an organic solvent to form a negative pattern,
wherein the actinic ray-sensitive or radiation-sensitive resin composition contains:
(A) a resin capable of increasing the polarity by an action of an acid to decrease the solubility in a developer containing an organic solvent,
(B) a compound capable of generating an acid upon irradiation with an actinic ray or radiation,
(C) a solvent, and
(D) a resin having a repeating unit having a fluorine atom and not having a $CF_3$ partial structure.

The reason why the actinic ray-sensitive or radiation-sensitive resin composition according to the invention is excellent in reduction of bridge defect and restrained in generation of particles in the pattern formation of a fine pattern having a line width of 50 nm or less by a developing method using an organic developer is not clearly known but is presumed as follows.

Copolymers synthesized by ordinary radical polymerization have distribution and polymers having deviation in the composition may be formed in a certain rate. The case of a repeating unit having a $CF_3$ partial structure is also the same, and there is a possibility that polymers in which repeating units having a $CF_3$ partial structure are abundantly polymerized may be formed. Since such polymers are particularly low in surface free energy and low in compatibility with other polymers, it is considered that they are liable to form an aggregated product. Perfluoroalkyl resins such as polytetrafluoroethylene and the like are known to have conspicuously high hydrophobicity and lipophobicity as compared with hydrocarbon resins, and it is thought that polymers having excessive $CF_3$ partial structures are low in solubility in a developer. Such aggregated products take time to be dissolved in a developer, since motility of the polymers is low. Therefore, when a fine pattern having a line width of the order of several 10 nm is formed, it is pointed out that such an aggregated product of a polymer causes bridge defect and particle generation.

Further, in the formation of a negative pattern using an organic developer, it is thought that defects such as bride defect and particle generation are caused because a component low in solubility in an organic developer exists in a resin which is originally bound to have high solubility in an organic developer. For example, it is pointed out that the addition of a fluorine atom-containing resin in the formation of a negative pattern using an organic developer causes generation of defects due to aggregation of the hydrophobic fluorine atom-containing resin (Published U.S. Patent Application 2011/0294069, paragraph [0031]).

From the viewpoint of improving the solubility of the surface layer part of a resist film in a developer containing an organic solvent, the present inventors have found that the defects such as bridge defect and particle generation can be drastically reduced by replacing the $CF_3$ partial structure in a fluorine atom-containing resin to be contained in an actinic ray-sensitive or radiation-sensitive resin composition with a $CF_2H$ partial structure or $CFH_2$ partial structure.

This is probably for the reason that the $CF_2H$ partial structure or $CFH_2$ partial structure has surface free energy of two times or more the $CF_3$ partial structure (critical surface tension of $CF_3$: 6 $dyn/cm^2$, $CHF_2$: 15 $dyn/cm^2$) (Nobuo Ishikawa, Yoshio Kobayashi, Fusso no Kagoubutsu—Sono Kagaku to Ouyou (Fluorine Compounds—Chemistry and Application Thereof), (published by Kodansha Ltd.)), and so the repeating unit having a fluorine atom, which is thought to be the factor of the defects as described above, can restrain excessive aggregation of the polymer.

As a result, it is presumed that the resin (D) in the invention having a repeating unit having a fluorine atom and not having a $CF_3$ partial structure is excellent in reduction of bridge defect and can restrain generation of particles in the formation of a fine pattern having a line width of 50 nm or less by the developing method with an organic developer while maintaining high surface localizability and an excellent contact angle characteristic.

In the pattern forming method in the invention, the developer is preferably a developer containing at least one organic solvent selected from the group consisting of a ketone-based solvent, an ester-based solvent, an alcohol-based solvent, an amide-based solvent, and an ether-based solvent.

It is preferred for the pattern forming method according to the invention to further include (iv) a step of performing rinsing by using a rinsing solution containing an organic solvent.

The rinsing solution is preferably a rinsing solution containing at least one organic solvent selected from the group consisting of a hydrocarbon-based solvent, a ketone-based solvent, an ester-based solvent, an alcohol-based solvent, an amide-based solvent, and an ether-based solvent.

It is preferred for the pattern forming method in the invention to have (v) a step of heating after (ii) a step of exposure.

In the pattern forming method in the invention, the resin (A) is a resin capable of increasing the polarity by the action of an acid to increase the solubility in an alkali developer. Accordingly the pattern forming method may further have (vi) a step of performing development by using an alkali developer.

In the pattern forming method in the invention, (ii) the step of exposure may be performed a plurality of times.

In the pattern forming method in the invention, (v) the step of heating may be performed a plurality of times.

The resist film in the invention is a film formed with the above actinic ray-sensitive or radiation-sensitive resin composition, which is a film formed by coating the actinic ray-sensitive or radiation-sensitive resin composition on a substrate.

The actinic ray-sensitive or radiation-sensitive resin composition usable in the invention is described below.

The invention also relates to the actinic ray-sensitive or radiation-sensitive resin compositions described below.

The actinic ray-sensitive or radiation-sensitive resin composition according to the invention is used in negative development (such development as the solubility in a developer decreases when being exposed, and the exposed area remains as a pattern and the unexposed area is removed) in particular when a fine pattern of, for example, a line width of 50 nm or less is formed on a resist film. That is to say, the actinic ray-sensitive or radiation-sensitive resin composition according to the invention can be an actinic ray-sensitive or radiation-sensitive resin composition for organic solvent development that is used in development using a developer containing an organic solvent. "For organic solvent development" here means the use offered to a process of development using a developer containing at least an organic solvent.

The actinic ray-sensitive or radiation-sensitive resin composition according to the invention is typically a resist composition and particularly a negative resist composition (that is, a resist composition for organic solvent development) is preferred for the reason of capable of obtaining a high effect. Also, the composition according to the invention is typically a chemical amplification type resist composition.

[1] (A) A Resin Capable of Increasing the Polarity by the Action of an Acid to Decrease the Solubility in a Developer Containing an Organic Solvent The actinic ray-sensitive or radiation-sensitive resin composition according to the invention contains a resin (A) capable of increasing the polarity by the action of an acid to decrease the solubility in a developer containing an organic solvent. However, the resin (A) is a resin different from the later-described resin (D) (a resin not corresponding to the resin (D)).

As the resin capable of increasing the polarity by the action of an acid to decrease the solubility in a developer containing an organic solvent for use in the actinic ray-sensitive or radiation-sensitive resin composition according to the invention, for example, a resin having a group capable of decomposing by the action of an acid to generate a polar group (hereinafter also referred to as "acid-decomposable group") on either the main chain or side chain or both on the main chain and side chain of the resin (hereinafter also referred to as "acid-decomposable resin" or "resin (A)") can be exemplified.

The acid-decomposable group preferably has a structure where a polar group is protected with a group capable of decomposing and leaving by the action of an acid.

The polar group is not especially restricted so long as it is a group capable of being sparingly soluble or insoluble in a developer containing an organic solvent. The examples of the polar groups include acidic groups such as a phenolic hydroxyl group, a carboxyl group, a fluorinated alcohol group (preferably a hexafluoroisopropanol group), a sulfonic acid group, a sulfonamido group, a sulfonylimido group, an (alkylsulfonyl)(alkylcarbonyl)methylene group, an (alkylsulfonyl)(alkylcarbonyl)-imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group (groups dissociable in a 2.38 mass % tetramethylammonium hydroxide aqueous solution conventionally used as a developer for a resist), and an alcoholic hydroxyl group.

The alcoholic hydroxyl group is a hydroxyl group bonded to a hydrocarbon group, which means a hydroxyl group except for a hydroxyl group directly bonded to an aromatic ring (a phenolic hydroxyl group), and an aliphatic alcohol substituted with an electron-withdrawing group such as a fluorine atom at the α-position (for example, a fluorinated alcohol group (e.g., a hexafluoroisopropanol group)) is excluded from the hydroxyl group. The alcoholic hydroxyl group is preferably a hydroxyl group having a pKa of 12 or more and 20 or less.

As preferred polar groups, a carboxyl group, a fluorinated alcohol group (preferably a hexafluoroisopropanol group), and a sulfonic acid group are exemplified.

Preferred groups as the acid-decomposable groups are groups obtained by substituting the hydrogen atoms of these groups with a group capable of leaving by the action of an acid.

As the groups capable of leaving by the action of an acid, for example, —C($R_{36}$)($R_{37}$)($R_{38}$), —C($R_{36}$)($R_{37}$)($R_{39}$), and —C($R_{01}$)($R_{02}$)($R_{39}$) are exemplified.

In the above formulae, each of $R_{36}$ to $R_{39}$ independently represents an alkyl group, a cycloalkyl group, an aryl group, an aralkyl group, or an alkenyl group. $R_{36}$ and $R_{37}$ may be bonded to each other to form a ring.

Each of $R_{01}$ and $R_{02}$ independently represents a hydrogen atom, an alkyl group, a cycloalkyl group, an aryl group, an aralkyl group, or an alkenyl group.

The alkyl group represented by $R_{36}$ to $R_{39}$, $R_{01}$ and $R_{02}$ is preferably an alkyl group having 1 to 8 carbon atoms, and the examples thereof include a methyl group, an ethyl group, a propyl group, an n-butyl group, a sec-butyl group, a hexyl group, and an octyl group.

The cycloalkyl group represented by $R_{36}$ to $R_{39}$, $R_{01}$ and $R_{02}$ may be monocyclic or polycyclic. The monocyclic cycloalkyl group is preferably a cycloalkyl group having 3 to 8 carbon atoms, for example, a cyclopropyl group, a cyclobutyl group, a cyclopentyl group, a cyclohexyl group, and a cyclooctyl group are exemplified. The polycyclic cycloalkyl group is preferably a cycloalkyl group having 6 to 20 carbon atoms, for example, an adamantyl group, a norbornyl group, an isoboronyl group, a camphanyl group, a dicyclopentyl group, an α-pinel group, a tricyclodecanyl group, a tetracyclododecyl group, and an androstanyl group are exemplified. Incidentally at least one carbon atom in the cycloalkyl group may be substituted with a hetero-atom such as an oxygen atom.

The aryl group represented by $R_{36}$ to $R_{39}$, $R_{01}$ and $R_{02}$ is preferably an aryl group having 6 to 10 carbon atoms, and the examples thereof include a phenyl group, a naphthyl group, and an anthryl group.

The aralkyl group represented by $R_{36}$ to $R_{39}$, $R_{01}$ and $R_{02}$ is preferably an aralkyl group having 7 to 12 carbon atoms, and the examples thereof include a benzyl group, a phenethyl group, and a naphthylmethyl group.

The alkenyl group represented by $R_{36}$ to $R_{39}$, $R_{01}$ and $R_{02}$ is preferably an alkenyl group having 2 to 8 carbon atoms, and the examples thereof include a vinyl group, an allyl group, a butenyl group, and a cyclohexenyl group.

The ring formed by bonding $R_{36}$ and $R_{37}$ is preferably a cycloalkyl group (monocyclic or polycyclic). The cycloalkyl group is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. A monocyclic cycloalkyl group having 5 or 6 carbon atoms is more preferred, and a monocyclic cycloalkyl group having 5 carbon atoms is especially preferred.

As the acid-decomposable group, a cumyl ester group, an enol ester group, an acetal ester group, and a tertiary alkyl ester group are preferred, and a tertiary alkyl ester group is more preferred.

The resin (A) preferably contains a repeating unit represented by the following formula (I) as the repeating unit having an acid-decomposable group.

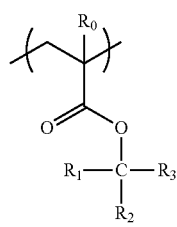

(I)

In formula (I), $R_0$ represents a hydrogen atom or a linear or branched alkyl group.

Each of $R_1$ to $R_3$ independently represents a linear or branched alkyl group or a monocyclic or polycyclic cycloalkyl group.

Two of $R_1$ to $R_3$ may be bonded to each other to form a monocyclic or polycyclic cycloalkyl group.

The linear or branched alkyl group represented by $R_0$ may have a substituent, preferably a linear or branched alkyl group having 1 to 4 carbon atoms, and for example, a methyl group, an ethyl group, an n-propyl group, an isopropyl group, an n-butyl group, an isobutyl group, and a t-butyl group are exemplified. The examples of the substituents include a hydroxyl group and a halogen atom (e.g., a fluorine atom).

$R_0$ preferably represents a hydrogen atom, a methyl group, a trifluoromethyl group or a hydroxymethyl group.

The alkyl group represented by $R_1$ to $R_3$ is preferably an alkyl group having 1 to 4 carbon atoms, and for example, a methyl group, an ethyl group, an n-propyl group, an isopropyl group, an n-butyl group, an isobutyl group, and a t-butyl group are exemplified.

The cycloalkyl group represented by $R_1$ to $R_3$ is preferably a monocyclic cycloalkyl group, such as a cyclopentyl group or a cyclohexyl group, or a polycyclic cycloalkyl group, such as a norbornyl group, a tetracyclodecanyl group, a tetracyclododecanyl group, or an adamantyl group.

The cycloalkyl group formed by bonding two members out of $R_1$ to $R_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. A monocyclic cycloalkyl group having 5 or 6 carbon atoms is especially preferred.

As one preferred embodiment, an embodiment where $R_1$ represents a methyl group or an ethyl group and $R_2$ and $R_3$ are bonded to form the above cycloalkyl group is exemplified.

Each of the above groups may have a substituent, and the examples of the substituents include, for example, a hydroxyl group, a halogen atom (e.g., a fluorine atom), an alkyl group (having 1 to 4 carbon atoms), a cycloalkyl group (having 3 to 8 carbon atoms), an alkoxy group (having 1 to 4 carbon atoms), a carboxyl group, and an alkoxycarbonyl group (having 2 to 6 carbon atoms), and the number of carbon atoms is preferably 8 or less.

As especially preferred embodiment of the repeating unit represented by formula (I), each of $R_1$, $R_2$ and $R_3$ independently represents a linear or branched alkyl group.

In this embodiment, the linear or branched alkyl group represented by $R_1$, $R_2$ and $R_3$ is preferably an alkyl group having 1 to 4 carbon atoms, and for example, a methyl group, an ethyl group, an n-propyl group, an isopropyl group, an n-butyl group, an isobutyl group, and a tert-butyl group are exemplified.

$R_1$ preferably represents a methyl group, an ethyl group, an n-propyl group, or an n-butyl group, more preferably a methyl group or an ethyl group, and especially preferably a methyl group.

$R_2$ preferably represents a methyl group, an ethyl group, an n-propyl group, an isopropyl group, or an n-butyl group, more preferably a methyl group or an ethyl group, and especially preferably a methyl group.

$R_3$ preferably represents a methyl group, an ethyl group, an n-propyl group, an isopropyl group, an n-butyl group, an isobutyl group, or a tert-butyl group, more preferably a methyl group, an ethyl group, an isopropyl group, or an isobutyl group, and especially preferably a methyl group, an ethyl group, or an isopropyl group.

The preferred specific examples of the repeating units having the above acid-decomposable group are shown below, but the invention is not restricted thereto.

In the specific examples, Rx represents a hydrogen atom, $CH_3$, $CF_3$ or $CH_2OH$. Each of Rxa and Rxb represents an alkyl group having 1 to 4 carbon atoms. Z represents a substituent, and when two or more Zs are present, each Z may be the same with or different from every other Z. p represents 0 or a positive integer. The specific examples and the preferred examples of Z are the same with the specific examples and the preferred examples of the substituents of each group of $R_1$ to $R_3$.

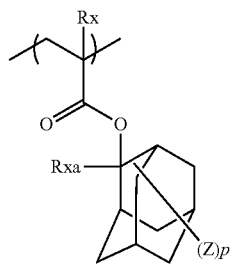 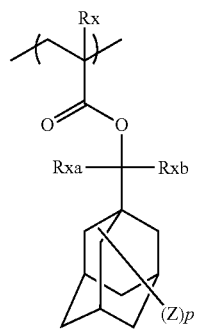

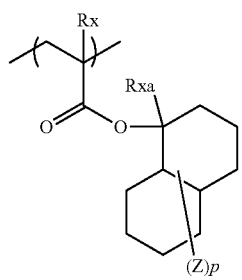

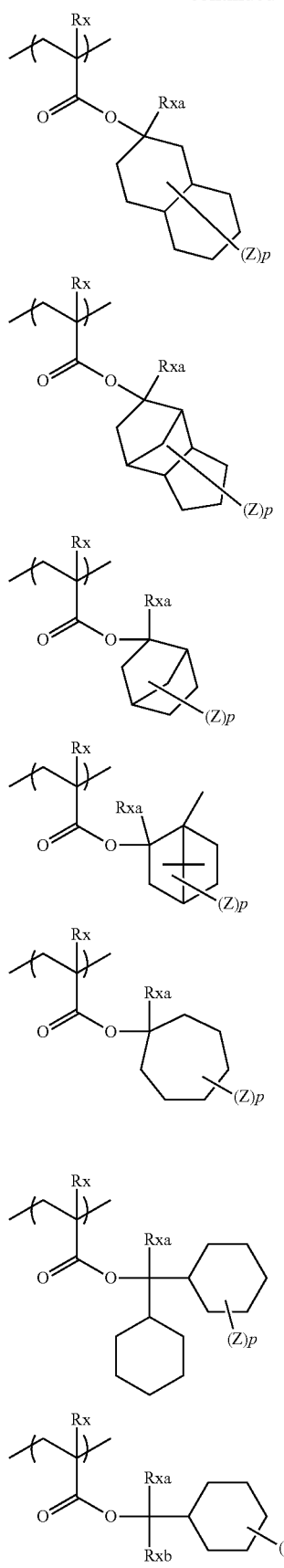
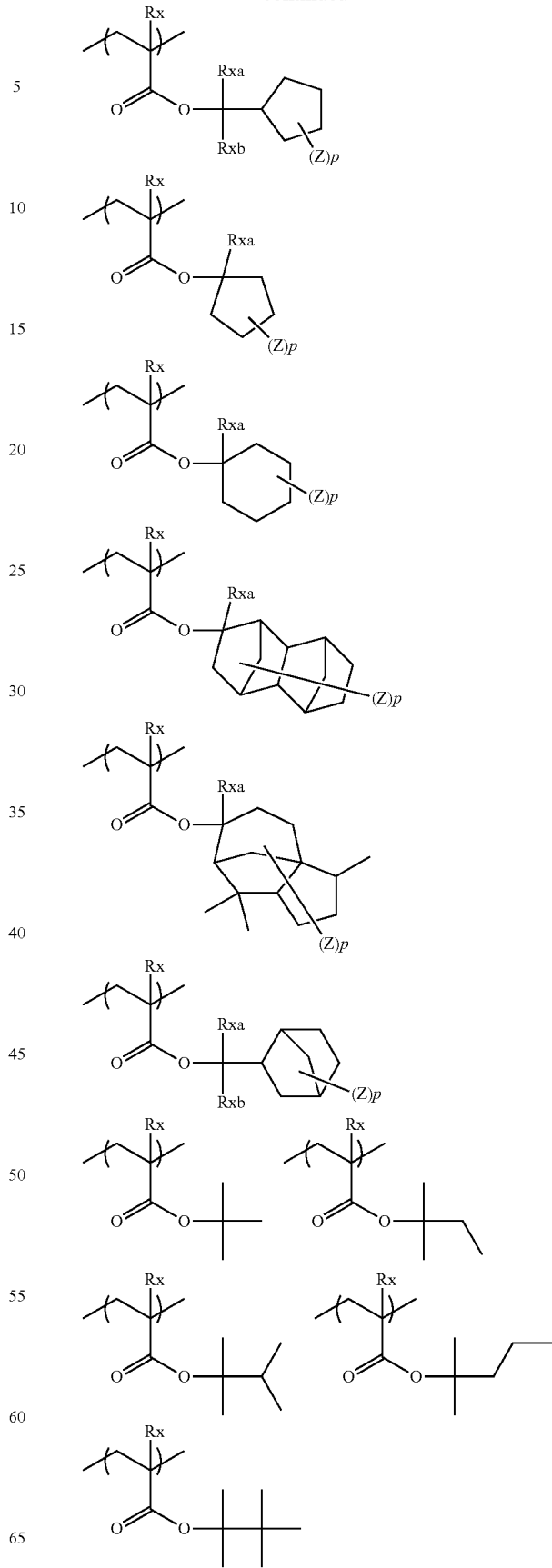

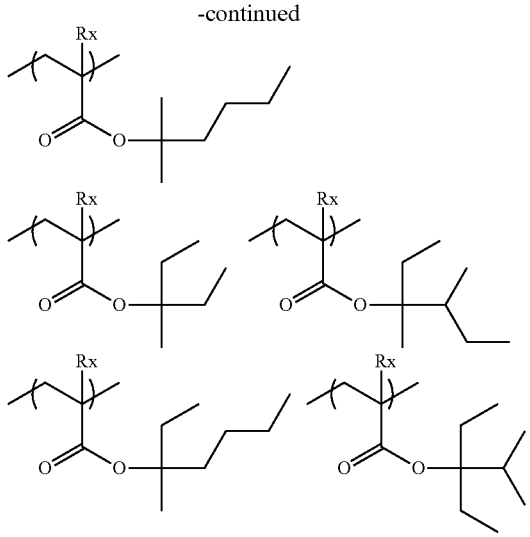

It is also preferred that the repeating unit having an acid-decomposable group is a repeating unit represented by the following formula (IB) capable of decomposing by the action of an acid to generate a carboxyl group. By using the repeating unit represented by formula (IB), a pattern forming method excellent in roughness performance such as line width roughness or the like, uniformity of a local pattern dimension and exposure latitude, and capable of all the more restraining the film thickness decrease of the pattern part formed by development, i.e., what is called film reduction, can be obtained.

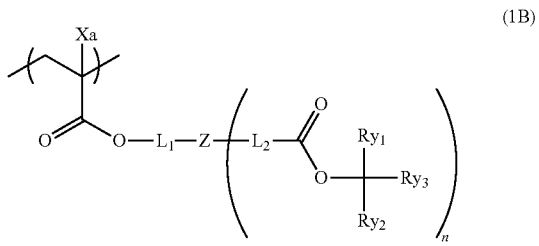

(IB)

In formula (IB), Xa represents a hydrogen atom, an alkyl group, a cyano group, or a halogen atom.

Each of $Ry_1$ to $Ry_3$ independently represents an alkyl group or a cycloalkyl group. Two of $Ry_1$ to $Ry_3$ may be linked to each other to form a ring.

Z represents a (n+1)-valent linking group having a polycyclic hydrocarbon structure which may have a hetero-atom as a ring member.

Each of $L_1$ and $L_2$ independently represents a single bond or a divalent linking group.

n represents an integer of 1 to 3.

When n is 2 or 3, each of a plurality of $L_2$, a plurality of $Ry_1$, a plurality of $Ry_2$, and a plurality of $Ry_3$ may be the same with or different from every other $L_2$, $Ry_1$, $Ry_2$, and $Ry_3$.

The alkyl group represented by Xa may have a substituent, and the examples of the substituents include a hydroxyl group and a halogen atom (preferably a fluorine atom).

The alkyl group represented by Xa is preferably an alkyl group having 1 to 4 carbon atoms, and the examples thereof include a methyl group, an ethyl group, a propyl group, a hydroxymethyl group and a trifluoromethyl group, and preferably a methyl group.

Xa preferably represents a hydrogen atom or a methyl group.

The alkyl group of $Ry_1$ to $Ry_3$ may be chain-like or branched, preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group of $Ry_1$ to $Ry_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The ring formed by bonding two members out of $Ry_1$ to $Ry_3$ is preferably a monocyclic hydrocarbon ring such as a cyclopentane ring or a cyclohexane ring, or a polycyclic hydrocarbon ring such as a norbornane ring, a tetracyclodecane ring, a tetracyclododecane ring, or an adamantane ring. A monocyclic hydrocarbon ring having 5 or 6 carbon atoms is especially preferred.

Each of $Ry_1$ to $Ry_3$ preferably independently represents an alkyl group, and more preferably a chain-like or branched alkyl group having 1 to 4 carbon atoms. The sum total of the carbon atom numbers of the chain-like or branched alkyl groups of $Ry_1$ to $Ry_3$ is preferably 5 or less.

Each of $Ry_1$ to $Ry_3$ may further have a substituent, and the examples of the substituents include, for example, an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), and substituents having carbon atoms of 8 or less are preferred. Above all, from the viewpoint of further improving the dissolution contrast of the resin in a developer containing an organic solvent before and after acid decomposition, the substituent is more preferably a substituent not having a heteroatom such as an oxygen atom, a nitrogen atom or a sulfur atom (for example, more preferably not an alkyl group substituted with a hydroxyl group), a group consisting of a hydrogen atom and a carbon atom alone is still more preferred, and a linear or branched alkyl group or a cycloalkyl group is especially preferred.

The linking group having a polycyclic hydrocarbon structure represented by Z includes a ring-assembly hydrocarbon ring group and a crosslinked cyclic hydrocarbon ring group, and these groups include a group obtained by removing arbitrary (n+1) hydrogen atoms from a ring-assembly hydrocarbon ring and a group obtained by removing arbitrary (n+1) hydrogen atoms from a crosslinked cyclic hydrocarbon ring.

The examples of the ring-assembly hydrocarbon ring groups include a bicyclohexane ring group and a perhydronaphthalene ring group. The examples of the crosslinked cyclic hydrocarbon ring groups include bicyclic hydrocarbon ring groups such as a pinane ring group, a bornane ring group, a norpinane ring group, a norbornane ring group, and a bicyclooctane ring group (e.g., a bicycle[2.2.2]octane ring group, a bicycle[3.2.1]octane ring group), a tricyclic hydrocarbon ring groups such as a homobledane ring group, an adamantane ring group, a tricycle[$5.2.1.0^{2,6}$]-decane ring group, and a tricycle[$4.3.1.1^{2,5}$]undecane ring group, and a tetracyclic hydrocarbon ring groups such as a tetracyclo[$4.4.0.1^{2,5}.1^{7,10}$] dodecane ring group, and a perhydro-1,4-methano-5,8-methanonaphthalene ring group. The crosslinked cyclic hydrocarbon ring groups also include condensed cyclic hydrocarbon ring groups, for example, condensed ring groups formed by condensation of a plurality of 5- to 8-membered cycloalkane ring groups, for example, a perhydronaphthalene (decaline) ring group, a perhydroanthracene ring group, a perhydrophenanthrene ring group, a perhydroacenaphthene ring group, a perhydrofluorene ring group, a perhydroindene ring group, and a perhydrophenalene ring group.

The examples of the preferred crosslinked cyclic hydrocarbon ring groups include a norbornane ring group, an adamantane ring group, a bicyclooctane ring group, and a tricycle [5.2.1.0$^{2,6}$]decane ring group, and the more preferred crosslinked cyclic hydrocarbon ring groups are a norbornane ring group and an adamantane ring group.

The linking group having a polycyclic hydrocarbon structure represented by Z may have a substituent. The examples of the substituents that may be substituted on Z include, for example, an alkyl group, a hydroxyl group, a cyano group, a ketone group (=O), an acyloxy group, —COR, —COOR, —CON(R)$_2$, —SO$_2$R, —SO$_3$R, and —SO$_2$N(R)$_2$, wherein R represents a hydrogen atom, an alkyl group, a cycloalkyl group, or an aryl group.

The alkyl group, alkylcarbonyl group, acyloxy group, —COR, —COOR, —CON(R)$_2$, —SO$_2$R, —SO$_3$R, and —SO$_2$N(R)$_2$ as the substituents that may be substituted on Z may further have a substituent, and a halogen atom (preferably a fluorine atom) is exemplified as such a substituent.

In the linking group having a polycyclic hydrocarbon structure represented by Z, the carbon constituting the polycyclic ring (the carbon contributing to ring formation) may be a carbonyl carbon. As described above, the polycyclic ring may also have a hetero-atom such as an oxygen atom and a sulfur atom as the ring member.

The examples of the linking groups represented by each of L$_1$ and L$_2$ include —COO—, —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene (preferably having 2 to 6 carbon atoms), and a linking group formed by combining a plurality of these members, and a linking group having a total carbon atom number of 12 or less is preferred.

L$_1$ is preferably a single bond, an alkylene group, —COO—, —OCO—, —CONH—, —NHCO—, -alkylene group-COO, -alkylene group-OCO—, -alkylene group-CONH—, -alkylene group-NHCO—, —CO—, —O—, —SO$_2$—, or -alkylene group-O—, and more preferably a single bond, an alkylene group, -alkylene group-COO, or -alkylene group-O—.

L$_2$ is preferably a single bond, an alkylene group, —COO—, —OCO—, —CONH—, —NHCO—, —COO-alkylene group-, —OCO-alkylene group-, —CONH-alkylene group-, —NHCO-alkylene group-, —CO—, —O—, —SO$_2$—, —O-alkylene group-, or —O-cycloalkylene group-, and more preferably a single bond, an alkylene group, —COO-alkylene group-, —O-alkylene group-, or —O-cycloalkylene group-.

In the above description, the bond "—" at the left end means to be connected to the ester bond on the main chain side in L$_1$ and to be connected to Z in L$_2$, and the bond "—" at the right end means to be bonded to Z in L$_1$ and to be bonded to the ester bond connecting to the group represented by (Ry$_1$)(Ry$_2$)(Ry$_3$)C— in L$_2$.

Incidentally, L$_1$ and L$_2$ may be bonded to the same atom constituting the polycyclic ring in Z.

n is preferably 1 or 2, and more preferably 1.

The specific examples of the repeating units represented by formula (IB) are shown below, but the invention is not restricted thereto. In the following specific examples, Xa represents a hydrogen atom, an alkyl group, a cyano group, or a halogen atom.

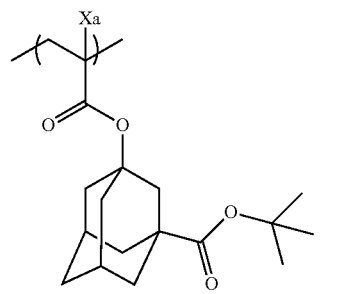

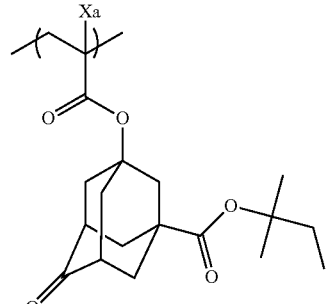

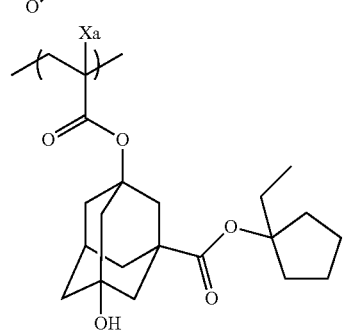

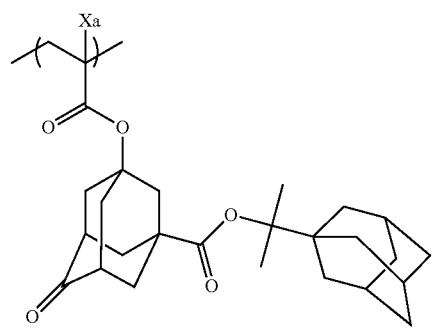

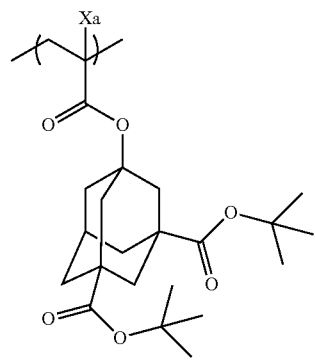

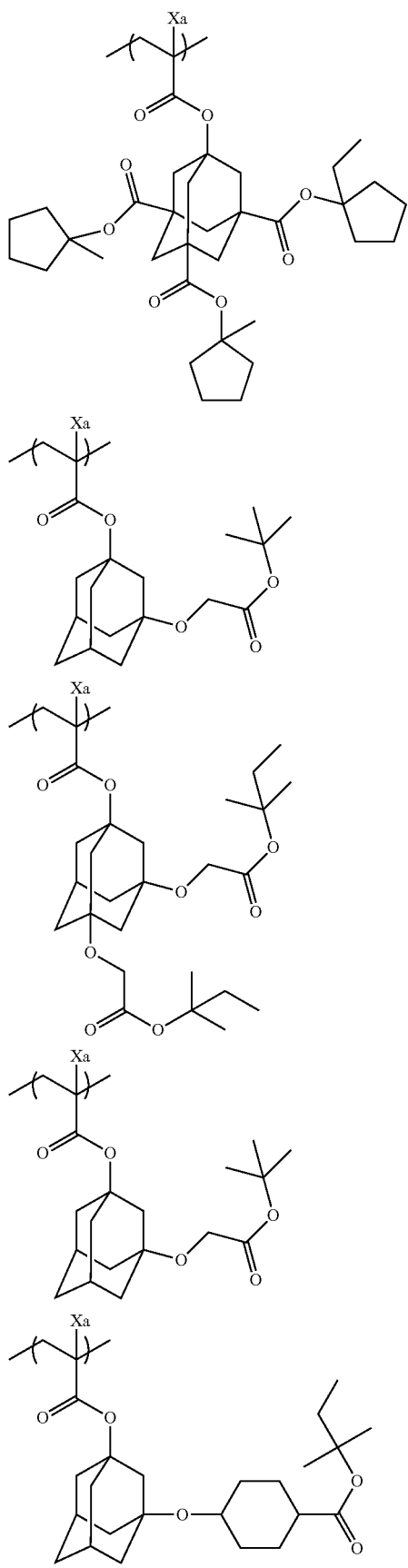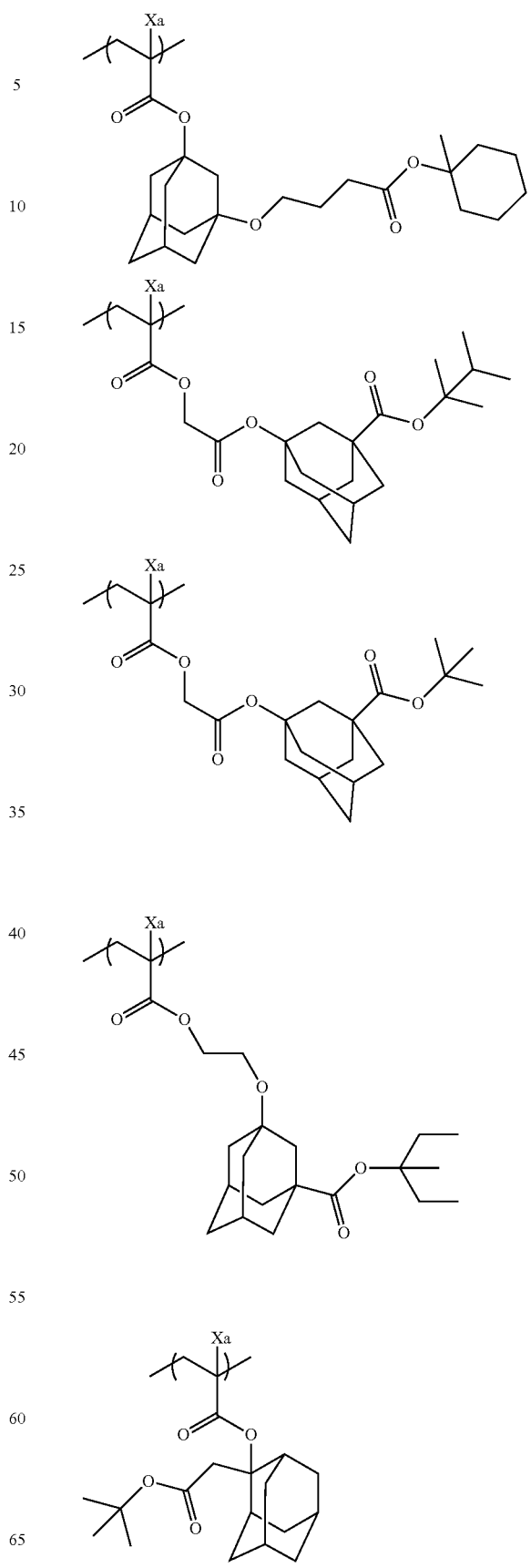

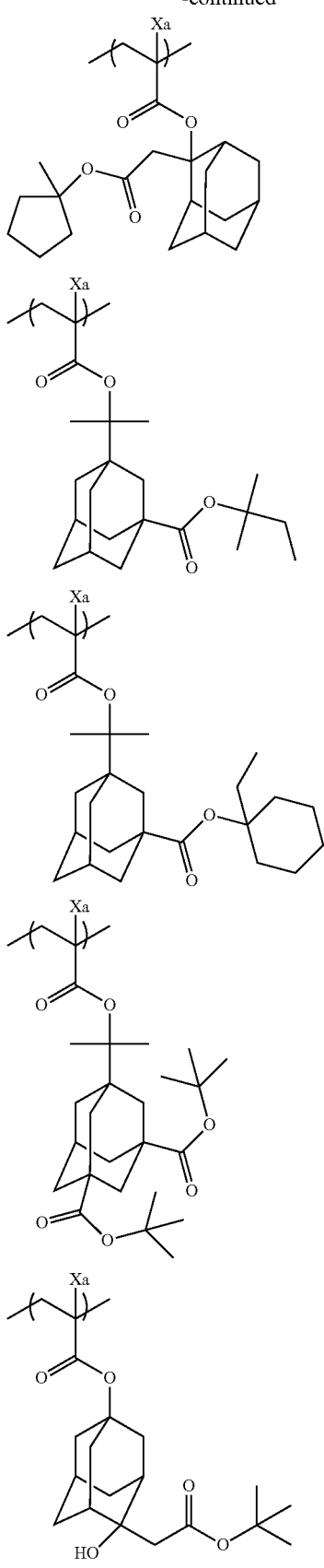
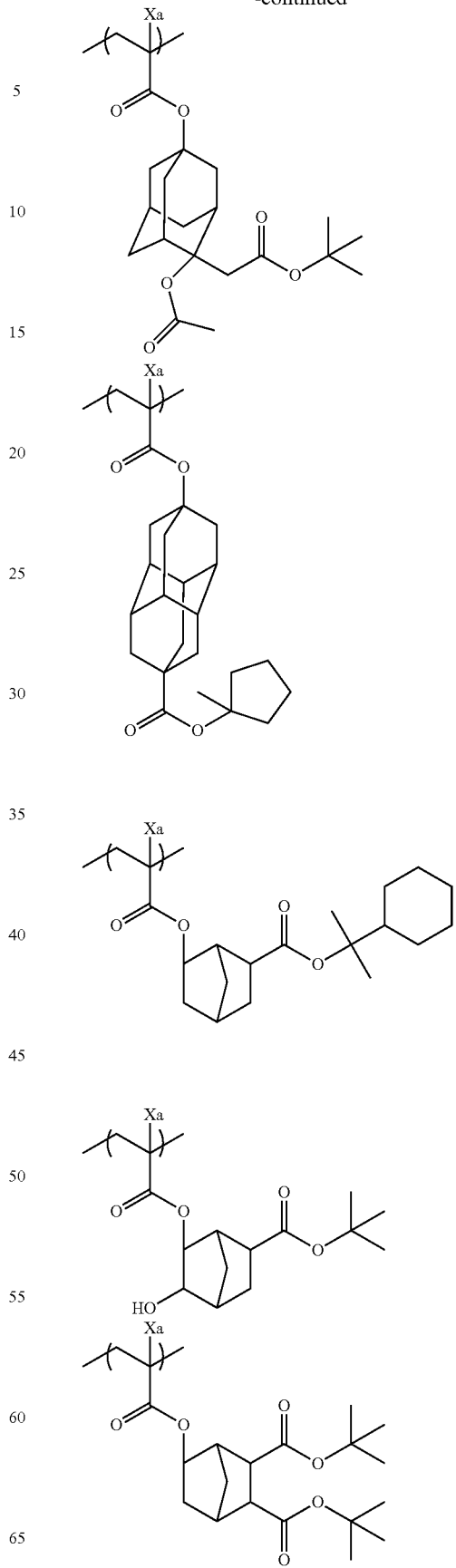

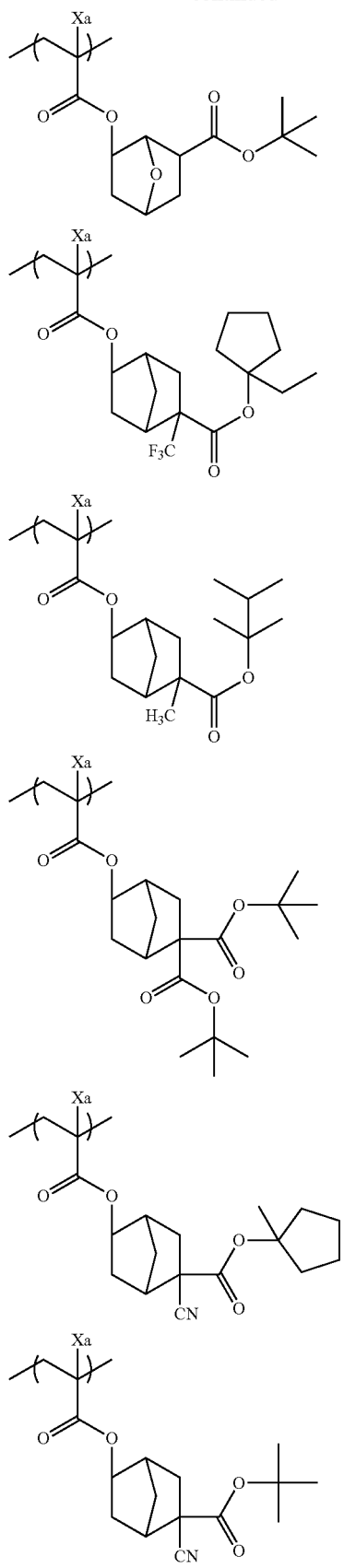
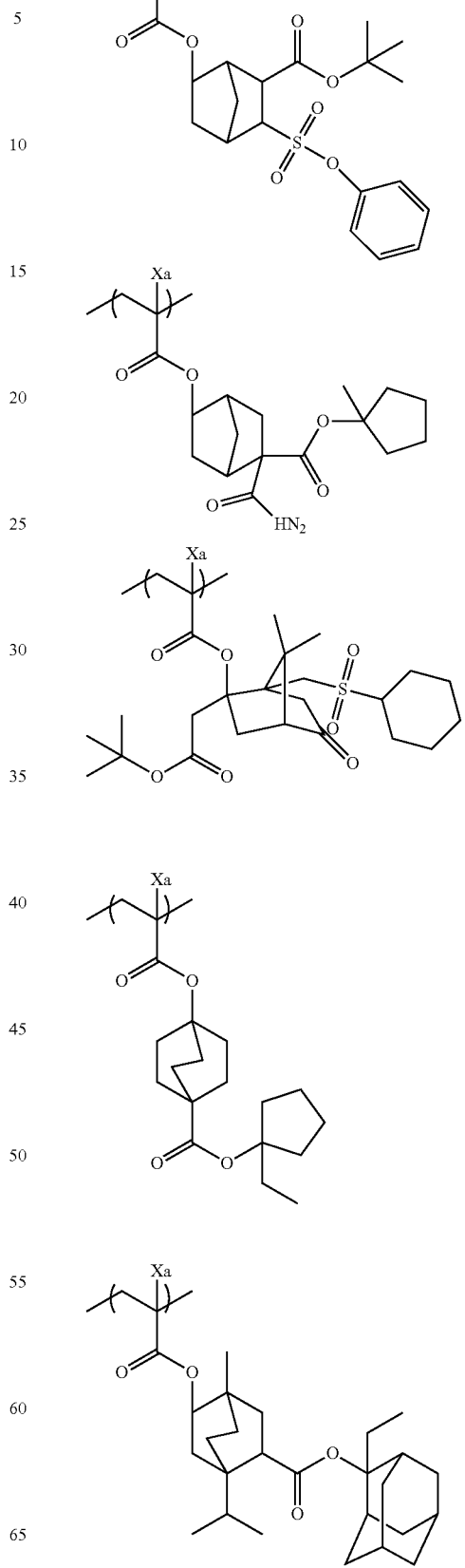

-continued

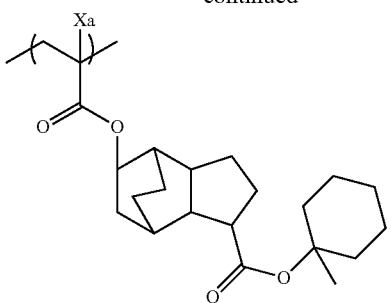

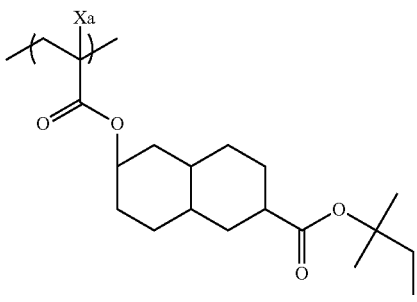

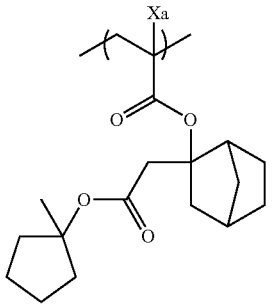

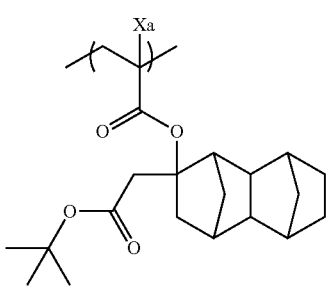

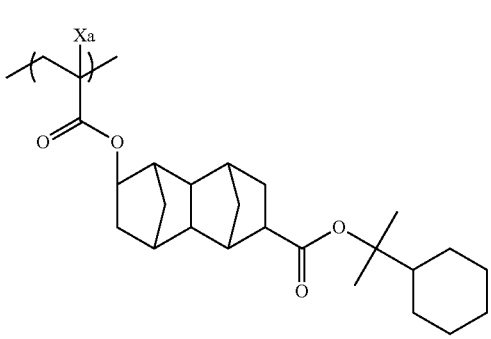

-continued

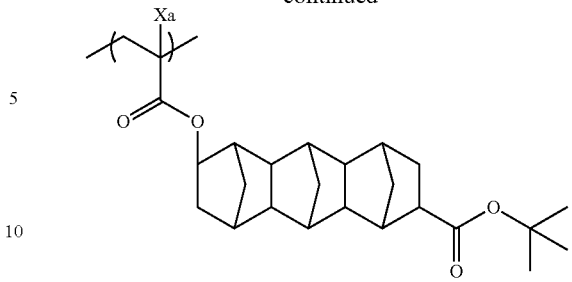

The repeating unit having an acid-decomposable group in the resin (A) may be used by one kind alone, or two or more kinds may be used in combination.

In the invention, it is preferred for the resin (A) to have 50 mol % or more, based on all the repeating units in the resin, of the repeating unit (when a plurality of kinds of repeating units are contained, the total) having an acid-decomposable group whose eliminated material has a molecular weight of 140 or less, in which the eliminated material is generated by the decomposition of the group capable of decomposing by the action of an acid to generate a polar group (acid-decomposable group) (when a plurality of kinds of eliminated materials are generated, the weighted average value of the molecular weights by molar fraction (hereinafter referred to as a molar average value)). By taking this constitution, when a negative image is formed, since the exposed area remains as a pattern, the film thickness reduction of the pattern part can be prevented by lessening the molecular weight of the eliminated material.

In the invention, "the eliminated material generated by the decomposition of the acid-decomposable group" means the substance decomposed and left by the action of an acid corresponding to the group capable of decomposing and leaving by the action of an acid.

In the invention, the molecular weight of a eliminated material generated by the decomposition of an acid-decomposable group (when a plurality of kinds of eliminated materials are generated, the molar average value) is more preferably 100 or less from the viewpoint of preventing the film thickness reduction of the pattern part.

Further, the greatest lower bound of the molecular weight of a eliminated material generated by the decomposition of an acid-decomposable group (when a plurality of kinds of eliminated materials are generated, the average value) is not especially restricted, but is preferably 45 or more from the viewpoint of exhibition of the function of the acid-decomposable group, and more preferably 55 or more.

In the invention, from the viewpoint of more surely maintaining the film thickness of the pattern part of the exposed area, it is more preferred for the resin (A) to have 60 mol % or more, based on all the repeating units in the resin, of the repeating unit (when a plurality of kinds of repeating units are contained, the total) having the acid-decomposable group having the molecular weight of 140 or less of the eliminated material generated by the decomposition of the acid-decomposable group, still more preferred to contain 65 mol % or more, and still yet preferred to contain 70 mol % or more. Further, the least upper bound is not especially restricted, but is preferably 90 mol % or less, and more preferably 85 mol % or less.

The content in total of the repeating unit having the acid-decomposable group is preferably 20 mol % or more based on all the repeating unit in the resin (A), more preferably 30 mol % or more, still more preferably 45 mol % or more, and especially preferably 50 mol % or more.

Also, the content in total of the repeating unit having the acid-decomposable group is preferably 90 mol % or less based on all the repeating unit in the resin (A), and more preferably 85 mol % or less.

The resin (A) may further contain a repeating unit having a lactone structure or a sultone structure.

As the lactone structure or sultone structure, any structure can be used so long as it has a lactone structure, but the structure is preferably a 5- to 7-membered ring lactone, and more preferably a 5- to 7-membered ring lactone to which another ring is condensed to form a bicyclo structure or a Spiro structure. The resin (A) more preferably contains a repeating unit having a lactone structure represented by any of the following formulae (LC1-1) to (LC1-17) or a sultone structure represented by any of the following formulae (SL1-1) to (SL1-3). The lactone structure or the sultone structure may be directly bonded to the main chain. Preferred lactone structures are (LC1-1), (LC1-4), (LC1-5), (LC1-6), (LC1-13), (LC1-14) and (LC1-17), and especially preferred lactone structure is (LC1-4). By using such a specific lactone structure, LWR and improvement defect are improved.

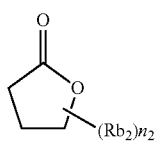
LC1-1

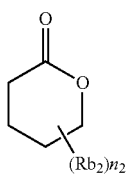
LC1-2

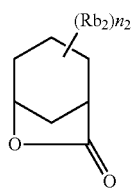
LC1-3

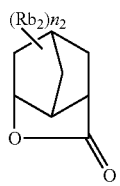
LC1-4

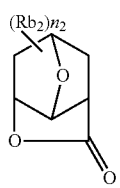
LC1-5

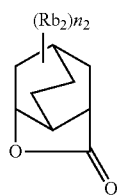
LC1-6

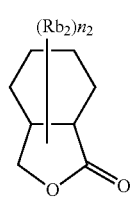
LC1-7

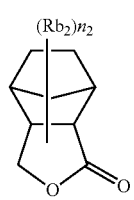
LC1-8

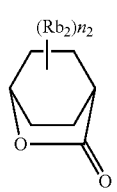
LC1-9

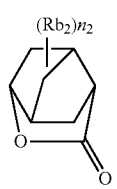
LC1-10

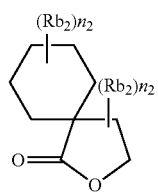
LC1-11

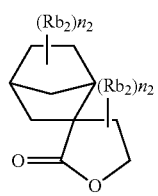
LC1-12

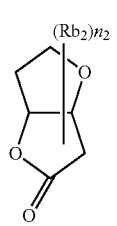
LC1-13

LC1-14

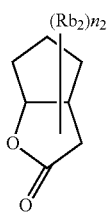

LC1-15

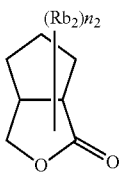

LC1-16

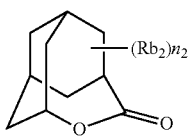

LC1-17

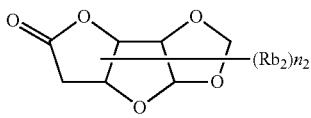

SL1-1

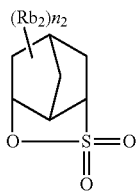

SL1-2

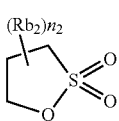

SL1-3

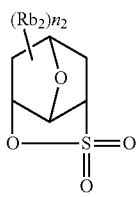

The lactone structure or sultone structure moiety may have or may not have a substituent ($Rb_2$). The examples of preferred substituents ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group, and more preferred are an alkyl group having 1 to 4 carbon atoms, a cyano group, and an acid-decomposable group. $n_2$ represents an integer of 0 to 4. When $n_2$ is 2 or more, the plurality of substituents ($Rb_2$) may be the same with or different from every other substituents ($Rb_2$). Further, the plurality of substituents ($Rb_2$) may be bonded to each other to form a ring.

The repeating unit having a lactone structure or a sultone structure usually has an optical isomer, and any optical isomer may be used. One kind of optical isomer may be used alone or a plurality of optical isomers may be used as mixture. When one kind of optical isomer is primarily used, the optical purity (ee) thereof is preferably 90% or more, and more preferably 95% or more.

The repeating unit having a lactone structure or a sultone structure is preferably a repeating unit represented by the following formula (AII).

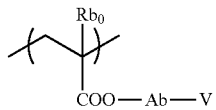

(AII)

In formula (AII), $Rb_0$ represents a hydrogen atom, a halogen atom, or an alkyl group (preferably having 1 to 4 carbon atoms) which may have a substituent.

The examples of the preferred substituents which the alkyl group represented by $Rb_0$ may have include a hydroxyl group and a halogen atom. As the examples of the halogen atoms of $Rb_0$, a fluorine atom, a chlorine atom, a bromine atom and an iodine atom are exemplified. $Rb_0$ preferably represents a hydrogen atom, a methyl group, a hydroxymethyl group, or a trifluoromethyl group, and especially preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group obtained by combining these groups. Ab preferably represents a single bond, or a divalent linking group represented by $-Ab_1-CO_2-$.

$Ab_1$ represents a linear or branched alkylene group, or a monocyclic or polycyclic cycloalkylene group, and preferably represents a methylene group, an ethylene group, a cyclohexylene group, an adamantylene group, or a norbornylene group.

V represents a group having a lactone structure or a sultone structure. Specifically, V is a group having the structure represented by any of the above formulae (LC1-1) to (LC1-17), (SL1-1) to (SL1-3).

When the resin (A) contains a repeating unit having a lactone structure or a sultone structure, the content of the repeating unit having a lactone structure or a sultone structure is preferably in the range of 0.5 to 80 mol % based on all the repeating units in the resin (A), more preferably in the range of 1 to 65 mol %, still more preferably in the range of 5 to 60 mol %, especially preferably in the range of 3 to 50 mol %, and most preferably in the range of 10 to 50 mol %.

One kind of the repeating unit having a lactone structure or a sultone structure may be used alone, or two or more kinds may be used in combination.

The specific examples of the repeating units having a lactone structure or a sultone structure are shown below, but the invention is not restricted thereto.

(In the formulae, Rx represents H, CH₃, CH₂OH or CF₃.)
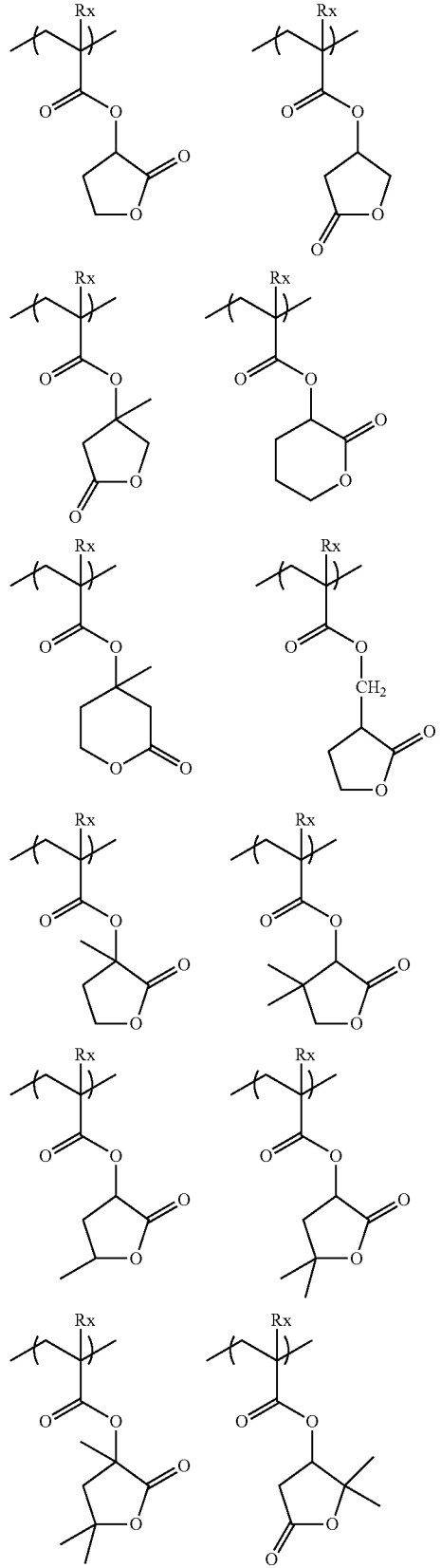
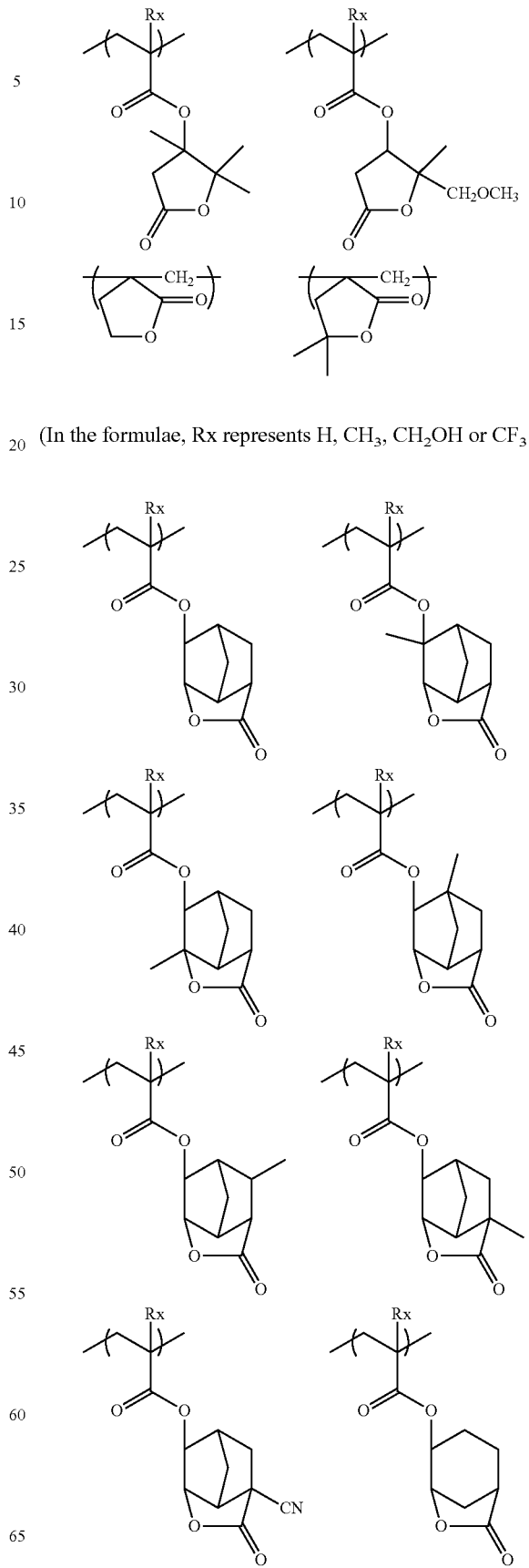
(In the formulae, Rx represents H, CH₃, CH₂OH or CF₃.)

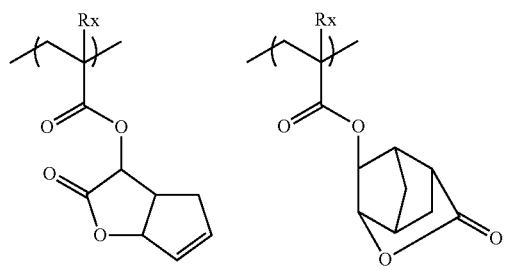
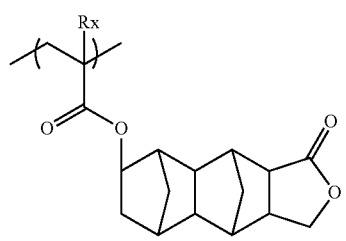
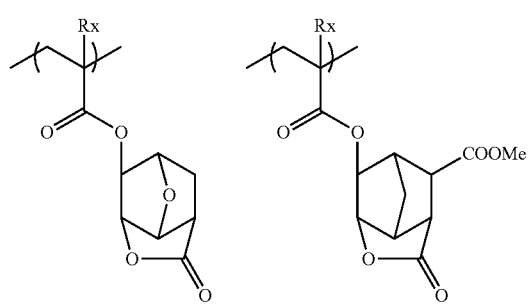
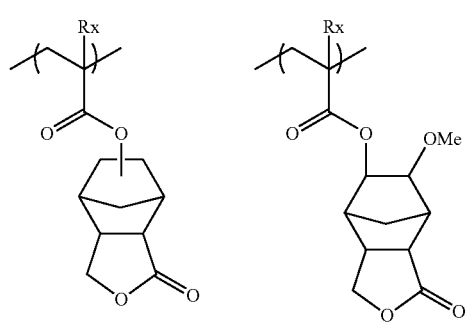
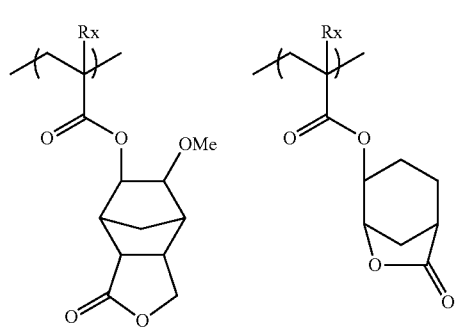
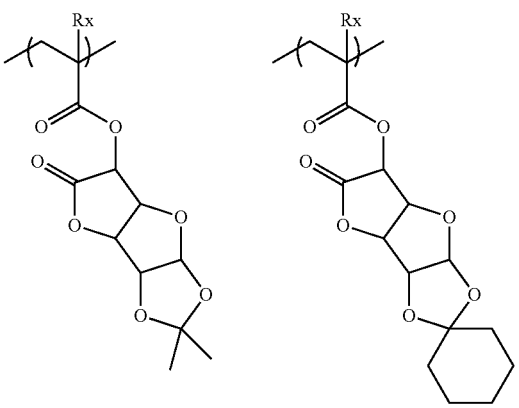
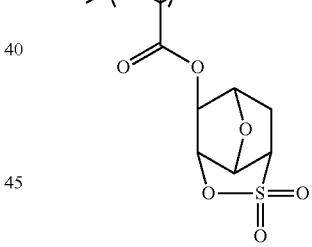
(In the formulae, Rx represents H, CH$_3$, CH$_2$OH or CF$_3$.)
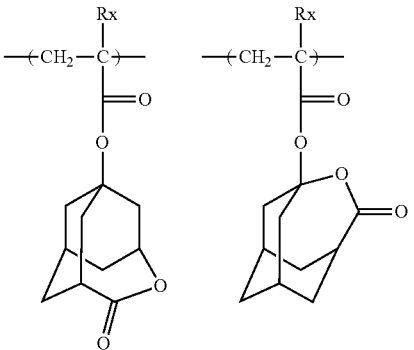

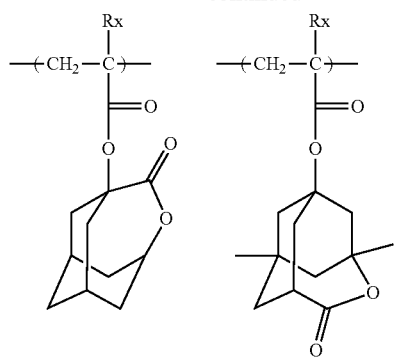
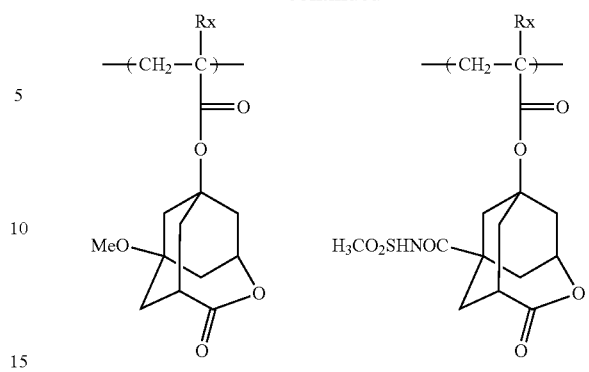
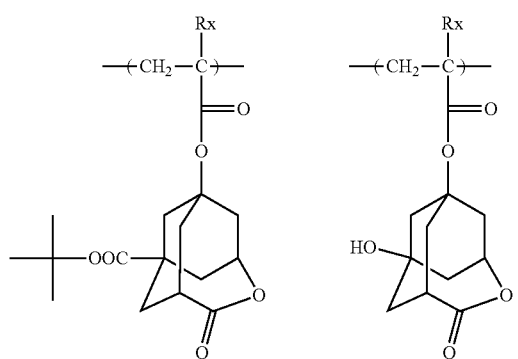
In the following specific examples, R represents a hydrogen atom, an alkyl group which may have a substituent, or a halogen atom, preferably a hydrogen atom, a methyl group, a hydroxymethyl group, or an acetoxymethyl group.
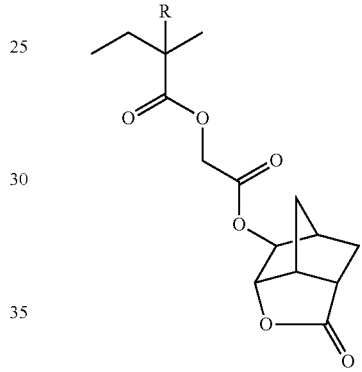
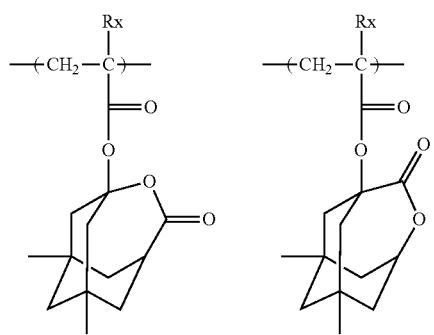
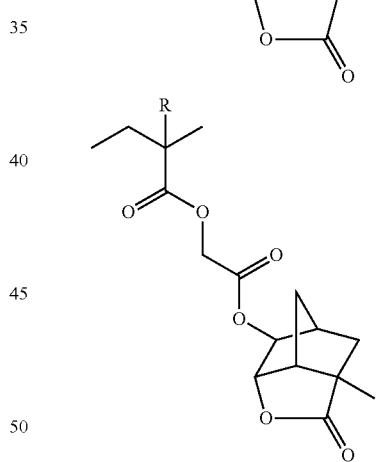
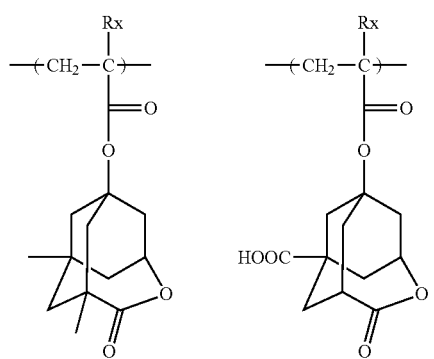
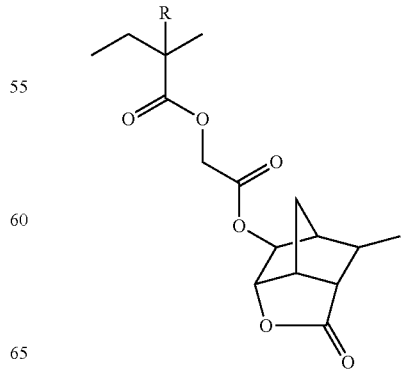

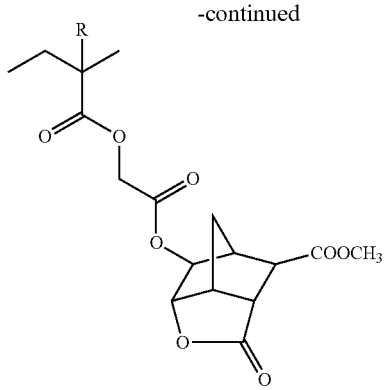
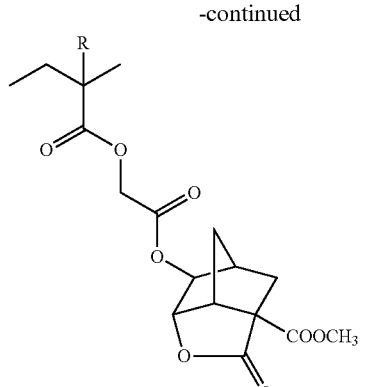
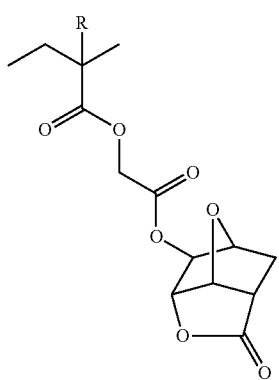
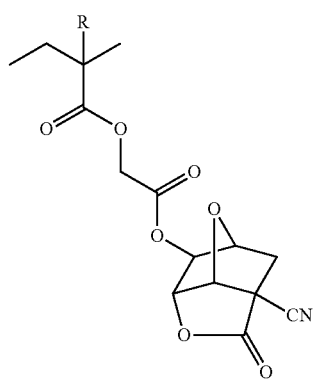
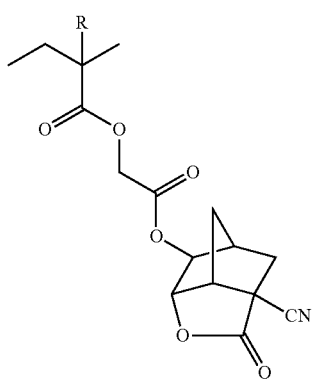
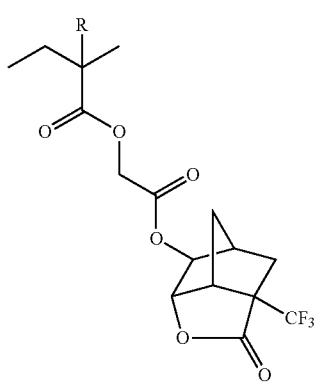
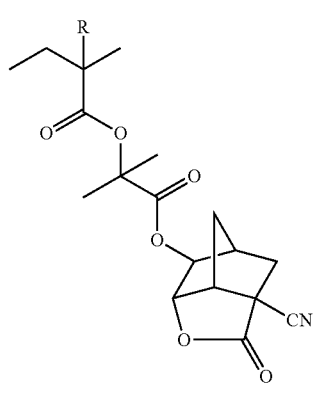

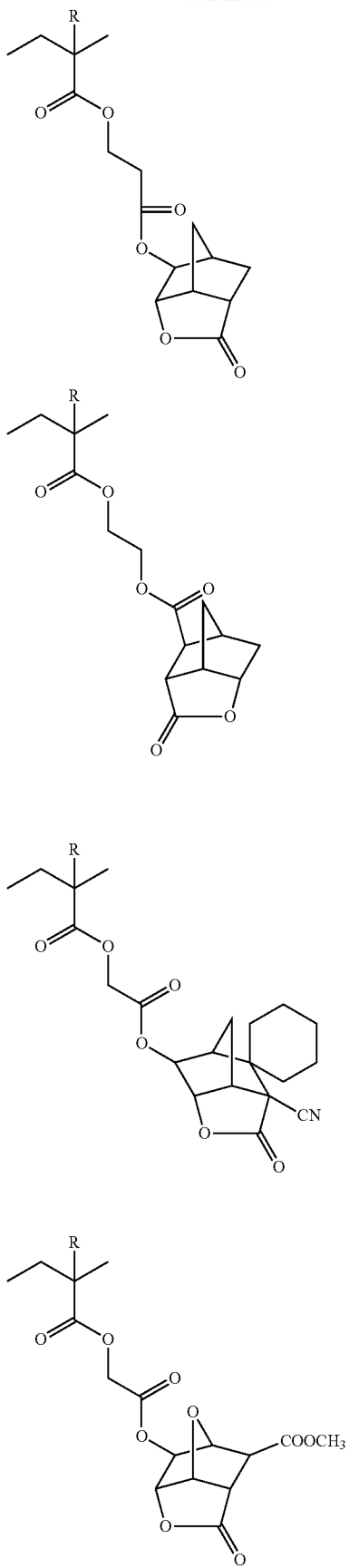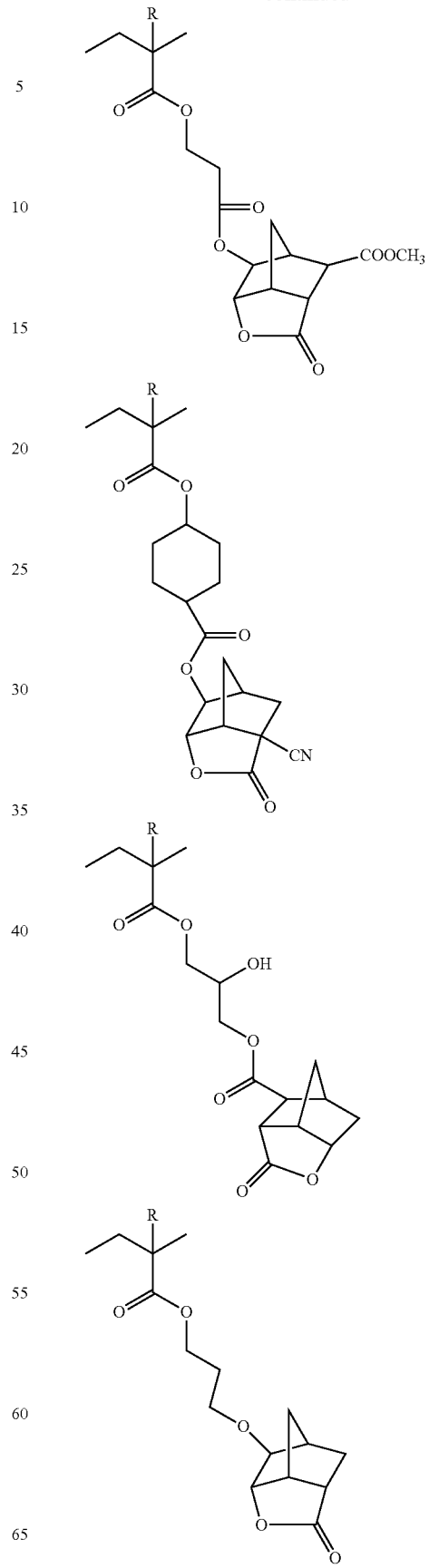

(In the formulae, Rx represents H, CH₃, CH₂OH or CF₃.)

The resin (A) may have a repeating unit having a hydroxyl group or a cyano group. By containing such a repeating unit, adhesion to a substrate and affinity with a developer are improved. The repeating unit having a hydroxyl group or a cyano group is preferably a repeating unit having an alicyclic hydrocarbon structure substituted with a hydroxyl group or a cyano group, and preferably not having an acid-decomposable group.

The repeating unit having an alicyclic hydrocarbon structure substituted with a hydroxyl group or a cyano group is preferably different from the repeating unit represented by formula (AII).

The alicyclic hydrocarbon structure in the alicyclic hydrocarbon structure substituted with a hydroxyl group or a cyano group is preferably an adamantyl group, a diamantyl group, or a norbornane group. As the alicyclic hydrocarbon structure substituted with a hydroxyl group or a cyano group, the partial structures represented by any of the following formulae (VIIa) to (VIId) are preferred.

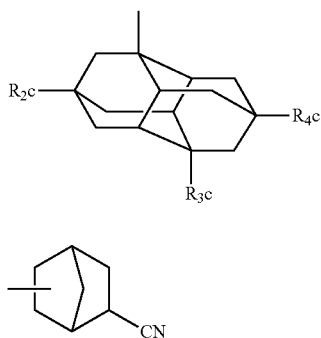

(VIIc)

(VIId)

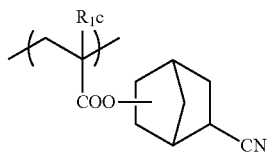

In formulae (VIIa) to (VIII), each of $R_2c$ to $R_4c$ independently represents a hydrogen atom, a hydroxyl group or a cyano group, provided that at least one of $R_2c$ to $R_4c$ represents a hydroxyl group or a cyano group. Preferably one or two of $R_2c$ to $R_4c$ represent a hydroxyl group, and the remaining represents a hydrogen atom. In formula (VIIa), more preferably two of $R_2c$ to $R_4c$ represent a hydroxyl group and the remainder represents a hydrogen atom.

As the repeating units having a partial structure represented by any of formulae (VIIa) to (VIId), a repeating unit represented by any of the following formulae (AIIa) to (AIId) can be exemplified.

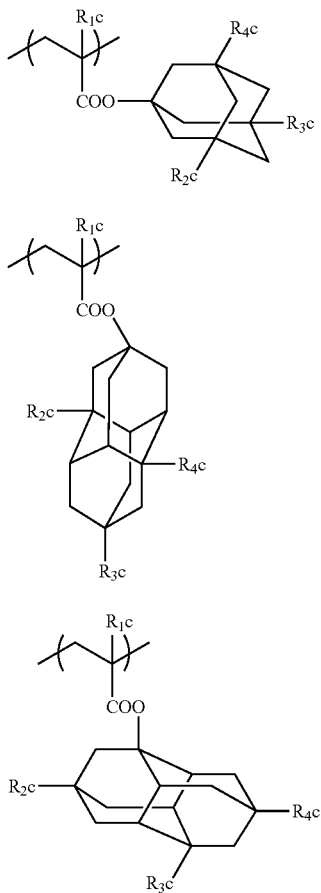

(AIId)

In formulae (AIIa) to (AIId), $R_1c$ represents a hydrogen atom, a methyl group, a trifluoromethyl group, or a hydroxymethyl group.

$R_2c$ to $R_4c$ have the same meaning with $R_2c$ to $R_4c$ in formulae (VIIa) to (VIIc).

The resin (A) may contain or may not contain a repeating unit having a hydroxyl group or a cyano group, but when the resin (A) contains a repeating unit having a hydroxyl group or a cyano group, the content of the repeating unit having a hydroxyl group or a cyano group is preferably 1 to 40 mol %, based on all the repeating units in the resin (A), more preferably 3 to 30 mol %, and still more preferably 5 to 25 mol %.

The specific examples of the repeating units having a hydroxyl group or a cyano group are shown below, but the invention is not restricted thereto.

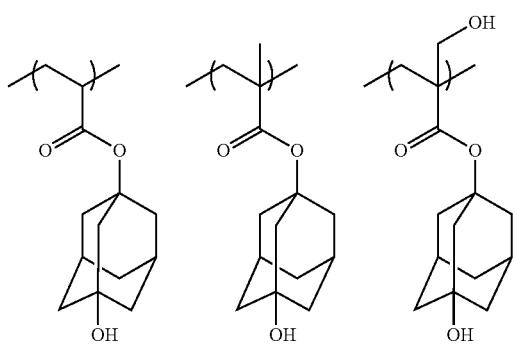
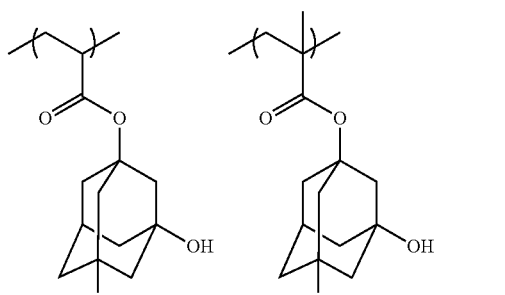
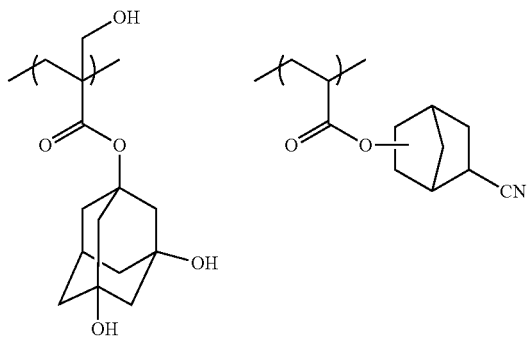

-continued

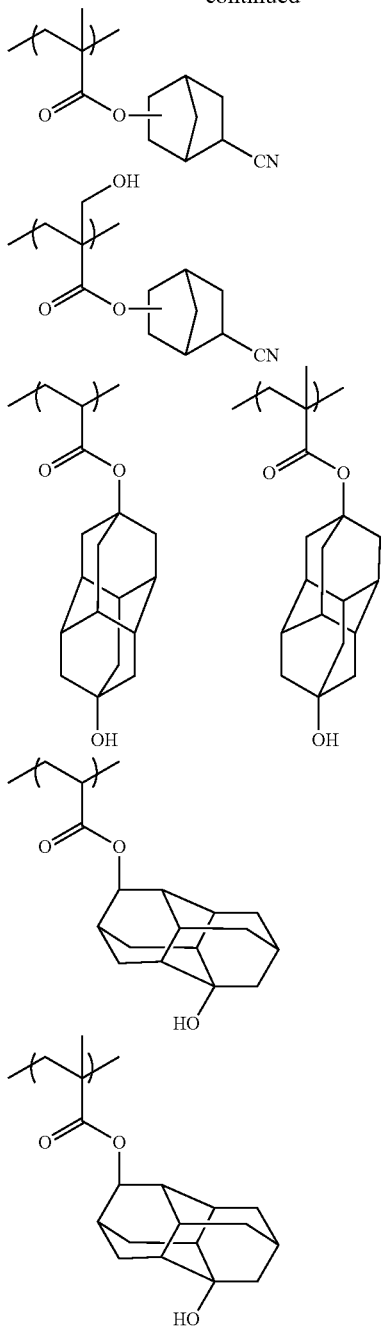

The resin (A) may have a repeating unit having an acid group. The examples of the acid groups include a carboxyl group, a sulfonamido group, a sulfonylimido group, a bissulfonylimido group, and an aliphatic alcohol substituted with an electron-withdrawing group at the α-position (for example, a hexafluoroisopropanol group), and it is more preferred to have a repeating unit having a carboxyl group. By containing a repeating unit having an acid group, the resolution increases in the use of forming contact holes. As the repeating unit having an acid group, all of the following are preferably used, i.e., a repeating unit where an acid group is directly bonded to the main chain of the resin, such as a repeating unit by an acrylic acid or a methacrylic acid, a repeating unit where an acid is bonded to the main chain of the resin via a linking group, and a repeating unit where an acid is introduced into the polymer chain terminal by using a polymerization initiator having an acid group or a chain transfer agent at the time of polymerization. The linking group may have a monocyclic or polycyclic cyclohydrocarbon structure. A repeating unit by an acrylic acid or a methacrylic acid is especially preferred.

The resin (A) may contain or may not contain a repeating unit having an acid group, but when the resin (A) contains a repeating unit having an acid group, the content of the repeating unit having an acid group is preferably 15 mol % or less based on all the repeating units in the resin (A), and more preferably 10 mol % or less. When the resin (A) contains a repeating unit having an acid group, the content of the repeating unit having an acid group in the resin (A) is generally 1 mol % or more.

The specific examples of the repeating units having an acid group are shown below, but the invention is not restricted thereto.

In the specific examples, Rx represents H, $CH_3$, $CH_2OH$ or $CF_3$.

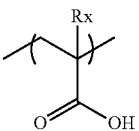
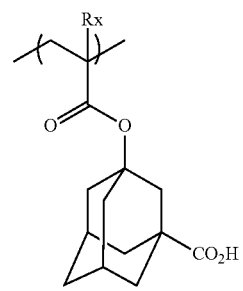
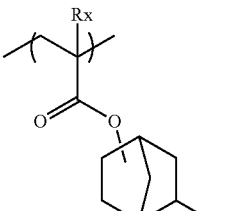
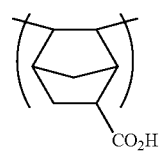
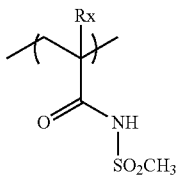
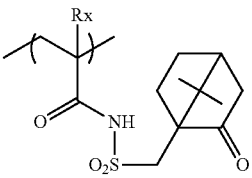
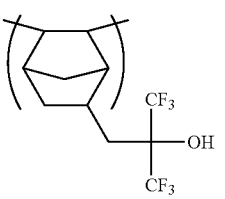

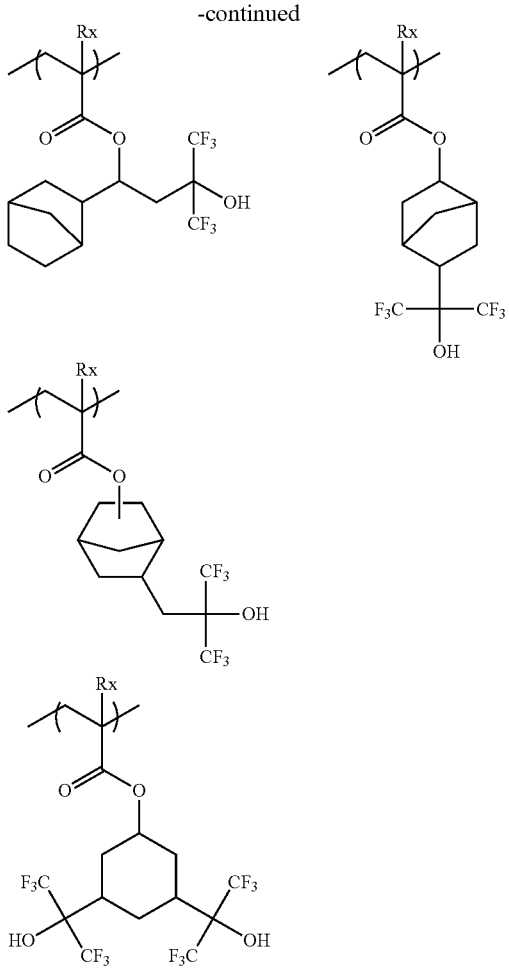

The resin (A) in the invention may further contain a repeating unit having an alicyclic hydrocarbon structure not having a polar group (e.g., the above acid group, a hydroxyl group, a cyano group) and not exhibiting acid decomposability. By virtue of the repeating unit, dissolution of a low molecular weight component from the resist film to the immersion liquid can be reduced at the time of immersion exposure and, further, the solubility of the resin can be appropriately adjusted in development using a developer containing an organic solvent. Such a repeating unit includes a repeating unit represented by the following formula (IV).

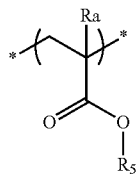

(IV)

In formula (IV), $R_5$ represents a hydrocarbon group having at least one cyclic structure and not having a polar group.

Ra represents a hydrogen atom, an alkyl group, a —$CH_2$—O—$Ra_2$ group, wherein $Ra_2$ represents a hydrogen atom, an alkyl group, or an acyl group. Ra is preferably a hydrogen atom, a methyl group, a hydroxymethyl group, or a trifluoromethyl group, and especially preferably a hydrogen atom or a methyl group.

The cyclic structure contained in $R_5$ includes a monocyclic hydrocarbon group and a polycyclic hydrocarbon group. The examples of the monocyclic hydrocarbon groups include a cycloalkyl group having 3 to 12 carbon atoms, such as a cyclopentyl group, a cyclohexyl group, a cycloheptyl group, and a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring-assembly hydrocarbon group and a crosslinked cyclic hydrocarbon group. The examples of the ring-assembly hydrocarbon groups include a bicyclohexyl group and a perhydronaphthalenyl group. The examples of the crosslinked cyclic hydrocarbon groups include bicyclic hydrocarbon rings such as a pinane ring, a bornane ring, a norpinane ring, a norbornane ring, and a bicyclooctane ring (e.g., a bicycle[2.2.2]octane ring, a bicycle[3.2.1]octane ring), a tricyclic hydrocarbon rings such as a homobledane ring, an adamantane ring, a tricycle[5.2.1.0$^{2,6}$]decane ring, and a tricycle[4.3.1.1$^{2,5}$]undecane ring, and a tetracyclic hydrocarbon rings such as a tetracyclo[4.4.0.1$^{2,5}$.1$^{7,10}$]dodecane ring, and a perhydro-1,4-methano-5,8-methanonaphthalene ring. Further, the crosslinked cyclic hydrocarbon rings include condensed cyclic hydrocarbon rings, for example, condensed rings formed by condensation of a plurality of 5- to 8-membered cycloalkane rings, for example, a perhydronaphthalene (decaline) ring, a perhydroanthracene ring, a perhydrophenanthrene ring, a perhydroacenaphthene ring, a perhydrofluorene ring, a perhydroindene ring, and a perhydrophenalene ring.

The examples of the preferred crosslinked cyclic hydrocarbon rings include a norbornyl group, an adamantyl group, a bicyclooctanyl group, and a tricycle[5.2.1.0$^{2,6}$]decanyl group, and the more preferred crosslinked cyclic hydrocarbon rings are a norbornyl group and an adamantyl group.

These alicyclic hydrocarbon groups may have a substituent. The examples of preferred substituents include a halogen atom, an alkyl group, a hydroxyl group wherein a hydrogen atom is substituted, and an amino group wherein a hydrogen atom is substituted. The examples of the preferred halogen atoms include a bromine atom, a chlorine atom, and a fluorine atom, and the examples of the preferred alkyl groups include a methyl group, an ethyl group, a butyl group, and a t-butyl group. These alkyl groups may further have a substituent, and the substituents which the alkyl group may further have include a halogen atom, an alkyl group, a hydroxyl group wherein a hydrogen atom is substituted, and an amino group wherein a hydrogen atom is substituted.

As the examples of the substituents for the hydrogen atom, for example, an alkyl group, a cycloalkyl group, an aralkyl group, a substituted methyl group, a substituted ethyl group, an alkoxycarbonyl group, and an aralkyloxycarbonyl group are exemplified. The alkyl group is preferably an alkyl group having 1 to 4 carbon atoms, the substituted methyl group is preferably a methoxymethyl group, a methoxythiomethyl group, a benzyloxymethyl group, a t-butoxymethyl group, or a 2-methoxyethoxymethyl group, the substituted ethyl group is preferably a 1-ethoxyethyl group or a 1-methyl-1-methoxyethyl group, the acyl group is preferably an aliphatic acyl group having 1 to 6 carbon atoms, such as a formyl group, an acetyl group, a propionyl group, a butyryl group, an isobutyryl group, a valeryl group or a pivaloyl group, and the alkoxycarbonyl group is preferably an alkoxycarbonyl group having 1 to 4 carbon atoms.

The resin (A) may have or may not have a repeating unit having an alicyclic hydrocarbon structure not having a polar group and not exhibiting acid decomposability, but in the case of containing this repeating unit, the content of the repeating unit is preferably 1 to 40 mol % based on all the repeating units in the resin (A), and more preferably 1 to 20 mol %.

The specific examples of the repeating unit having an alicyclic hydrocarbon structure not having a polar group and not exhibiting acid decomposability, but the invention is not restricted thereto. In the formulae, Ra represents H, $CH_3$, $CH_2OH$ or $CF_3$.

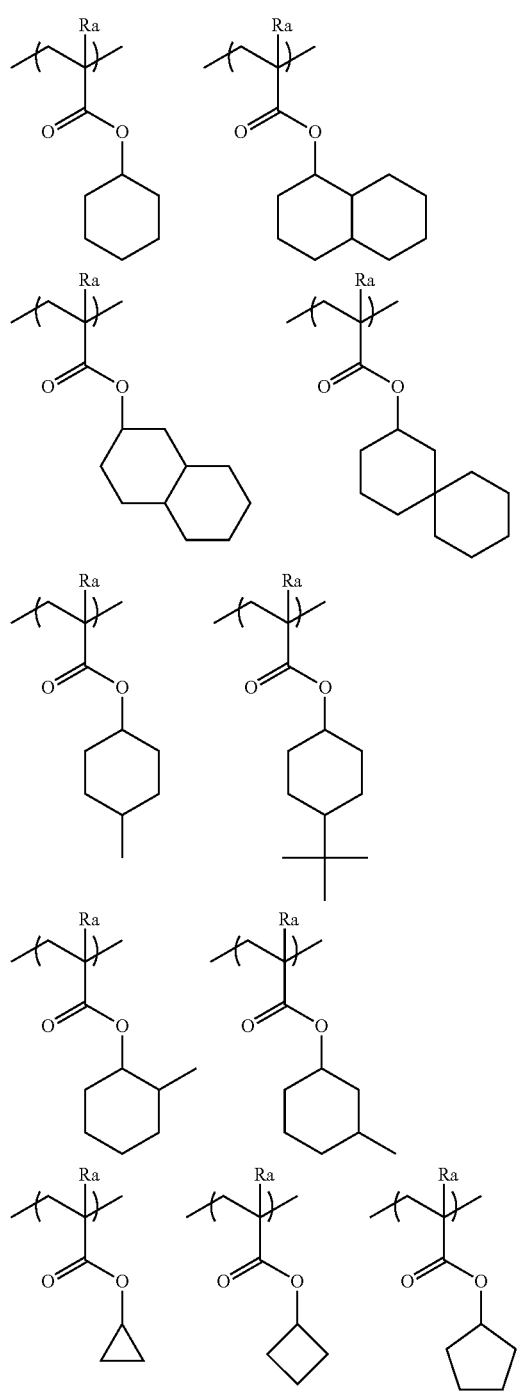
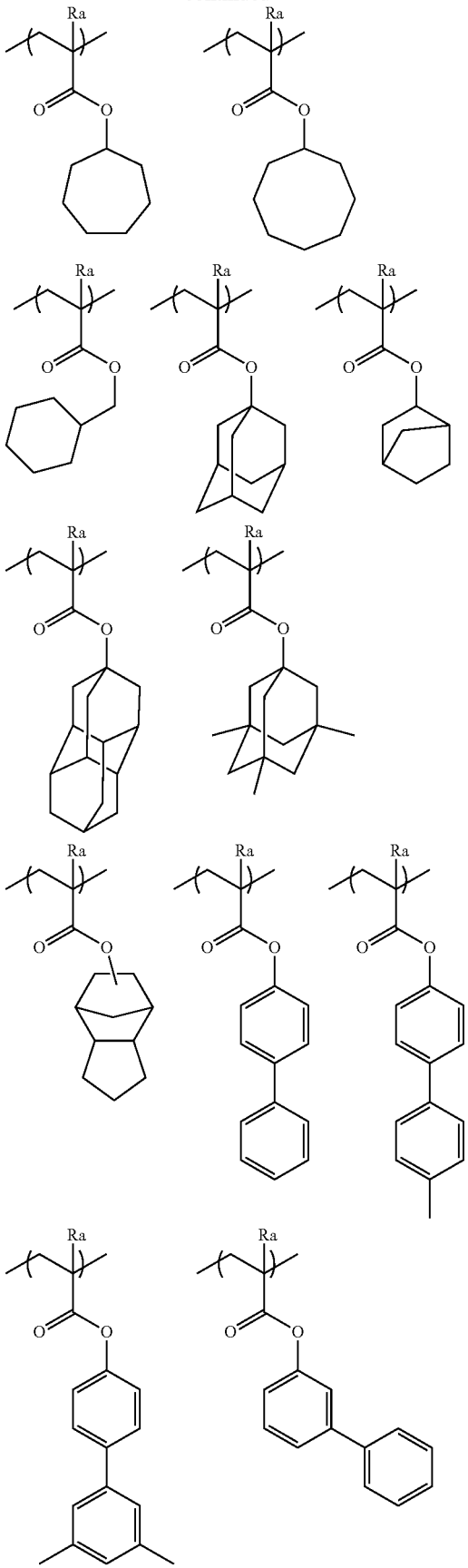

-continued

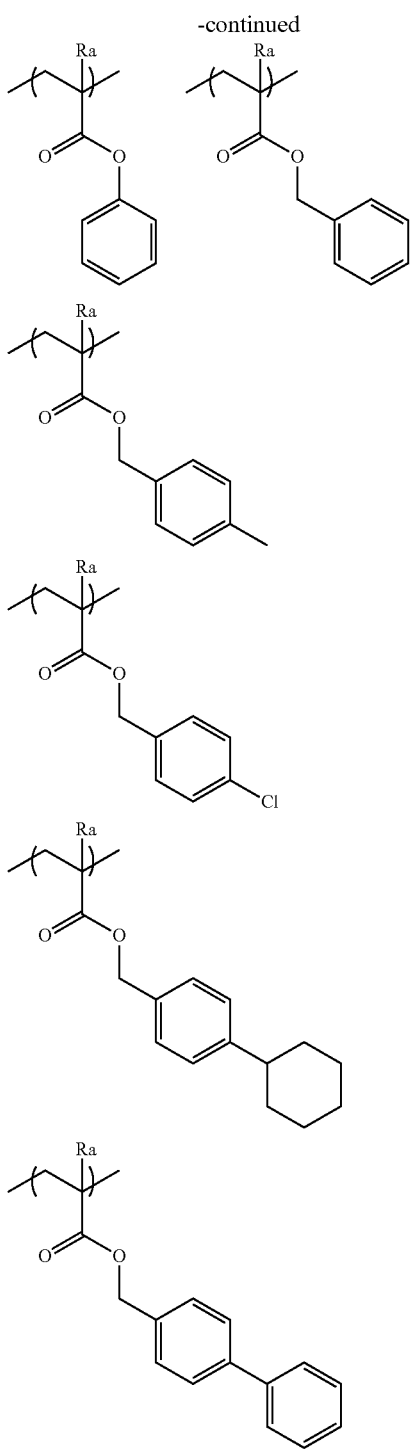

The resin (A) for use in the composition of the invention may contain, in addition to the above-described repeating structural units, various repeating structural units for the purpose of controlling dry etching resistance, suitability for standard developer, adhesion to substrate, resist profile, and characteristics generally required of the resist, such as resolution, heat resistance and sensitivity.

As such repeating structural units, the repeating structural units corresponding to the monomers shown below can be exemplified, but the invention is not restricted thereto.

Due to such repeating structural units, fine control of the performances required of the resin for use in the composition of the invention, in particular the following performances, becomes possible, that is, (1) Solubility in a coating solvent,
(2) A film-forming property (a glass transition temperature),
(3) Alkali developability,
(4) Film reduction (selection of hydrophilic, hydrophobic, alkali-soluble group),
(5) Adhesion of an unexposed part to a substrate, and
(6) Dry etching resistance.

The examples of the monomers include compounds having one addition polymerizable unsaturated bond selected from acrylic acid esters, methacrylic acid esters, acrylamides, methacrylamides, allyl compounds, vinyl ethers, and vinyl esters.

Other than these compounds, an addition polymerizable unsaturated compound copolymerizable with the monomers corresponding to the above various repeating structural units may be copolymerized.

In the resin (A) for use in the composition of the invention, the molar ratio of the contents of respective repeating structural units is appropriately set to control dry etching resistance of the resist, suitability for developer, adhesion to substrate, resist profile, and performances generally required of the resist, such as resolution, heat resistance and sensitivity.

The form of the resin (A) in the invention may be any of a random type, a block type, a comb type and a star type. The resin (A) can be synthesized, for example, by radical, cationic or anionic polymerization of unsaturated monomers corresponding to respective structures. The objective resin can also be obtained by polymerizing unsaturated monomers corresponding to the precursors of respective structures and then performing a polymer reaction.

When the composition of the invention is used for ArF exposure, from the point of transparency to ArF light, the resin (A) for use in the composition of the invention preferably substantially does not contain an aromatic ring (specifically the proportion of the repeating unit having an aromatic group in the resin is preferably 5 mol % or less, more preferably 3 mol % or less, and ideally 0 mol %, that is, not having an aromatic group), and the resin (A) preferably has a monocyclic or polycyclic alicyclic hydrocarbon structure.

Incidentally, in view of sufficiently revealing the effect of the later-described resin (D), the mass percentage content in the resin (A), which is accounted for by the $CH_3$ partial structure contained in the side chain moiety of the resin (A), is preferably smaller than the mass percentage content in the resin (D), which is accounted for by the $CH_3$ partial structure contained in the side chain moiety of the resin (D), specifically preferably smaller by 1.0% or more, more preferably smaller by 2.0% or more, and still more preferably smaller by 3.0% or more. As the resin (A) itself, the mass percentage content in the resin (A), which is accounted for by the $CH_3$ partial structure contained in the side chain moiety of the resin (A), is preferably 11.0% or less, more preferably 10.0% or less, and still more preferably 9.0% or less.

With respect to the method of computation of "the mass percentage content in the resin, which is accounted for by the $CH_3$ partial structure contained in the side chain moiety of the resin", refer to the description concerning the computation method in the resin (D).

From a different point of view, in the case where the composition of the invention contains the later-described resin (E), the resin (A) preferably contains neither a fluorine atom nor a silicon atom from the aspect of the compatibility with the resin (E).

The resin (A) for use in the composition of the invention is preferably a resin where all the repeating units are composed of a (meth)acrylate-based repeating unit. In this case, all the repeating units may be a methacrylate-based repeating unit, all the repeating units may be an acrylate-based repeating unit, or all the repeating units may be composed of a methacrylate-based repeating unit and an acrylate-based repeating unit, but the content of the acrylate-based repeating unit is preferably 50 mol % or less based on all the repeating units. Further, a copolymer comprising 20 to 50 mol % of a (meth) acrylate-based repeating unit having an acid-decomposable group, 20 to 50 mol % of a (meth)acrylate-based repeating unit having a lactone group, 5 to 30 mol % of a (meth) acrylate-based repeating unit having an alicyclic hydrocarbon structure substituted with a hydroxyl group or a cyano group, and further 0 to 20 mol % of other (meth)acrylate-based repeating unit is also preferably used.

In the case of irradiating the composition of the invention with KrF excimer laser light, electron beam, X-ray or high energy beam having wavelength of 50 nm or less (e.g., EUV), it is preferred for the resin (A) to further contain a hydroxystyrene-based repeating unit. It is more preferred to contain a hydroxystyrene-based repeating unit, a hydroxystyrene-based repeating unit protected with an acid-decomposable group, and an acid-decomposable repeating unit such as tertiary alkyl(meth)acrylate.

The preferred examples of the hydroxystyrene-based repeating unit having an acid-decomposable group include, for example, repeating units by t-butoxycarbonyloxystyrene, 1-alkoxyethoxystyrene, and tertiary alkyl(meth)acrylate. A repeating unit by 2-alkyl-2-adamantyl(meth)acrylate and dialkyl(1-adamantyl)methyl(meth)acrylate are more preferred.

The resin (A) in the invention can be synthesized according to an ordinary method (e.g., radical polymerization). The examples of ordinary synthesizing methods include a batch polymerization method of dissolving monomer species and an initiator in a solvent and heating the solution, to thereby effect the polymerization, and a dropping polymerization method of dropwise adding a solution containing monomer species and an initiator to a heated solvent over 1 to 10 hours. A dropping polymerization method is preferred. The examples of the reaction solvents include ethers such as tetrahydrofuran, 1,4-dioxane, diisopropyl ether, ketones such as methyl ethyl ketone and methyl isobutyl ketone, ester solvents such as ethyl acetate, amide solvents such as dimethylformamide and dimethylacetamide, and the later-described solvents capable of dissolving the composition of the invention, such as propylene glycol monomethyl ether acetate, propylene glycol monomethyl ether, and cyclohexanone. The polymerization is more preferably performed using the same solvent as used in the photosensitive composition of the invention. By the use of the same solvent, generation of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). An azo-based initiator is preferred as the radical initiator, and an azo-based initiator having an ester group, a cyano group, or a carboxyl group is preferred. The examples of the preferred initiators include azobisisobutyronitrile, azobisdimethylvaleronitrile and dimethyl 2,2'-azobis(2-methylpropionate). The initiator is additionally added or in parts according to necessity. After completion of the reaction, the reaction solution is poured into a solvent, and a desired polymer is collected as powder, solid, or by other recovery methods. The concentration at the reaction is from 5 mass % to 50 mass %, and preferably from 10 mass % to 30 mass %. The reaction temperature is usually from 10° C. to 150° C., preferably from 30° C. to 120° C., and more preferably from 60° C. to 100° C. (In this specification, mass ratio is equal to weight ratio.)

After completion of the reaction, the reaction solution is allowed to be cooled to room temperature and purified. The purification may be performed by normal methods. For example, a liquid-liquid extraction method of applying water washing or combining it with an appropriate solvent to remove the residual monomers or oligomer components; a purification method in a solution state, such as ultrafiltration of extracting and removing only the polymers having a molecular weight not more than a specific value; a precipitation method of dropwise adding the reaction solution into a poor solvent to solidify the resin in the poor solvent, to thereby remove the residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, and a mixed solvent containing these solvents, according to the kind of the polymer. Of these solvents, a solvent containing at least an alcohol (especially, methanol or the like) or water is preferred as the precipitation or reprecipitation solvent.

The amount of the precipitation or reprecipitation solvent used may be properly selected considering the efficiency, yield and the like, but the amount used is generally from 100 to 10,000 parts by mass per 100 parts by mass of the polymer solution, preferably from 200 to 2,000 parts by mass, and more preferably from 300 to 1,000 parts by mass.

The temperature in precipitation or reprecipitation may be arbitrarily selected considering the efficiency or operability, but is generally on the order of 0 to 50° C., preferably in the vicinity of room temperature (for example, approximately from 20° C. to 35° C.). The precipitation or reprecipitation operation may be performed using commonly employed mixing vessel such as stirring tank by a known method such as a batch system and a continuous system.

The precipitated or reprecipitated polymer is usually subjected to commonly employed solid-liquid separation such as filtration and centrifugation, then dried and used. The filtration is performed using a solvent resisting filter element preferably under pressure. The drying is performed under atmospheric pressure or reduced pressure (preferably under reduced pressure) at a temperature of approximately from 30° C. to 100° C., and preferably on the order of 30° C. to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the resin is sparingly soluble or insoluble, to precipitate a resin (step a), separating the resin from the solution (step b), anew dissolving the resin in a solvent to prepare resin solution A (step c), bringing the resin solution A into contact with a solvent in which the resin is sparingly soluble or insoluble in a volumetric amount of less than 10 times (preferably 5 times or less) the resin solution A, to precipitate a resin solid (step d), and separating the precipitated resin (step e).

Also, for keeping the resin from aggregation or the like after preparation of the composition, as described, for example, in JP-A-2009-037108, a step of dissolving the synthesized resin in a solvent to make a solution, and heating the solution at approximately 30° C. to 100° C. for approximately from 30 minutes to 4 hours may be added.

The weight average molecular weight of the resin (A) for use in the composition of the invention is preferably 1,000 to 200,000, more preferably 2,000 to 100,000, still more preferably 3,000 to 70,000 and especially preferably 5,000 to 50,000, in terms of polystyrene by the GPC method. When the weight average molecular weight is in the range of 1,000 to 200,000, deterioration of heat resistance and dry etching resistance can be prevented, and also degradation of developing property and lowering of film-forming property due to too high a viscosity can be prevented.

The polydispersity (molecular weight distribution) is usually in the range of 1.0 to 3.0, preferably 1.0 to 2.6, more preferably 1.2 to 2.5, still more preferably 1.2 to 2.4, still yet preferably 1.3 to 2.2, and especially preferably 1.4 to 2.0. When the above range of the polydispersity is satisfied, excellent resolution and resist profile are ensured, the side wall of the resist pattern is smooth, and roughness is excellent.

In the actinic ray-sensitive or radiation-sensitive resin composition of the present invention, the blending ratio of the resin (A) in the entire composition is preferably 30 mass % to 99 mass %, and more preferably 60 mass % to 95 mass %, based on the total solid content.

The resin (A) of the invention may be used by one kind alone, or a plurality of kinds may be used in combination.

[2] (B) Compound Capable of Generating an Acid Upon Irradiation with an Actinic Ray or Radiation The composition for use in the present invention contains (B) a compound capable of generating an acid upon irradiation with an actinic ray or radiation (hereinafter, sometimes referred to as "acid generator"). The compound (B) capable of generating an acid upon irradiation with an actinic ray or radiation is preferably a compound capable of generating an organic acid upon irradiation with an actinic ray or radiation.

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone, and o-nitrobenzyl sulfonate.

Out of the acid generators, preferred compounds include compounds represented by the following formulae (ZI), (ZII) and (ZIII):

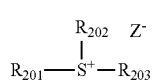
(ZI)

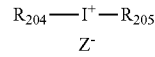
(ZII)

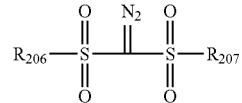
(ZIII)

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. Examples of the group formed by combining two members out of $R_{201}$ to $R_{203}$ include an alkylene group (e.g., butylene group, pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the actinic ray-sensitive or radiation-sensitive resin composition is enhanced.

Examples of the sulfonate anion include an aliphatic sulfonate anion, an aromatic sulfonate anion, and a camphorsulfonate anion.

Examples of the carboxylate anion include an aliphatic carboxylate anion, an aromatic carboxylate anion, and an aralkylcarboxylate anion.

The aliphatic moiety in the aliphatic sulfonate anion and aliphatic carboxylate may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion and aromatic carboxylate anion is preferably an aryl group having a carbon number of 6 to 14, and examples thereof include a phenyl group, a tolyl group, and a naphthyl group.

The alkyl group, cycloalkyl group and aryl group in the aliphatic sulfonate anion and aromatic sulfonate anion may have a substituent. Examples of the substituent on the alkyl group, cycloalkyl group and aryl group in the aliphatic sulfonate anion and aromatic sulfonate anion include a nitro group, a halogen atom (e.g., fluorine atom, chlorine atom, bromine atom, iodine atom), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group and ring structure in each group may further have, as the substituent, an alkyl group (preferably having a carbon number of 1 to 15) or a cycloalkyl group (preferably having a carbon number of 3 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group, and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group, and a neopentyl group. Examples of the substituent on such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion of $Z^-$ is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

The acid generator is preferably a compound capable of generating an acid represented by the following formula (III) or (IV) upon irradiation with an actinic ray or radiation. The compound capable of generating an acid represented by the following formula (III) or (IV) has a cyclic organic group, so that the resolution and roughness performance can be more improved.

The non-nucleophilic anion described above can be an anion capable of generating an organic acid represented by the following formula (III) or (IV):

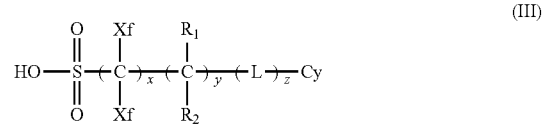

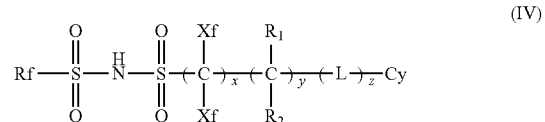

In the formulae, each Xf independently represents a fluorine atom or an alkyl group substituted with at least one fluorine atom.

Each of $R_1$ and $R_2$ independently represents a hydrogen atom, a fluorine atom or an alkyl group.

Each L independently represents a divalent linking group.

Cy represents a cyclic organic group.

Rf represents a fluorine atom-containing group.

x represents an integer of 1 to 20.

y represents an integer of 0 to 10.

z represents an integer of 0 to 10.

Xf represents a fluorine atom or an alkyl group substituted with at least one fluorine atom. The carbon number of the alkyl group is preferably from 1 to 10, more preferably from 1 to 4. Also, the alkyl group substituted with at least one fluorine atom is preferably a perfluoroalkyl group.

Xf is preferably a fluorine atom or a perfluoroalkyl group having a carbon number of 1 to 4. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and it is still more preferred that both Xf are a fluorine atom.

Each of $R_1$ and $R_2$ independently represents a hydrogen atom, a fluorine atom or an alkyl group. The alkyl group may have a substituent (preferably fluorine atom) and is preferably an alkyl group having a carbon number of 1 to 4, more preferably a perfluoroalkyl group having a carbon number of 1 to 4. Specific examples of the alkyl group having a substituent of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

L represents a divalent linking group. Examples of the divalent linking group include —COO—, —OCO—, —CONH—, —NHCO—, —CO—, —O—, —S—, —SO—, —SO$_2$—, an alkylene group (preferably having a carbon number of 1 to 6), a cycloalkylene group (preferably having a carbon number of 3 to 10), an alkenylene group (preferably having a carbon number of 2 to 6), and a divalent linking group formed by combining a plurality of these members. Among these, —COO—, —OCO—, —CONH—, —NHCO—, —CO—, —O—, —SO$_2$—, —COO-alkylene group-, —OCO-alkylene group-, —CONH-alkylene group- and —NHCO-alkylene group- are preferred, and —COO—, —OCO—, —CONH—, —SO$_2$—, —COO-alkylene group- and —OCO-alkylene group- are more preferred, Cy represents a cyclic organic group. Examples of the cyclic organic group include an alicyclic group, an aryl group, and a heterocyclic group.

The alicyclic group may be monocyclic or polycyclic. The monocyclic alicyclic group includes, for example, a monocyclic cycloalkyl group such as cyclopentyl group, cylohexyl group and cyclooctyl group. The polycyclic alicyclic group includes, for example, a polycyclic cycloalkyl group such as norbornyl group, tricyclodecanyl group, tetracyclodecanyl group, tetracyclododecanyl group, adamantyl group and a group having a steroid skeleton. Above all, an alicyclic group having a bulky structure with a carbon number of 7 or more, such as norbornyl group, tricyclodecanyl group, tetracyclodecanyl group, tetracyclododecanyl group, adamantyl group and a group having a steroid skeleton, is preferred from the standpoint of restraining diffusion in film during a PEB (post-exposure baking) step and improving MEEF (Mask Error Enhancement Factor).

The steroid skeleton typically includes a structure where a substituent such as carbonyl group and hydroxy group is arbitrarily substituted on the carbon skeleton shown below, and examples of the anion capable of producing an organic acid represented by formula (III) or (IV), where Cy represents a group having a steroid skeleton, upon irradiation with an actinic ray or radiation include anion structures contained in four compounds exemplified in paragraph [0036] of U.S. Patent Application Publication 2011/0250537A1.

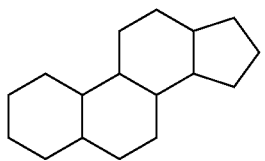 [SMILES: C1CCC2C(C1)CCC1C3CCCC3CCC21]

The aryl group may be monocyclic or polycyclic. Examples of the aryl group include a phenyl group, a naphthyl group, a phenanthryl group, and an anthryl group. Among these, a naphthyl group is preferred because of its relatively low light absorbance at 193 nm.

The heterocyclic group may be monocyclic or polycyclic, but with a polycyclic heterocyclic group, diffusion of an acid can be more restrained. The heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, a sultone ring and a decahydroisoquinoline ring. The heterocyclic ring in the heterocyclic group is preferably a furan ring, a thiophene ring, a pyridine ring or a decahydroisoquinoline ring. Examples of the lactone ring include lactone structures exemplified in the resin (A) above.

The above-described cyclic organic group may have a substituent, and examples of the substituent include an alkyl group (may be linear or branched, preferably having a carbon number of 1 to 12), a cycloalkyl group (may be monocyclic, polycyclic or spirocyclic, preferably having a carbon number of 3 to 20), an aryl group (preferably having a carbon number of 6 to 14), a hydroxyl group, an alkoxy group, an ester group, an amido group, a urethane group, a ureido group, a thioether group, a sulfonamido group and a sulfonic acid ester group. Incidentally, the carbon constituting the cyclic organic group (the carbon contributing to ring formation) may be a carbonyl carbon.

x is preferably from 1 to 8, more preferably from 1 to 4. y is preferably from 0 to 4, more preferably 0. z is preferably from 0 to 8, more preferably from 0 to 4.

Examples of the fluorine atom-containing group represented by Rf include an alkyl group having at least one fluorine atom, a cycloalkyl group having at least one fluorine atom, and an aryl group having at least one fluorine atom.

These alkyl group, cycloalkyl group and aryl group may be substituted with a fluorine atom or may be substituted with another fluorine atom-containing substituent. In the case where Rf is a cycloalkyl group having at least one fluorine atom or an aryl group having at least one fluorine atom, examples of the another fluorine-containing substituent include an alkyl group substituted with at least one fluorine atom.

Also, these alkyl group, cycloalkyl group and aryl group may be further substituted with a fluorine atom-free substituent. Examples of this substituent include those not containing a fluorine atom out of those described above for Cy.

Examples of the alkyl group having at least one fluorine atom represented by Rf are the same as those described above as the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

As the above non-nucleophilic anion, a sulfonate anion represented by the following formula (B-1) is also preferred.

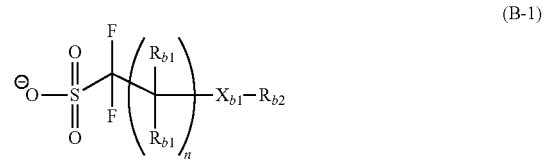

(B-1)

In formula (B-1), each of $R_{b1}$ independently represents a hydrogen atom, a fluorine atom, or a trifluoromethyl group ($CF_3$).

n represents an integer of 0 to 4.

n is preferably an integer of 0 to 3, and more preferably 0 or 1.

$X_{b1}$ represents a single bond, an alkylene group, an ether bond, an ester bond (—OCO— or —COO—), a sulfonic ester bond (—OSO$_2$— or —SO$_3$—), or a combination thereof.

$X_{b1}$ preferably represents an ester bond (—OCO— or —COO—) or a sulfonic ester bond (—OSO$_2$— or —SO$_3$—), and more preferably an ester bond (—OCO— or —COO—).

$R_{b2}$ represents an organic group having 6 or more carbon atoms.

The organic group having 6 or more carbon atoms represented by $R_{b2}$ is preferably a bulky group, and the examples thereof include an alkyl group, an alicyclic group, an aryl group, and a heterocyclic group, each of which group has 6 or more carbon atoms.

The alkyl group having 6 or more carbon atoms of $R_{b2}$ may be linear or branched, preferably a linear or branched alkyl group having 6 to 20 carbon atoms, and the examples of such groups include a linear or branched hexyl group, a linear or branched heptyl group, and a linear or branched octyl group. A branched alkyl group is preferred from the point of bulkiness.

The alicyclic group having 6 or more carbon atoms of $R_{b2}$ may be monocyclic or polycyclic. The examples of the monocyclic alicyclic groups include monocyclic cycloalkyl groups such as a cyclohexyl group and a cyclooctyl group. The examples of the polycyclic alicyclic groups include polycyclic cycloalkyl groups, such as a norbornyl group, a tricyclodecanyl group, a tetracyclodecanyl group, a tetracyclododecanyl group, and an adamantyl group. Of these groups, alicyclic groups having 7 or more carbon atoms and a bulky structure, such as a norbornyl group, a tricyclodecanyl group, a tetracyclodecanyl group, a tetracyclododecanyl group, and an adamantyl group are especially preferred from the point of prevention of diffusion in film during PEB (Post Exposure Bake) process and improvement of MEEF (Mask Error Enhancement Factor)

The aryl group having 6 or more carbon atoms represented by $R_{b2}$ may be monocyclic or polycyclic. The examples of these aryl groups include, for example, a phenyl group, a naphthyl group, a phenanthryl group, and an anthryl group. Of these groups, a naphthyl group relatively low in light absorbance at 193 nm is preferred.

The heterocyclic group having 6 or more carbon atoms represented by $R_{b2}$ may be monocyclic or polycyclic, but the polycyclic group can control diffusion of acid more than the monocyclic group. The heterocyclic group may have or may not have aromaticity. The examples of the heterocyclic groups having aromaticity include, for example, a benzofuran ring, a benzothiophene ring, a dibenzofuran ring, and a dibenzothiophene ring. As the heterocyclic groups not having aromaticity, for example, a tetrahydropyran ring, a lactone ring, a sultone ring, and a decahydroisoquinoline ring are exemplified.

The substituents having 6 or more carbon atoms of $R_{b2}$ may further have a substituent. The examples of the further substituents include, for example, an alkyl group (may be linear or branched, and preferably having 1 to 12 carbon atoms), a cycloalky group (may be monocyclic, polycyclic, or spirocyclic, and preferably having 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group. Incidentally, the carbon atoms for constituting the above alicyclic group, aryl group, or heterocyclic group (carbon atoms contributing to ring formation) may be carbonyl carbons.

The specific examples of the sulfonate anion structures represented by formula (B-1) are shown below, but the invention is not restricted thereto.

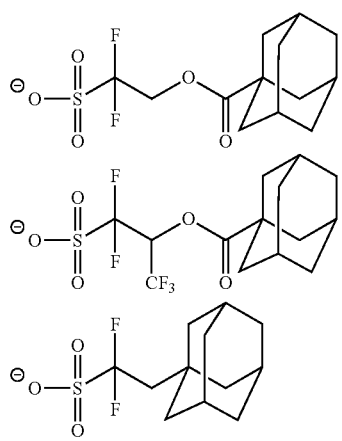

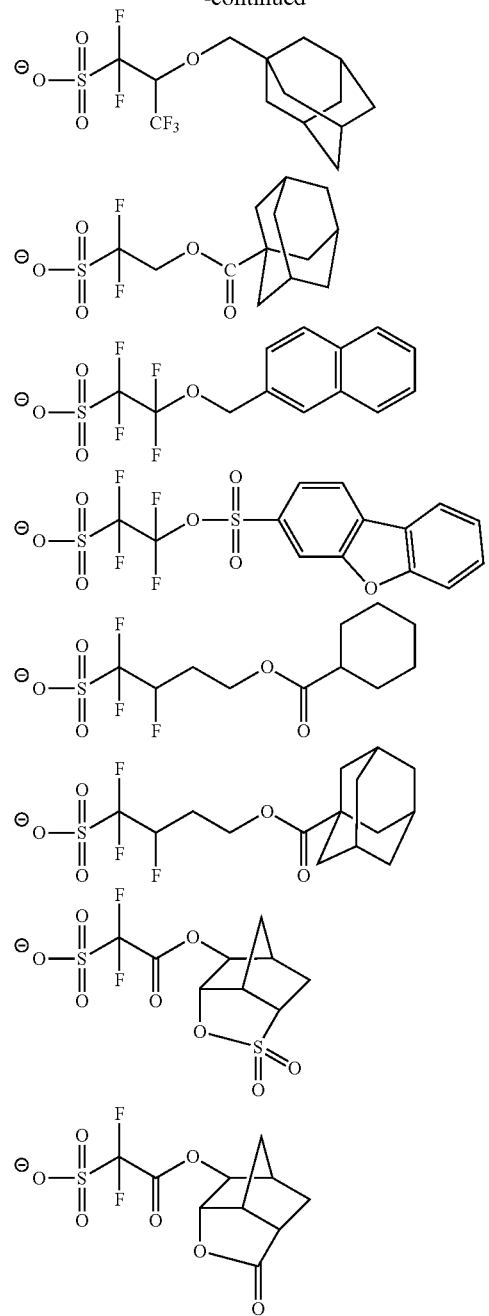

Examples of the organic group represented by $R_{201}$, $R_{202}$ and $R_{203}$ include corresponding groups in the later-described compounds (ZI-1), (ZI-2), (ZI-3) and (ZI-4).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI) through a single bond or a linking group.

Compounds (ZI-1), (ZI-2), (ZI-3) and (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same or different.

The alkyl or cycloalkyl group which is contained, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group, and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

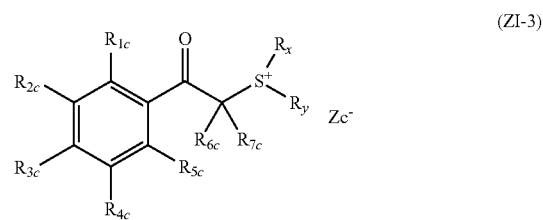

(ZI-3)

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may be respectively bonded to each other to form a ring structure. This ring structure may contain an oxygen atom, a sulfur atom, a nitrogen atom, a ketone group, or an ester bond.

The nitrogen atom which may be contained in the ring structure may further have an alkylsulfonyl group or an acyl group.

The ring structure above includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (such as methyl group, ethyl group, linear or branched propyl group, linear or branched butyl group, or linear or branched pentyl group). The cycloalkyl group includes, for example, a cycloalkyl group having a carbon number of 3 to 10 (e.g., cyclopentyl group, cyclohexyl group).

The aryl group as $R_{1c}$ to $R_{5c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group, or linear or branched pentoxy group), or a cyclic alkoxy group having a carbon number of 3 to 10 (such as cyclopentyloxy group or cyclohexyloxy group).

Specific examples of the alkoxy group in the alkoxycarbonyl group as $R_{1c}$ to $R_{5c}$ are the same as specific examples of the alkoxy group of $R_{1c}$ to $R_{5c}$.

Specific examples of the alkyl group in the alkylcarbonyloxy group and alkylthio group as $R_{1c}$ to $R_{5c}$ are the same as specific examples of the alkyl group of $R_{1c}$ to $R_{5c}$.

Specific examples of the cycloalkyl group in the cycloalkylcarbonyloxy group as $R_{1c}$ to $R_{5c}$ are the same as specific examples of the cycloalkyl group of $R_{1c}$ to $R_{5c}$.

Specific examples of the aryl group in the aryloxy group and arylthio group as $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members of $R_{1c}$ to $R_{5c}$ with each other is preferably a 5- or 6-membered ring, more preferably a 6-membered ring (e.g., phenyl ring).

The ring structure which may be formed by combining $R_{5c}$ and $R_{6c}$ with each other includes a 4-membered or higher membered ring (preferably a 5- or 6-membered ring) formed together with the carbonyl carbon atom and carbon atom in formula (I) by combining $R_{5c}$ and $R_{6c}$ with each other to constitute a single bond or an alkylene group (such as methylene group or ethylene group).

The aryl group as $R_{6c}$ and $R_{7c}$ is preferably an aryl group having a carbon number of 5 to 15, and examples thereof include a phenyl group and a naphthyl group.

An embodiment where both of $R_{6c}$ and $R_{7c}$ are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group, and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having $>C=O$ at the 2-position of the alkyl group or cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (such as methyl group or ethyl group).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5-membered or higher membered ring (preferably a 5-membered ring) formed together with the sulfur atom and carbonyl carbon atom in formula (ZI-3) by combining $R_{5c}$ and $R_x$ with each other to constitute a single bond or an alkylene group (such as methylene group or ethylene group).

As the ring structure which may be formed by bonding of $R_x$ and $R_y$ to each other, a 5- or 6-membered ring formed by divalent $R_x$ and $R_y$ (for example, a methylene group, an ethylene group, a propylene group, and the like) together with the sulfur atom in formula (ZI-3) is exemplified, and the 5-membered ring is preferably a tetrahydrothiophene ring. The 6-membered ring formed by $R_x$ and $R_y$ together with the sulfur atom in formula (ZI-3) is preferably a 6-membered ring containing an oxygen atom, a sulfur atom, a nitrogen atom, or a ketone group in the ring structure.

Each of $R_x$ and $R_y$ is preferably an alkyl or cycloalkyl group having a carbon number of 4 or more, more preferably 6 or more, still more preferably 8 or more.

Each of $R_{1c}$ to $R_{7c}$, $R_x$ and $R_y$ may further have a substituent, and examples of such a substituent include a halogen atom (e.g., fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In formula (ZI-3), it is more preferred that each of $R_{1c}$, $R_{2c}$, $R_{4c}$ and $R_{5c}$ independently represents a hydrogen atom and $R_{3c}$ represents a group except for a hydrogen atom, that is, represents an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

As the cation in the compound represented by formula (ZI-3) in the present invention, the following specific examples can be exemplified. In the following exemplification, Me represents a methyl group, "Bu represents a n-butyl group.

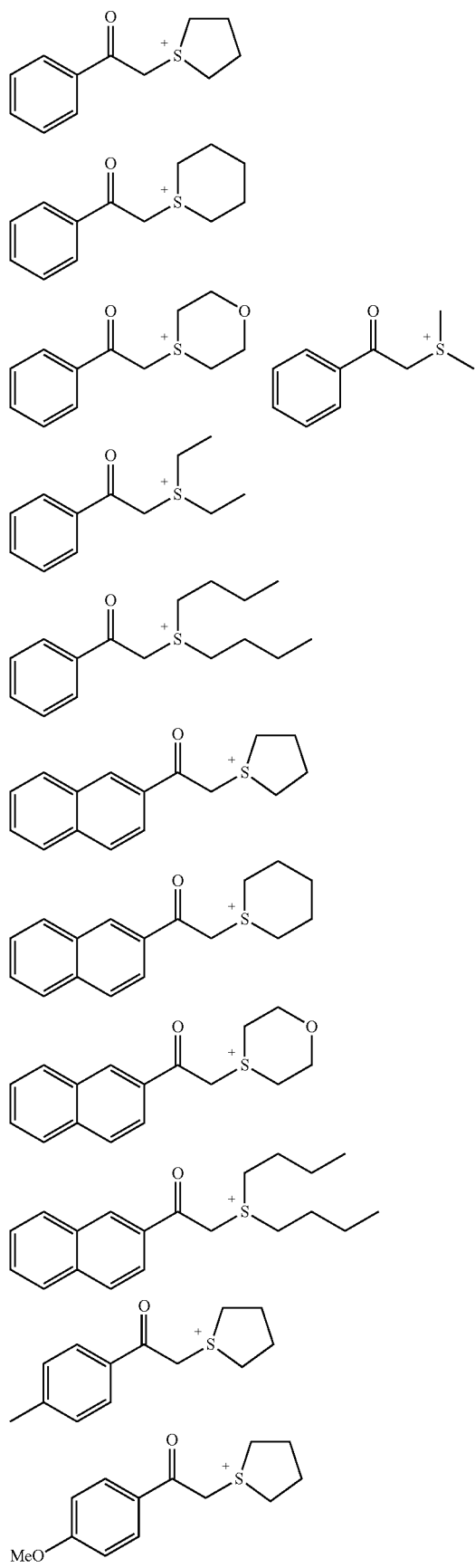
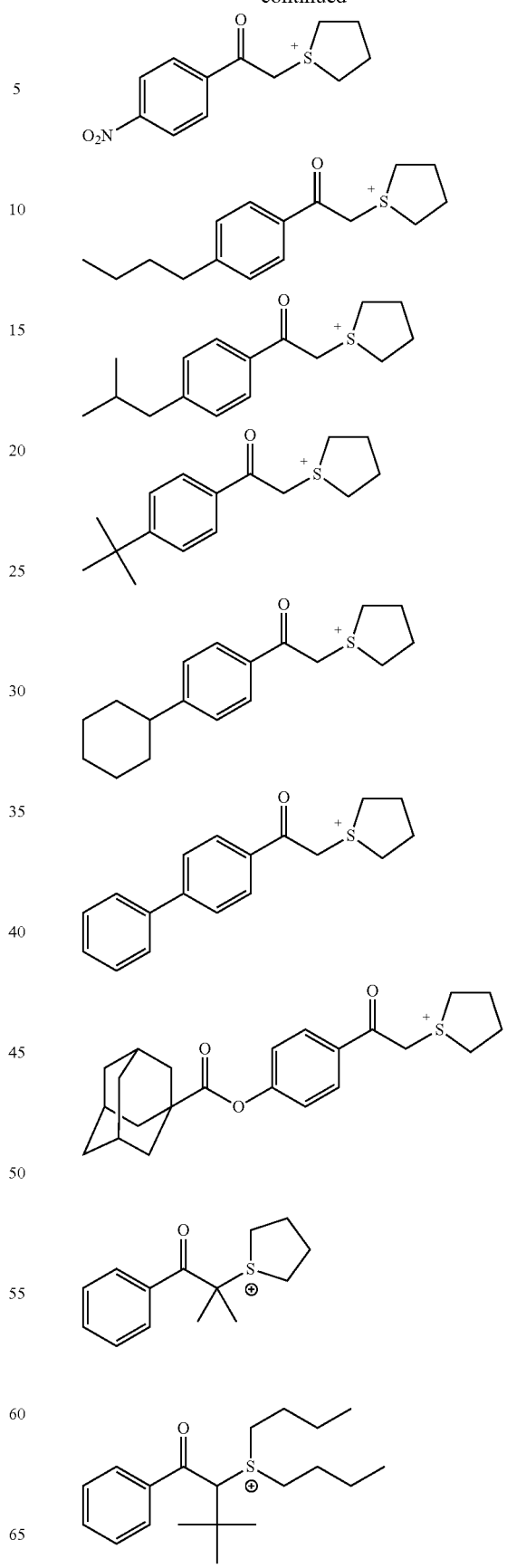

-continued
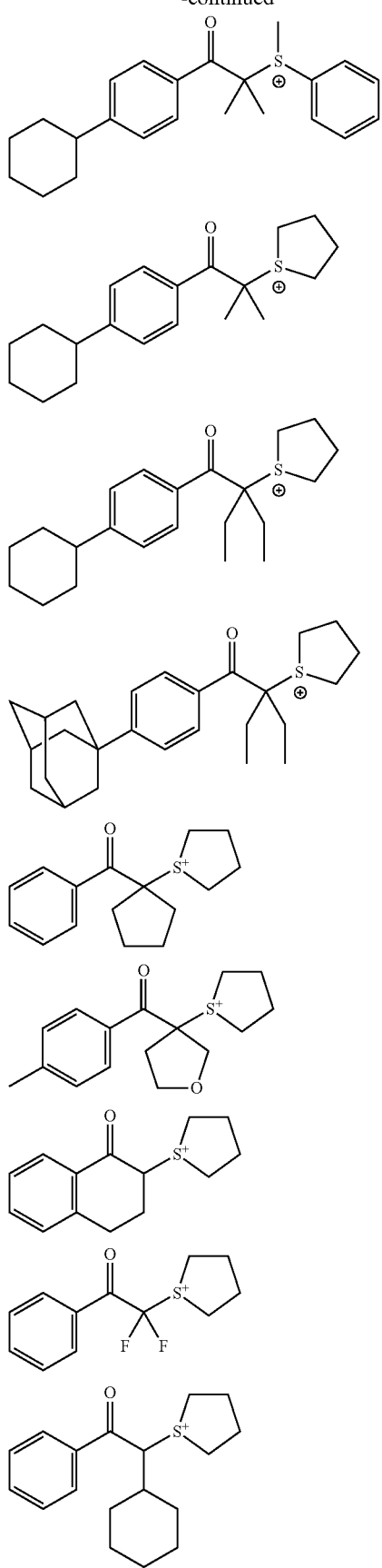
-continued
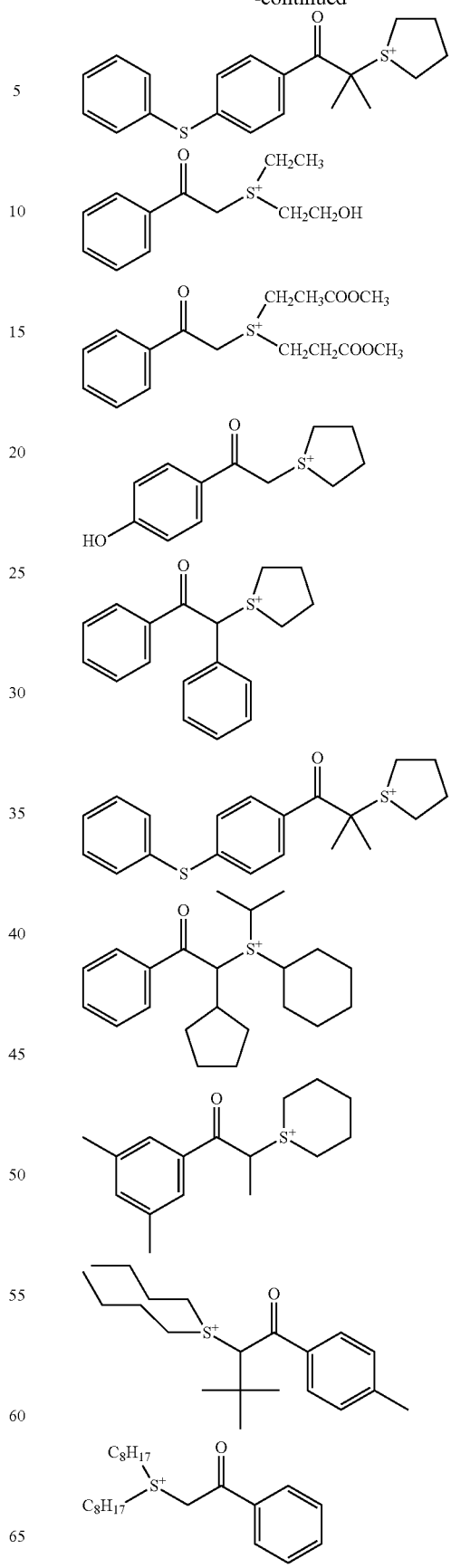

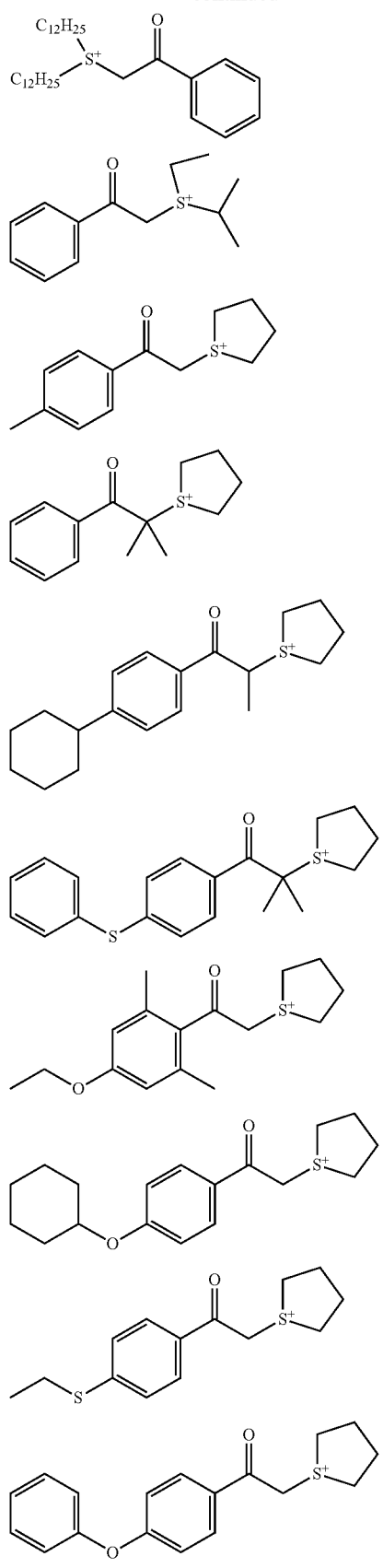
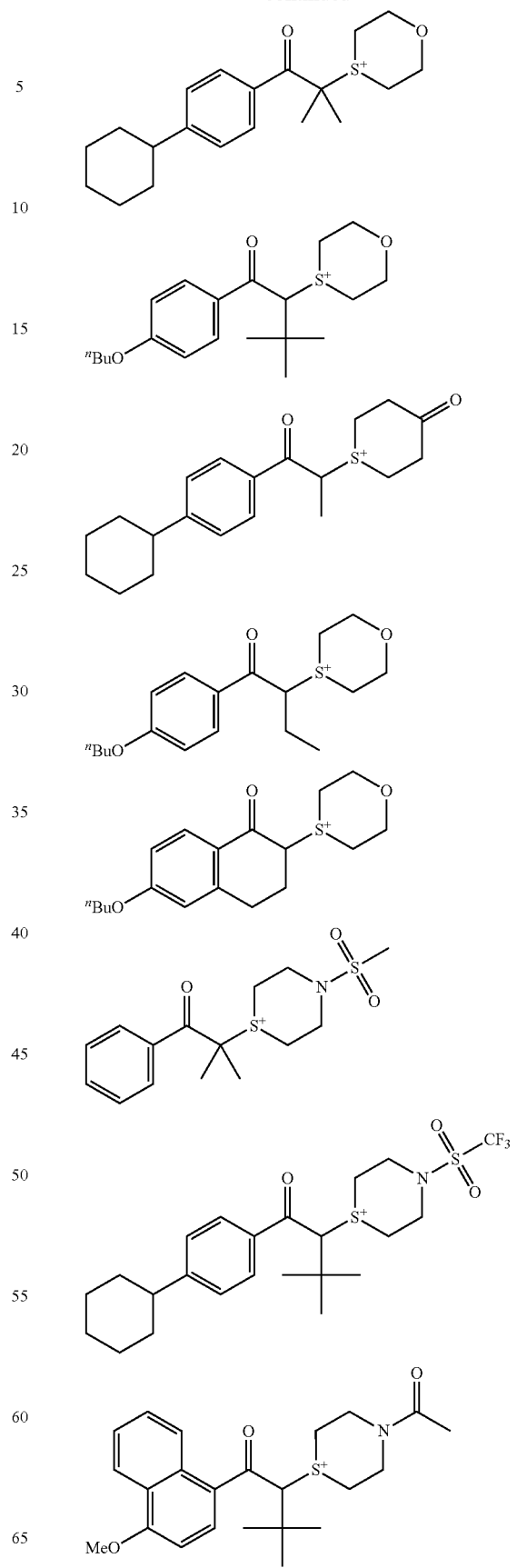

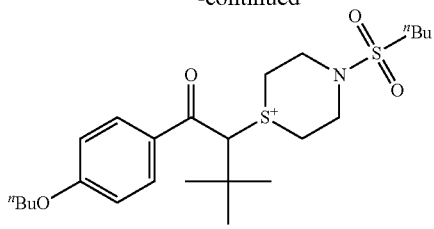

The compound (ZI-4) is described below.

The compound (ZI-4) is represented by the following formula (ZI-4):

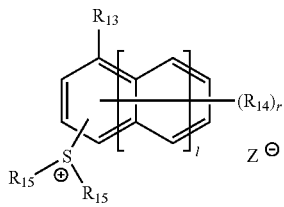

In formula (ZI-4), $R_{13}$ represents a hydrogen atom, a fluorine atom, a hydroxyl group, an alkyl group, a cycloalkyl group, an alkoxy group, an alkoxycarbonyl group or a group having a cycloalkyl group. These groups may have a substituent.

$R_{14}$ represents, when a plurality of $R_{14}$s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group or a naphthyl group. Two $R_{15}$s may combine with each other to form a ring. These groups may have a substituent.

l represents an integer of 0 to 2.

r represents an integer of 0 to 8.

$Z^-$ represents a non-nucleophilic anion, and examples thereof are the same as those of the nucleophilic anion of $Z^-$ in formula (ZI).

In formula (ZI-4), the alkyl group of $R_{13}$, $R_{14}$ and $R_{15}$ is a linear or branched alkyl group preferably having a carbon number of 1 to 10, and preferred examples thereof include a methyl group, an ethyl group, an n-butyl group, and a tert-butyl group.

The cycloalkyl group of $R_{13}$, $R_{14}$ and $R_{15}$ includes a monocyclic or polycyclic cycloalkyl group (preferably a cycloalkyl group having a carbon number of 3 to 20) and among others, is preferably cyclopropyl, cyclopentyl, cyclohexyl, cycloheptyl or cyclooctyl.

The alkoxy group of $R_{13}$ and $R_{14}$ is a linear or branched alkoxy group preferably having a carbon number of 1 to 10, and preferred examples thereof include a methoxy group, an ethoxy group, an n-propoxy group, and an n-butoxy group.

The alkoxycarbonyl group of $R_{13}$ and $R_{14}$ is a linear or branched alkoxycarbonyl group preferably having a carbon number of 2 to 11, and preferred examples thereof include a methoxycarbonyl group, an ethoxycarbonyl group, and an n-butoxycarbonyl group.

The group having a cycloalkyl group of $R_{13}$ and $R_{14}$ includes a monocyclic or polycyclic cycloalkyl group (preferably a cycloalkyl group having a carbon number of 3 to 20), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably has a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group, and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group and cycloalkylsulfonyl group of $R_{14}$ are a linear, branched or cyclic alkylsulfonyl group preferably having a carbon number of 1 to 10, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which each of the groups above may have include a halogen atom (e.g., fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$s with each other includes a 5- or 6-membered ring, preferably a 5-membered ring (that is, tetrahydrothiophene ring), formed by two $R_{15}$s together with the sulfur atom in formula (ZI-4) and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may combine with each other to form a ring (an aromatic or non-aromatic hydrocarbon ring, an aromatic or non-aromatic heterocyclic ring, or a polycyclic condensed ring formed by combining two or more of these rings).

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$s are combined.

The substituent which $R_{13}$ and $R_{14}$ may have is preferably a hydroxyl group, an alkoxy group, an alkoxycarbonyl group, or a halogen atom (particularly fluorine atom).

l is preferably 0 or 1, more preferably 1.

r is preferably from 0 to 2.

Examples of the cation in the compound represented by formula (ZI-4) for use in the present invention include cations described in paragraphs [0121], [0123] and [0124] of JP-A-2010-256842 and paragraphs [0127], [0129] and [0130] of JP-A-2011-76056.

Formulae (ZII) and (ZIII) are described below.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the framework of the aryl group having a heterocyclic structure include pyrrole, furan, thiophene, indole, benzofuran, and benzothiophene.

The alkyl group and cycloalkyl group in $R_{204}$ to $R_{207}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group, and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

$$Ar_3-SO_2 \cdot SO_2-Ar_4 \qquad (ZIV)$$

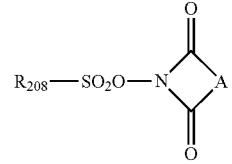
(ZV)

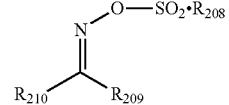
(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

Among the acid generators, more preferred are the compounds represented by formulae (ZI) to (ZIII).

Also, the acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the acid generators, particularly preferred examples are illustrated below.

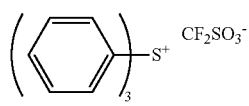 (z1)

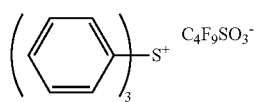 (z2)

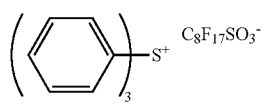 (z3)

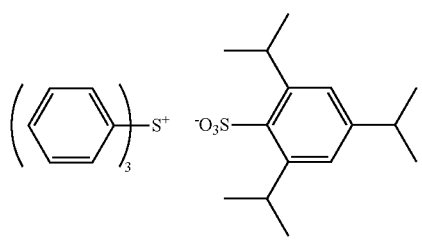 (z4)

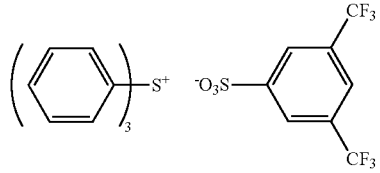 (z5)

-continued

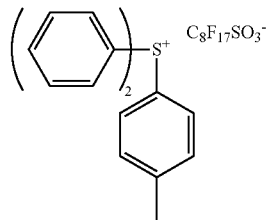 (z6)

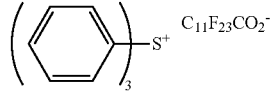 (z7)

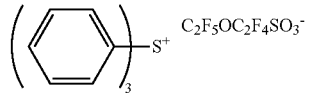 (z8)

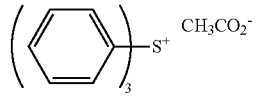 (z9)

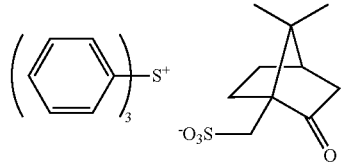 (z10)

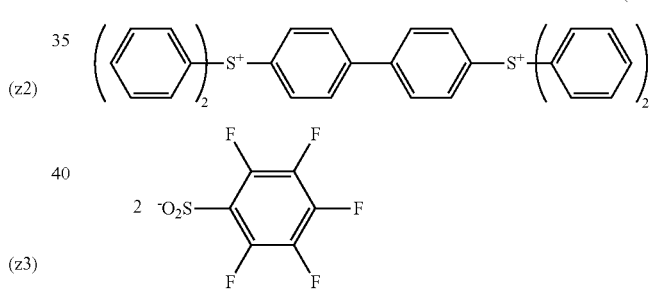 (z11)

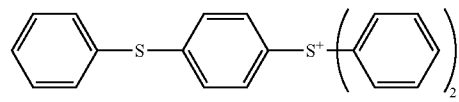 (z12)

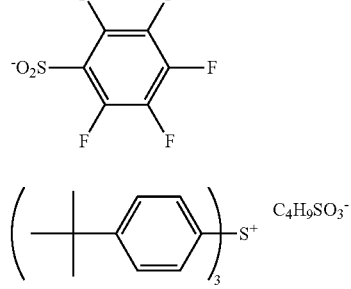 (z13)

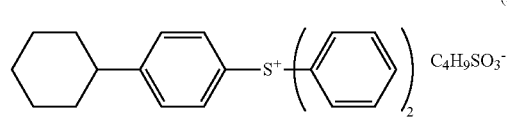 (z14)

-continued
(z15) 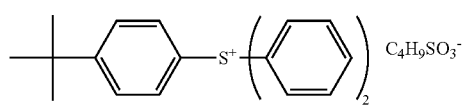
(z16) 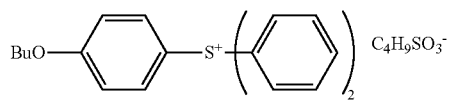
(z17) 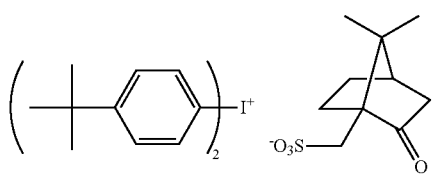
(z18) 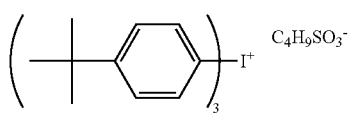
(z19) 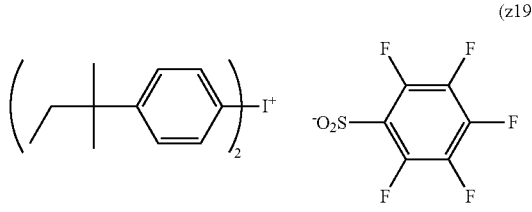
(z20) 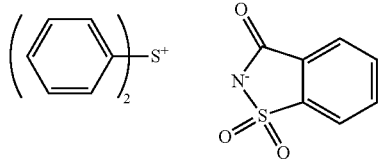
(z21) 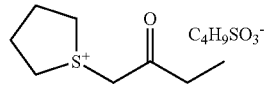
(z22) 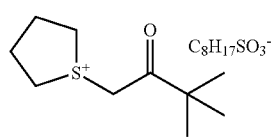
(z23) 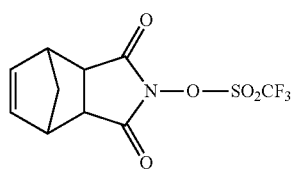
(z24) 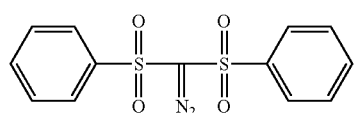
(z25) 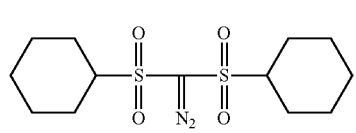
(z26) 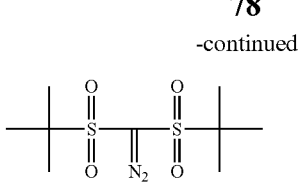
(z27) 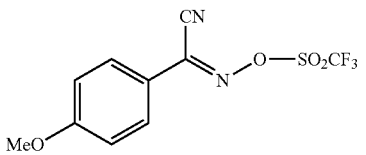
(z28) 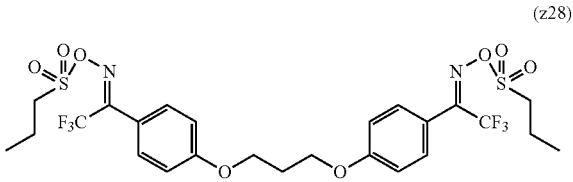
(z29) 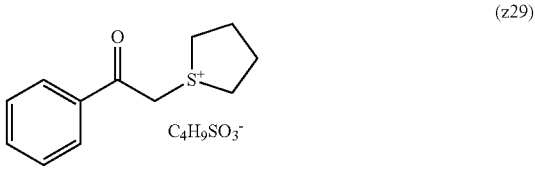
(z30) 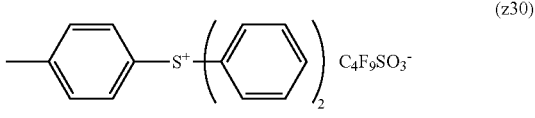
(z31) 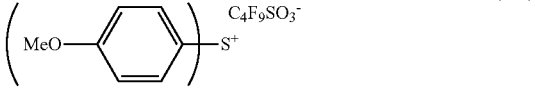
(z32) 
(z33) 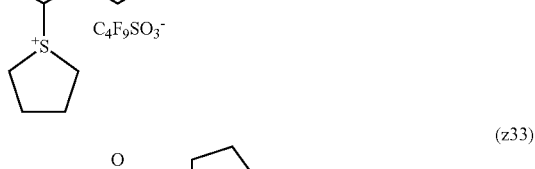
(z34) 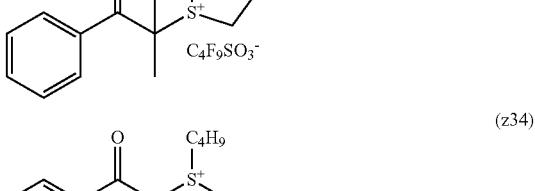
(z35) 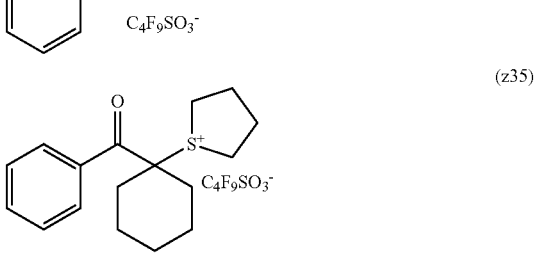

(z36) 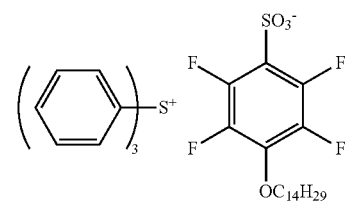
(z37) 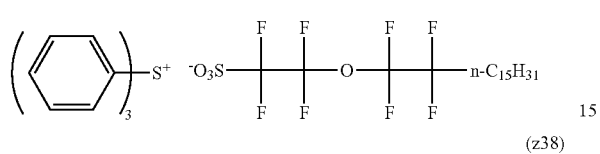
(z38) 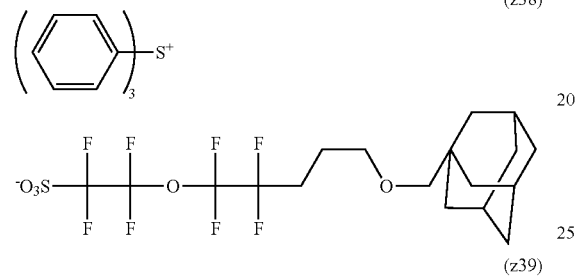
(z39) 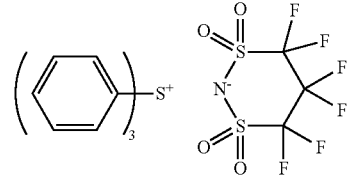
(z40) 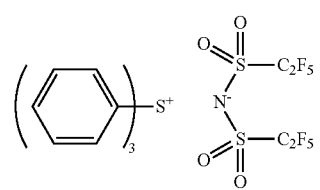
(z41) 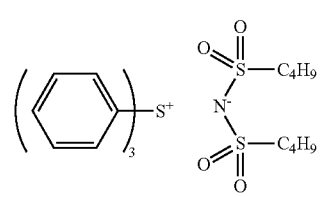
(z42) 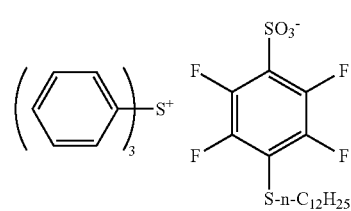
(z43) 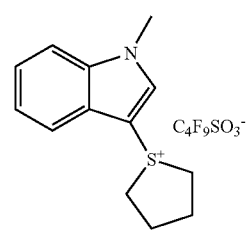
(z44) 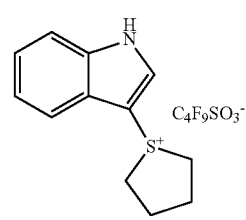
(z45) 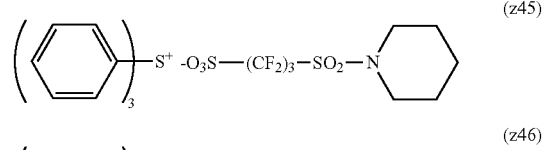
(z46) 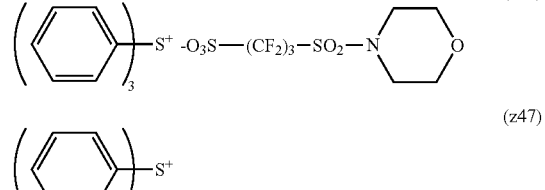
(z47) 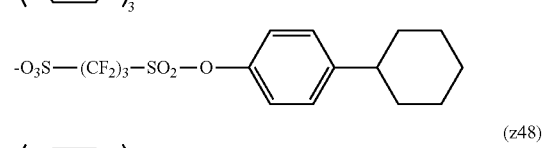
(z48) 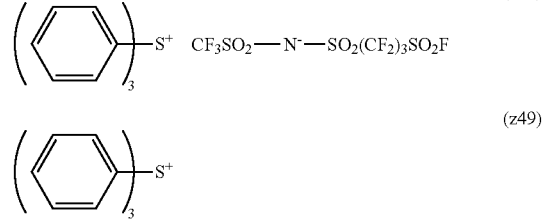
(z49) 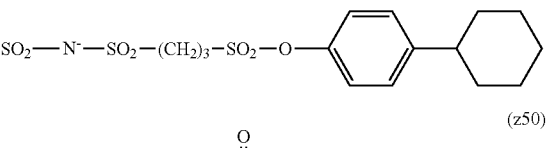
(z50) 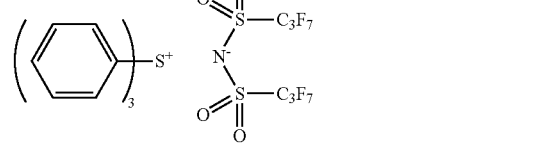
(z51)
(z52)

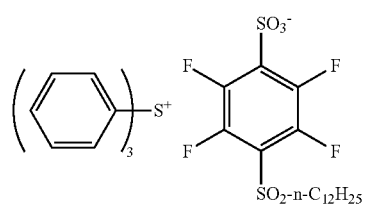 (z53)
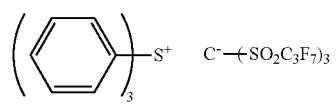 (z54)
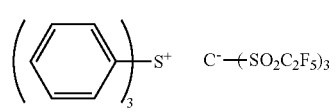 (z55)
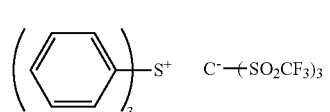 (z56)
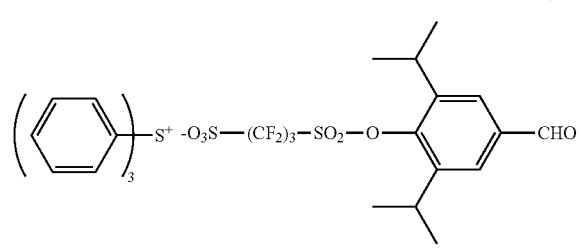 (z57)
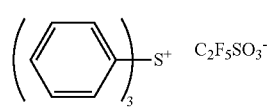 (z58)
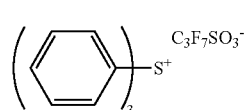 (z59)
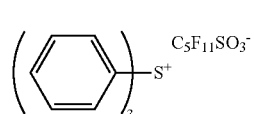 (z60)
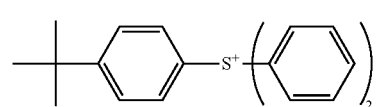 (z61)
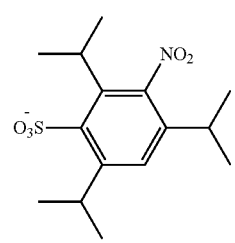
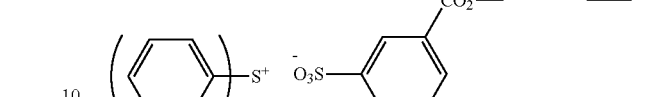 (z62)
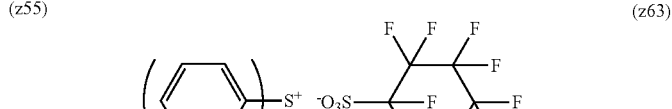 (z63)
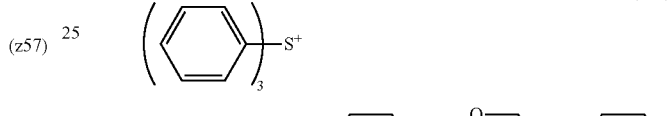 (z64)
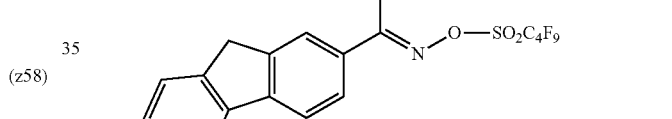 (z65)
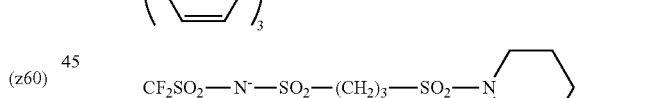 (z66)
 (z67)
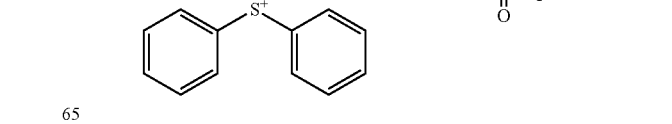 (z68)

(z69) 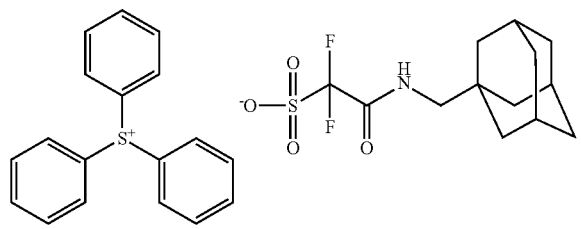
(z70) 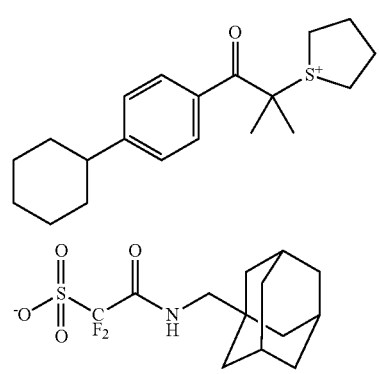
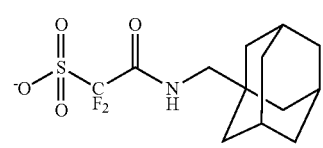
(z71) 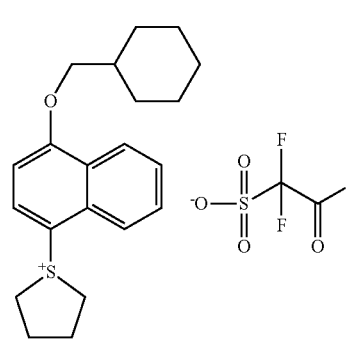
(z72) 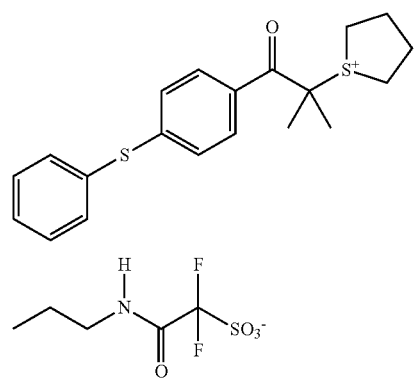
(z73) 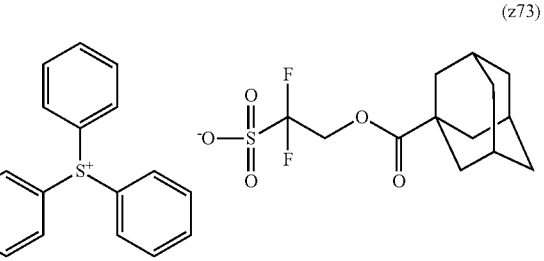
(z74) 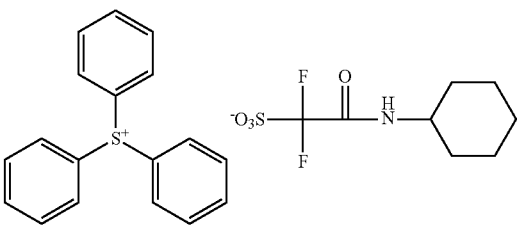
(z75) 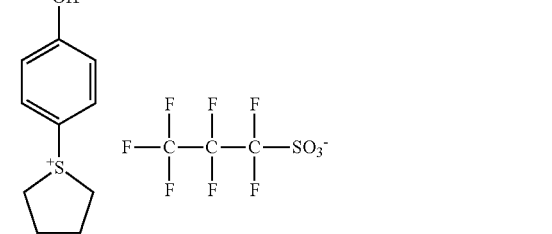
(z76) 
(z77) 
(z78) 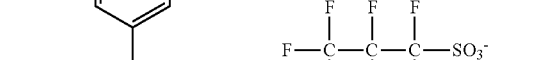
(z79) 

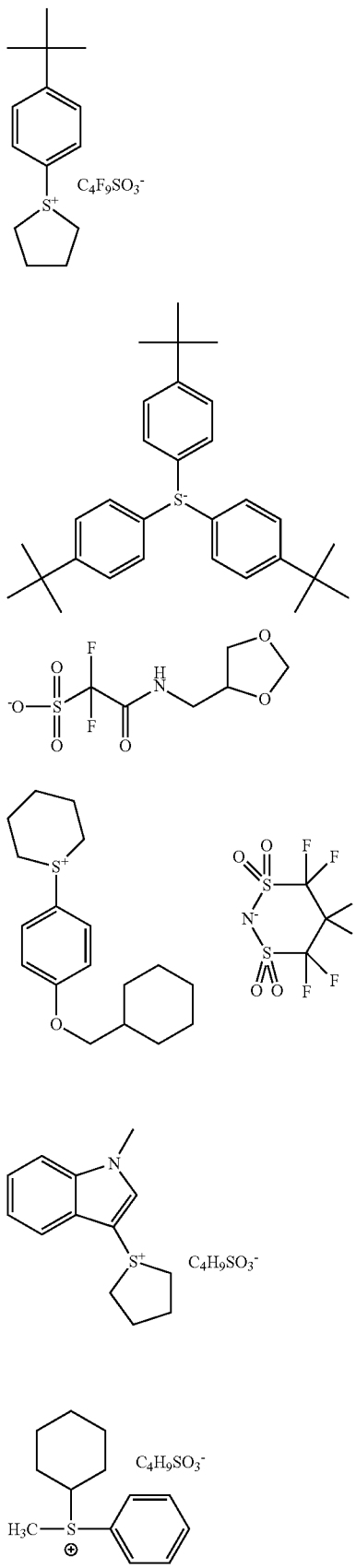
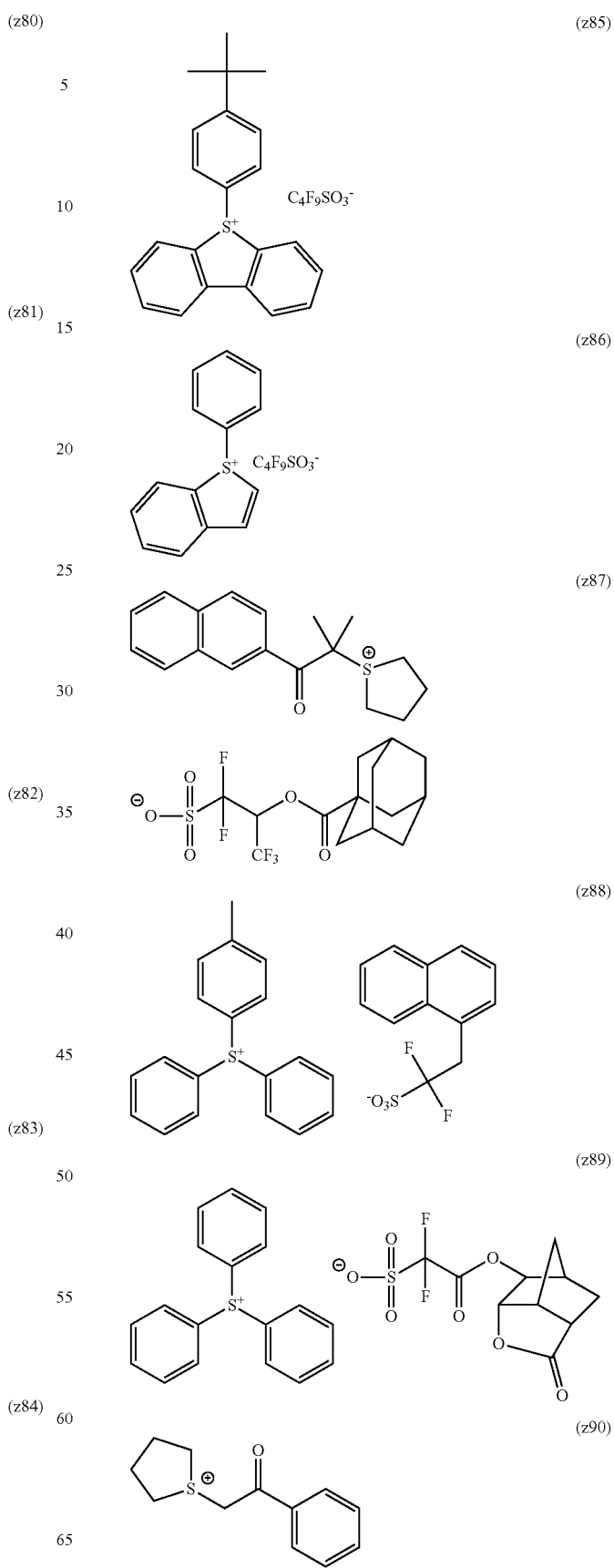

-continued
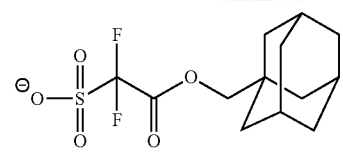
(z91)
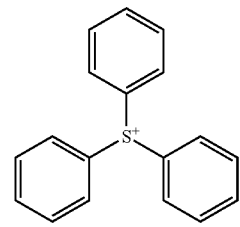
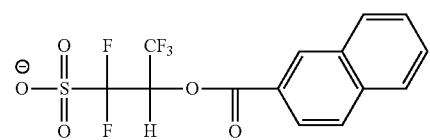
(z92)
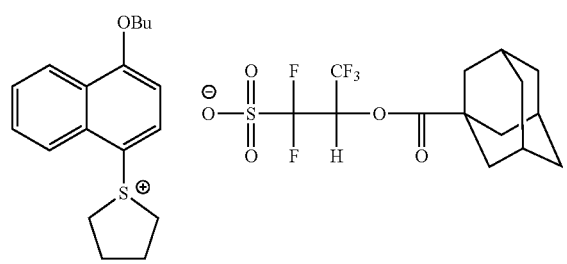
(z93)
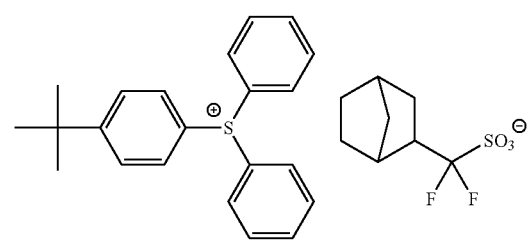
(z94)
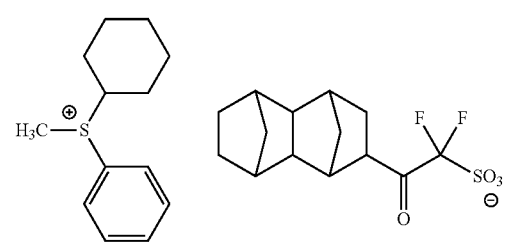
(z95)
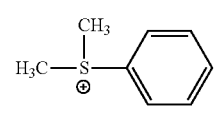 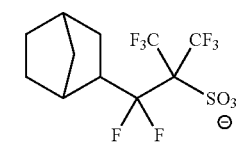
-continued
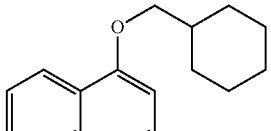
(z96)
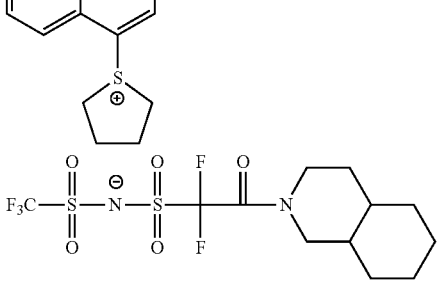
(z97)
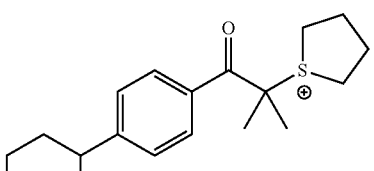
(z98)
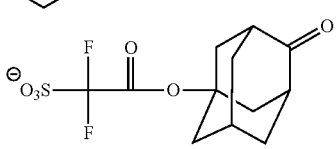
(z99)
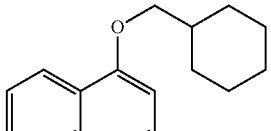
(z100)
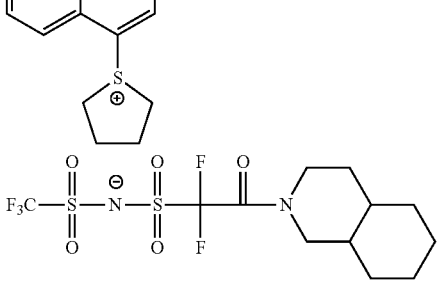
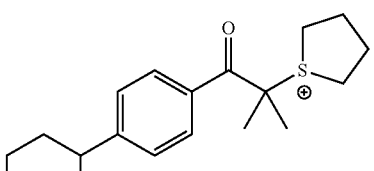
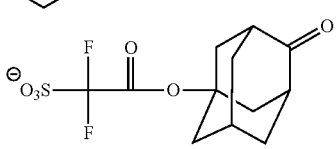

(z101) 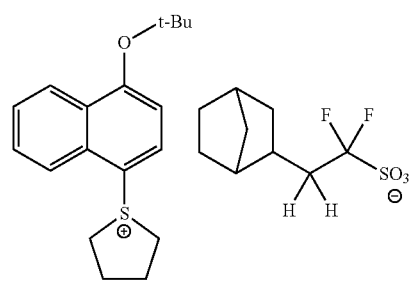
(z102) 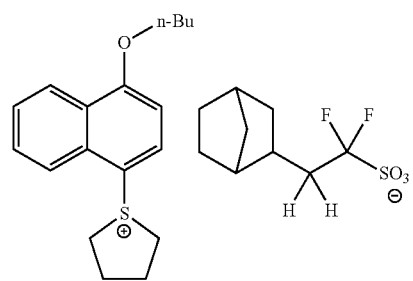
(z103) 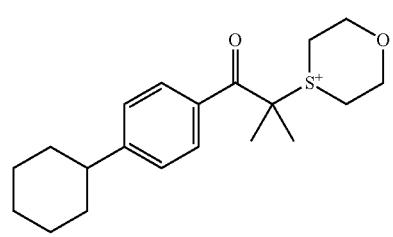
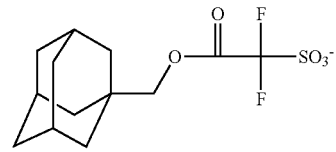
(z104) 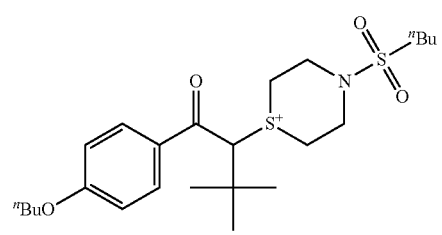
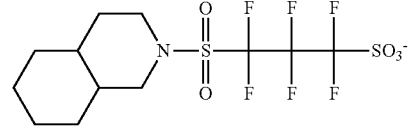
(z105) 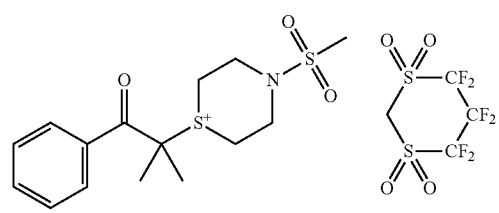
(z106) 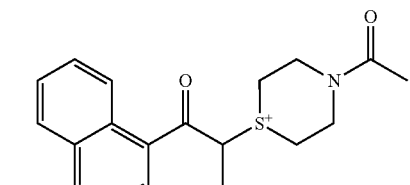
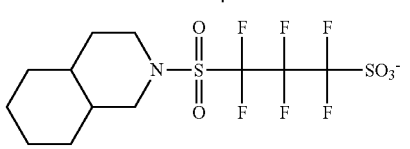
(z107) 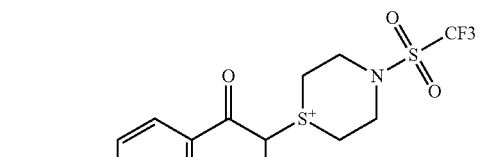
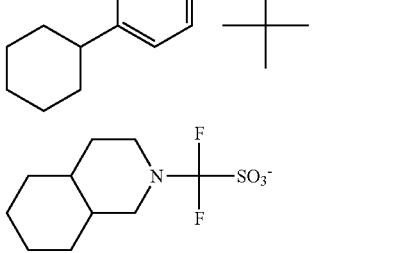
(z108) 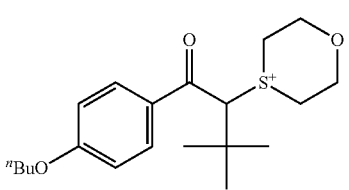
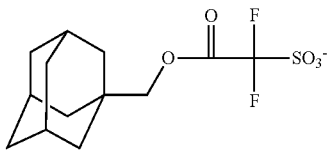
(z109) 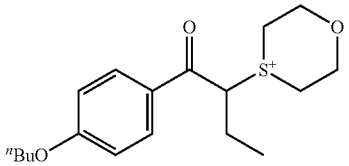
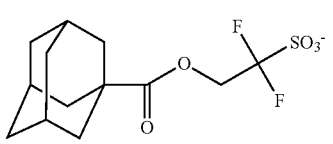

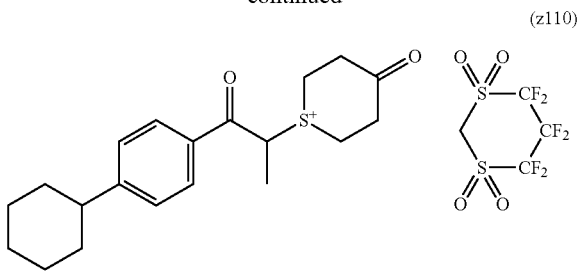

(z110)

(z111)

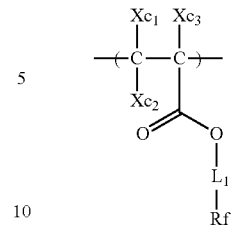

(1)

Acid generators can be synthesized according to known methods, for example, can be synthesized by the method described in JP-A-2007-161707.

Acid generators may be used by one kind alone, or two or more kinds may be used in combination.

The content of the compound capable of generating an acid upon irradiation with an actinic ray or radiation in the composition is preferably 0.1 mass % to 30 mass %, more preferably 0.5 mass % to 25 mass %, still more preferably 3 mass % to 20 mass %, and especially preferably 3 mass % to 15 mass %, based on the total solid content of the actinic ray-sensitive or radiation-sensitive resin composition.

Also, in the case where the acid generator is the acid generator represented by formula (ZI-3) or (ZI-4), the content thereof is preferably 5 mass % to 35 mass %, more preferably 6 mass % to 30 mass %, still more preferably 7 mass % to 30 mass %, and especially preferably 8 mass % to 25 mass %, based on the total solid content of the composition.

[3] (D) Resin Having a Repeating Unit Having a Fluorine Atom and not Having a $CF_3$ Partial Structure The actinic ray-sensitive or radiation-sensitive resin composition according to the invention contains (D) resin having a repeating unit having a fluorine atom and not having a $CF_3$ partial structure (hereinafter also referred to as merely "resin (D)").

The repeating unit having a fluorine atom and not having a $CF_3$ partial structure is preferably a repeating unit having a fluorinated alkyl group not having a $CF_3$ partial structure.

The preferred range of the carbon atom number, specific examples and preferred examples of the fluorinated alkyl group not having a $CF_3$ partial structure are the same with those described later as to the fluorinated alkyl group Rf not having a $CF_3$ partial structure in formula (1).

The fluorinated alkyl group is preferably a linear or branched fluorinated alkyl group, and more preferably a linear fluorinated alkyl group.

The repeating unit having a fluorine atom and not having a $CF_3$ partial structure in the resin (D) preferably has a repeating unit represented by the following formula (1).

In formula (1), each of $Xc_1$, $Xc_2$ and $Xc_3$ independently represents a hydrogen atom, a halogen atom, or an alkyl group not having a $CF_3$ partial structure; $L_1$ represents a single bond or a divalent linking group not having a $CF_3$ partial structure; and Rf represents a fluorinated alkyl group not having a $CF_3$ partial structure.

The specific examples of the alkyl groups not having a $CF_3$ partial structure of $Xc_1$, $Xc_2$ and $Xc_3$ include linear or branched alkyl groups having 1 to 4 carbon atoms, such as a methyl group, an ethyl group, an n-propyl group, an isopropyl group, an n-butyl group, an isobutyl group, and a t-butyl group. As the substituent, a hydroxyl group or the like is exemplified.

The specific examples of the halogen atoms of $Xc_1$, $Xc_2$ and $Xc_3$ include, for example, a fluorine atom and a chlorine atom.

$Xc_1$ and $Xc_2$ are preferably hydrogen atoms, respectively.

$Xc_3$ is preferably a hydrogen atom, a methyl group, or a hydroxymethyl group.

The examples of the divalent linking groups represented by $L_1$ include an alkylene group, a phenylene group, an ether bond (—O—), an amido bond (—CON(Ro)- or —N(Ro)CO—), a ureylene bond, a sulfonamide bond (—$SO_2$N(Ro)- or —N(Ro)$SO_2$—), an ester bond (—COO— or —OCO—), and a group obtained by combining two or more of these members. Ro represents a hydrogen atom or an alkyl group (e.g., an alkyl group having 1 to 8 carbon atoms, specifically a methyl group, an ethyl group, a propyl group, an isopropyl group, an n-butyl group, a sec-butyl group, a hexyl group, or an octyl group). However, the divalent linking group as $L_1$ preferably does not exhibit acid decomposability (non-acid-decomposable), and more preferably does not have an ester bond.

The alkylene group represented by $L_1$ is not especially restricted so long as it does not have a $CF_3$ partial structure, and the alkylene group is preferably an alkylene group having 1 to 5 carbon atoms, which may be a branched alkylene group (an alkylene group having an alkyl group as the substituent).

As the phenylene group represented by $L_1$, a 1,4-phenylene group is exemplified.

$L_1$ is preferably a single bond, an alkylene group, -alkylene group-CONH—, -alkylene group-NHCO—, or -alkylene group-O—, and more preferably an alkylene group, -alkylene group-CONH—, or -alkylene group-NHCO—.

The fluorinated alkyl group Rf not having a $CF_3$ partial structure is not especially restricted so long as it does not have a $CF_3$ partial structure, preferably it is an alkyl group in which at least one hydrogen atom is substituted with a fluorine atom, which group may be linear or branched, but is preferably linear, and is preferably a fluorinated alkyl group having 1 to 10 carbon atoms.

In view of not having a $CF_3$ partial structure, the terminal structure of the fluorinated alkyl group is preferably a $CH_3$ structure, a $CH_2F$ structure or a $CHF_2$ structure.

The specific examples of the fluorinated alkyl group Rf not having a $CF_3$ partial structure include $CH_2F$, $CHF_2$, $CF_2CH_3$, $CF_2CH_2F$, $CF_2CHF_2$, $C_2F_4CH_3$, $C_2F_4CH_2F$, $C_2F_4CHF_2$, $C_3F_6CH_3$, $C_3F_6CH_2F$, $C_3F_6CHF_2$, $C_4F_8CH_3$, $C_4F_8CH_2F$, $C_4F_8CHF_2$, $C_5F_{10}CH_3$, $C_5F_{10}CH_2F$, $C_5F_{10}CHF_2$, $C_6F_{12}CH_3$, $C_6F_{12}CH_2F$, $C_6F_{12}CHF_2$, $C_7F_{14}CH_3$, $C_7F_{14}CH_2F$, $C_7F_{14}CHF_2$, $C_8F_{16}CH_3$, $C_8F_{16}CH_2F$, $C_8F_{16}CHF_2$ and the like. The content of the fluorine atoms accounting for in the fluorinated alkyl group Rf is preferably the smaller.

The specific examples of the repeating units having a fluorine atom and not having a $CF_3$ partial structure are shown below, but the invention is not restricted thereto. In the specific examples, $X_1$ represents a hydrogen atom, —$CH_3$ or —F.

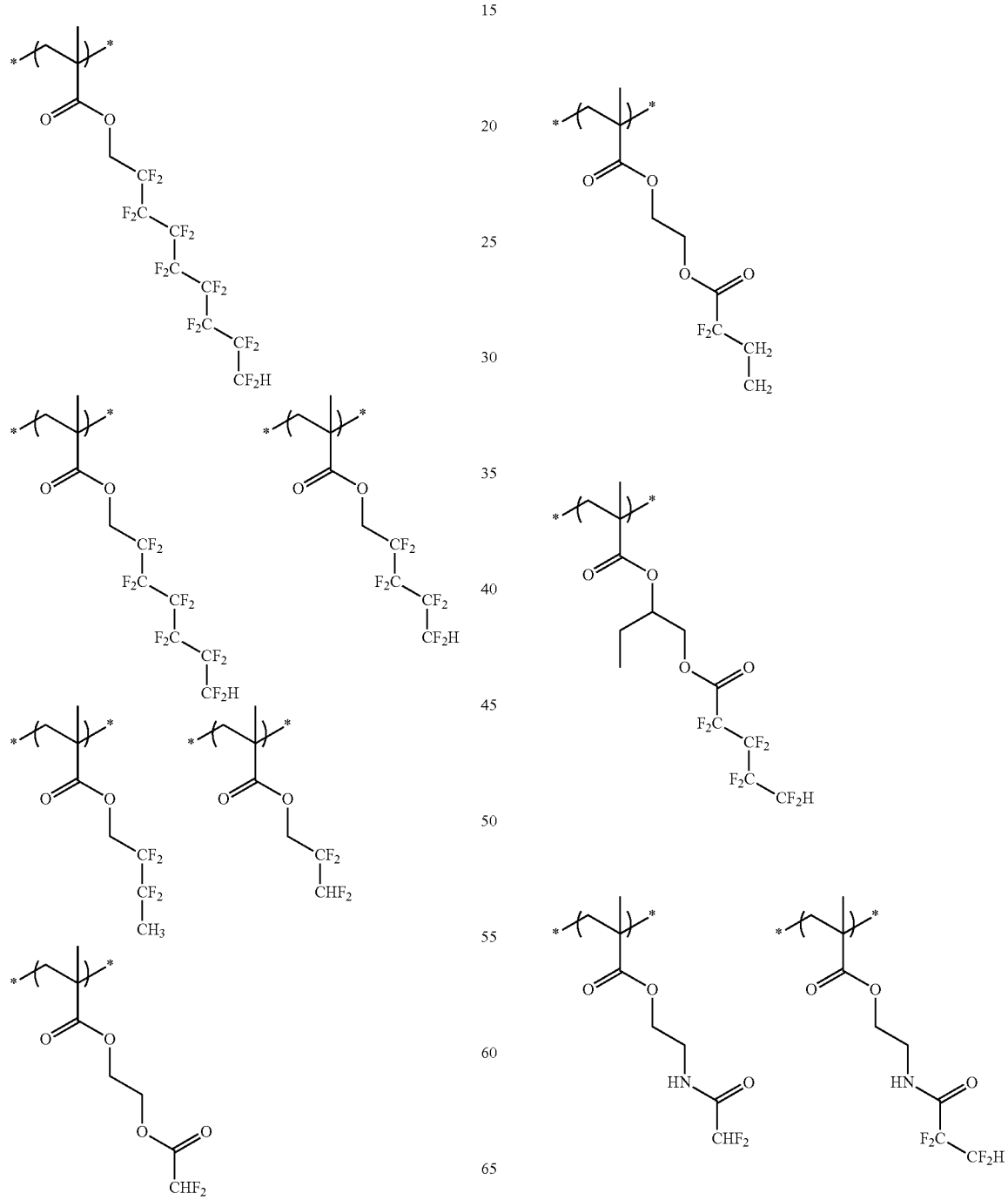

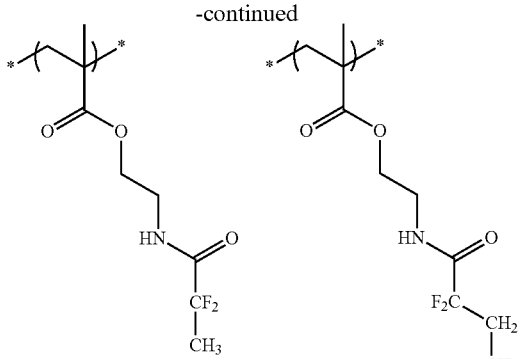

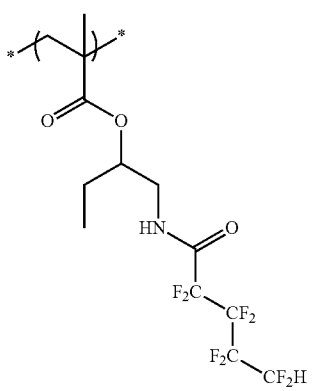

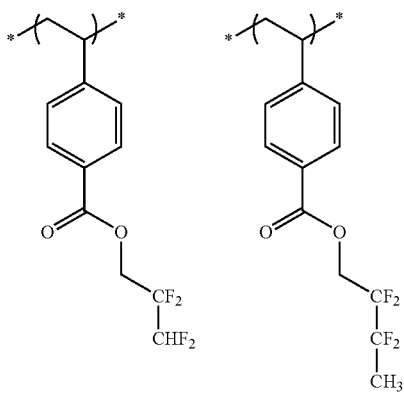

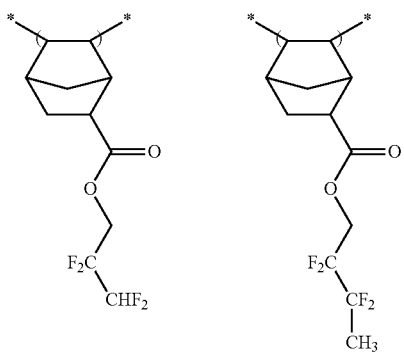

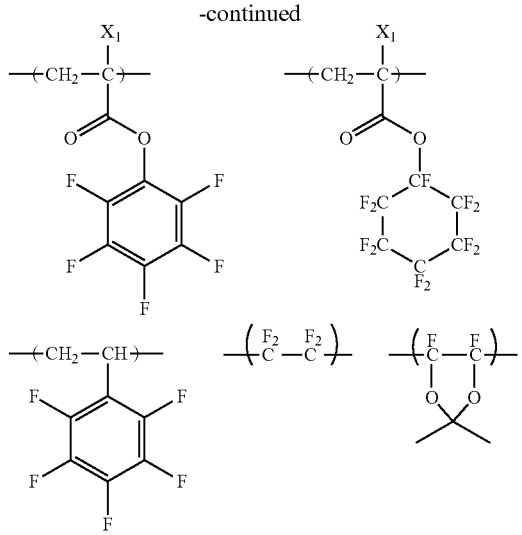

The content of the repeating units having a fluorine atom and not having a $CF_3$ partial structure is preferably 2 mol % to 80 mol %, more preferably 2 mol % to 70 mol %, and still more preferably 2 mol % to 60 mol %, based on all the repeating units in the resin (D)

In the invention, the resin (D) may contain a repeating unit having at least one $CH_3$ partial structure.

Also, the repeating unit having at least one $CH_3$ partial structure may be a repeating unit having a group capable of decomposing by the action of an acid to generate a polar group (an acid-decomposable group), or may be a repeating unit not having an acid-decomposable group, that is, a non-acid-decomposable repeating unit, but is preferably a repeating unit not having an acid-decomposable group, that is, a non-acid-decomposable repeating unit.

Incidentally, as the acid-decomposable group, the same groups as described in the acid-decomposable group in the resin (A) can be exemplified.

In the invention, the repeating unit having at least one $CH_3$ partial structure is preferably a repeating unit represented by the following formula (2) or (3).

(2)

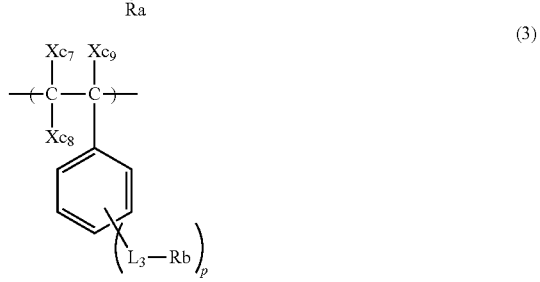
(3)

In formula (2), each of $Xc_4$, $Xc_5$ and $Xc_6$ independently represents a hydrogen atom, a halogen atom, or an alkyl group not having a $CF_3$ partial structure; $L_2$ represents a single bond or a divalent linking group not having a $CF_3$ partial structure; and Ra represents a group having at least one $CH_3$ partial structure.

In formula (3), each of $Xc_7$, $Xc_8$ and $Xc_9$ independently represents a hydrogen atom, a halogen atom, or an alkyl group not having a $CF_3$ partial structure; $L_3$ represents a single bond or a divalent linking group not having a $CF_3$ partial structure; and Rb represents a group having at least one $CH_3$ partial structure; and p represents an integer of 1 to 5, and p is preferably 1 to 4. When p is 2 or more, each $L_3$ may be the same with or different from every other $L_3$, and each Rb may be the same with or different from every other Rb.

In formulae (2) and (3), the alkyl group represented by each of $Xc_4$, $Xc_5$, $Xc_6$, $Xc_7$, $Xc_8$ and $Xc_9$ may have a substituent. The alkyl group is preferably a linear or branched alkyl group having 1 to 4 carbon atoms, such as a methyl group, an ethyl group, an n-propyl group, an isopropyl group, an n-butyl group, an isobutyl group, or a t-butyl group. As the substituent, a hydroxyl group or the like is exemplified.

The halogen atom represented by each of $Xc_4$, $Xc_5$, $Xc_6$, $Xc_7$, $Xc_8$ and $Xc_9$ includes, for example, a fluorine atom and a chlorine atom.

Each of $Xc_4$, $Xe_5$, $Xc_7$ and $Xc_8$ is preferably a hydrogen atom.

Each of $Xc_6$ and $Xc_9$ is preferably a hydrogen atom, a methyl group, or a hydroxymethyl group.

The divalent linking group not having a $CF_3$ partial structure represented by $L_2$ or $L_3$ is preferably an alkylene group, —O—, —CO—, —N(Ro)-, or a group obtained by combining two or more of these members. Ro in —N(Ro)- represents a hydrogen atom or an alkyl group (e.g., an alkyl group having 1 to 8 carbon atoms, specifically a methyl group, an ethyl group, a propyl group, an isopropyl group, an n-butyl group, a sec-butyl group, a hexyl group, or an octyl group). However, the divalent linking group not having a $CF_3$ partial structure as $L_2$ or $L_3$ preferably does not exhibit acid decomposability (non-acid-decomposable).

As groups Ra and Rb having at least one $CH_3$ partial structure, for example, an alkyl group, a cycloalkyl group having an alkyl group as substituent, an aryl group having an alkyl group as substituent, an alkoxy group, an alkoxycarbonyl group, and "a group having an alkylsilyl group" can be exemplified.

The alkyl group as Ra and Rb may have a substituent, which may be either linear or branched. The linear alkyl group preferably has 1 to 30 carbon atoms, and more preferably 1 to 20 carbon atoms, and the examples include, for example, a methyl group, an ethyl group, an n-propyl group, an isopropyl group, an n-butyl group, a sec-butyl group, a t-butyl group, an n-pentyl group, an n-hexyl group, an n-heptyl group, an n-octyl group, an n-nonyl group, and an n-decanyl group. The branched alkyl group preferably has 3 to 30 carbon atoms, and more preferably 3 to 20 carbon atoms, and the examples include, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decanoyl group.

The cycloalkyl group having an alkyl group as substituent represented by Ra and Rb may have a substituent other than an alkyl group, which may be monocyclic, polycyclic, or bridging. For example, the cycloalkyl group may have a bridged structure. As the monocyclic cycloalkyl group, cycloalkyl group having 3 to 8 carbon atoms is preferred, and, for example, a cyclopropyl group, a cyclopentyl group, a cyclohexyl group, a cyclobutyl group, and a cyclooctyl group, each of which groups has an alkyl group as substituent, can be exemplified. As the polycyclic cycloalkyl group, a group having 5 or more carbon atoms and a bicyclo, tricyclo, or tetracyclo structure can be exemplified. The cycloalkyl group having an alkyl group as substituent and having 6 to 20 carbon atoms is preferred and, for example, an adamantyl group, a norbornyl group, an isoboronyl group, a camphanyl group, a dicyclopentyl group, an α-pinel group, a tricyclodecanyl group, a tetracyclododecyl group, and an androstanyl group, each of which groups has an alkyl group as substituent, can be exemplified. A part of the carbon atoms in the cycloalkyl group may be substituted with a hetero-atom such as an oxygen atom.

The alkoxy group as Ra and Rb may have a substituent, for example, the above alkoxy group having 1 to 8 carbon atoms, and a methoxy group, an ethoxy group, a propoxy group, a butoxy group, a pentyloxy group, and a hexyloxy group can be exemplified.

The aryl group having an alkyl group as substituent as Ra and Rb may have a substituent other than an alkyl group, preferably an aryl group having 6 to 30 carbon atoms, and more preferably 6 to 20 carbon atoms, and the examples thereof include a 4-methylphenyl group, a 3-methylphenyl group, a 2-methylphenyl group, a 4-ethylphenyl group, 3-ethylphenyl group, 2-ethylphenyl group, a 4-n-propylphenyl group, a 3-n-propylphenyl group, a 2-n-propylphenyl group, a 4-i-propylphenyl group, a 3-i-propylphenyl group, a 2-i-propylphenyl group, a 4-n-butylphenyl group, a 3-n-butylphenyl group, a 2-n-butylphenyl group, a 4-i-butylphenyl group, a 3-i-butylphenyl group, a 2-i-butylphenyl group, a 4-t-butylphenyl group, a 3-t-butylphenyl group, a 2-t-butylphenyl group, a 4-n-pentylphenyl group, a 4-n-hexylphenyl group, a 4-n-heptenylphenyl group, a 4-n-octanylphenyl group, a 2-n-pentylphenyl group, a 2-n-hexylphenyl group, a 2-n-heptenylphenyl group, a 2-n-octanylphenyl group, a 3-n-pentylphenyl group, a 3-n-hexylphenyl group, a 3-n-heptenylphenyl group, a 3-n-octanylphenyl group, a 2,6-diisopropylphenyl group, a 2,3-di-isopropylphenyl group, a 2,4-di-isopropylphenyl group, a 3,4-di-isopropylphenyl group, a 3,6-di-t-butylphenyl group, a 2,3-di-t-butylphenyl group, a 2,4-di-t-butylphenyl group, a 3,4-di-t-butylphenyl group, a 2,6-di-n-butylphenyl group, a 2,3-di-n-butylphenyl group, a 2,4-di-n-butylphenyl group, a 3,4-di-n-butylphenyl group, a 2,6-di-i-butylphenyl group, a 2,3-di-i-butylphenyl group, a 2,4-di-i-butylphenyl group, a 3,4-di-i-butylphenyl group, a 2,6-di-t-amylphenyl group, a 2,3-di-t-amylphenyl group, a 2,4-di-t-amylphenyl group, a 3,4-di-t-amylphenyl group, a 2,6-di-i-amylphenyl group, a 2,3-di-i-amylphenyl group, a 2,4-di-i-amylphenyl group, a 3,4-di-i-amylphenyl group, a 2,6-di-n-pentylphenyl group, a 2,3-di-n-pentylphenyl group, a 2,4-di-n-pentylphenyl group, a 3,4-di-n-pentylphenyl group, a 4-n-pentyloxyphenyl group, a 4-n-hexyloxyphenyl group, a 4-n-heptenyloxyphenyl group, a 4-n-octanyloxyphenyl group, a 2-n-pentyloxyphenyl group, a 2-n-hexyloxyphenyl group, a 2-n-heptenyloxyphenyl group, a 2-n-octanyloxyphenyl group, a 3-n-pentyloxyphenyl group, a 3-n-hexyloxyphenyl group, a 3-n-heptenyloxyphenyl group, a 3-n-octanyloxyphenyl group, a 2,6-di-isopropyloxyphenyl group, a 2,3-di-isopropyloxyphenyl group, a 2,4-di-isopropyloxyphenyl group, a 3,4-di-isopropyloxyphenyl group, a 2,6-di-t-butyloxyphenyl group, a 2,3-di-t-butyloxyphenyl group, a 2,4-di-t-butyloxyphenyl group, a 3,4-di-t-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-i-butyloxyphenyl group, a 2,3-di-i-butyloxyphenyl group, a 2,4-di-i-butyloxyphenyl group, a 3,4-di-i-butyloxyphenyl group, a 2,6-di-t- amyloxyphenyl group, a 2,3-di-t-amyloxyphenyl group, a 2,4-di-t-amyloxyphenyl group, a 3,4-di-t-amyloxyphenyl group, a 2,6-di-i-amyloxyphenyl group, a 2,3-di-i-amyloxyphenyl group, a 2,4-di-i-amyloxyphenyl group, a 3,4-di-i-amyloxyphenyl group, a 2,6-di-n-pentyloxyphenyl group, a 2,3-di-n-pentyloxyphenyl group, a 2,4-di-n-pentyloxyphenyl group, and a 3,4-di-n-pentyloxyphenyl group.

The alkylcarbonyl group as Ra and Rb may have a substituent, for example, an acyl group having 2 to 8 carbon atoms, specifically such as an acetyl group, a propanoyl group, a butanoyl group, and a pivaloyl group are preferably exemplified.

The group having an alkylsilyl group as Ra and Ra may have a substituent, and a trialkylsilyl group and a tris(trialkylsilyl)silyl group can be preferably exemplified. As the alkyl group in the alkylsilyl group, the same groups as described in the alkyl group as Ra can be exemplified.

The examples of the substituents other than the alkyl group which may be contained in the alkyl group, cycloalkyl group, aryl group, an alkoxy group, an acyl group, and "group having an alkylsilyl group" represented by Ra and Rb include a hydroxyl group, a carboxyl group, a halogen atom (a fluorine atom, a chloride atom, a bromine atom, an iodine atom), and an alkoxy group (a methoxy group, an ethoxy group, a propoxy group, a butoxy group) can be exemplified.

In the repeating unit having at least one $CH_3$ partial structure, from the viewpoint of bringing the mass percentage content in the repeating unit, which is accounted for by the $CH_3$ partial structure contained in the side chain moiety of the repeating unit having at least one $CH_3$ partial structure, into 18.0% or more, as is described later, each of Ra in formula (2) and Rb in formula (3) independently preferably represents a group having at least one of the structures represented by any of the following formulae (D3) to (D6).

(D3)

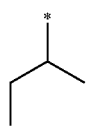

(D4)

(D5)

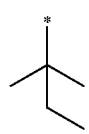

(D6)

In the above formulae, * represents a bond to be connected to other atom in the group having at least one structure represented by any of formulae (D3) to (D6), or to $L_2$ in the above formula (2), or a bond to be connected to $L_3$ in formula (3).

In the repeating unit having at least one $CH_3$ partial structure, the mass percentage content in the repeating unit, which is accounted for by the $CH_3$ partial structure contained in the side chain moiety of the repeating unit having at least one $CH_3$ partial structure, is preferably 18.0% or more, and more preferably 20.0% or more. By bringing the mass percentage content into the above range, the lower surface free energy is liable to be attained, and so the resin (D) can be more certainly localized on the surface layer part of the resist film. As a result, reduction of bridge defect and control of particle generation can be more surely attained.

In the repeating unit having at least one $CH_3$ partial structure, the mass percentage content in the repeating unit, which is accounted for by the $CH_3$ partial structure contained in the side chain moiety of the repeating unit having at least one $CH_3$ partial structure, is preferably 50.0% or less, and preferably 40.0% or less.

In the invention, in the $CH_3$ partial structure contained in the side chain moiety of the repeating unit having at least one $CH_3$ partial structure (hereinafter also referred to as merely "side chain $CH_3$ partial structure of the repeating unit having at least one $CH_3$ partial structure"), $CH_3$ partial structure of an ethyl group, a propyl group, or the like is included.

Also, a methyl group directly bonded to the main chain of the repeating unit having at least one $CH_3$ partial structure (for example, an α-methyl group of a repeating unit having a methacrylic acid structure) is little contributable to surface localization of the resin (D) due to the influence of the main chain, accordingly the methyl group is not to be included (not counted) in the side chain $CH_3$ partial structure of the repeating unit having at least one $CH_3$ partial structure in the invention.

For example, in formula (2), when any of $Xc_4$, $Xc_5$ and $Xe_6$ is a methyl group, and when $L_2$ is a single bond and Ra is a methyl group, the methyl group as $Xc_4$, $Xc_5$, $Xc_6$ or Ra is not included (not counted) in the side chain $CH_3$ partial structure of the repeating unit having at least one $CH_3$ partial structure in the invention.

On the other hand, the $CH_3$ partial structure present through any atom from C—C main chain in formula (2) is counted as the $CH_3$ partial structure in the invention. For example, when $Xc_5$ is an ethyl group ($CH_2CH_2$), the ethyl group is to be counted as the group having "one" $CH_3$ partial structure of the side chain moiety of the repeating unit having at least one $CH_3$ partial structure.

In the repeating unit having at least one $CH_3$ partial structure, the mass percentage content (%) in the repeating unit, which is accounted for by the side chain $CH_3$ partial structure of the repeating unit having at least one $CH_3$ partial structure, can be computed according to the following expression: "100×15.03×(the number of the $CH_3$ partial structures in the side chain moiety in the repeating unit)/the molecular weight of the repeating unit".

As for the repeating unit having at least one $CH_3$ partial structure which the resin (D) may have, the mass percentage content in each repeating unit (in the tables, described merely as content of side chain $CH_3$ partial structure), which is accounted for by the $CH_3$ partial structure contained in the side chain moiety thereof, is shown in the following together with the structure of the repeating unit.

TABLE 1

| No. | Y-1 | Y-2 | Y-3 | Y-4 |
|---|---|---|---|---|
| Molecular weight of repeating unit | 142.2 | 156.22 | 198.3 | 184.28 |
| Number of $CH_3$ partial structure on the side chain | 3 | 3 | 5 | 3 |
| Content of side chain $CH_3$ partial structure (%) | 31.6 | 28.8 | 37.8 | 24.4 |
| Structure of repeating unit | | | | |

| No. | Y-5 | Y-6 | Y-7 | Y-8 |
|---|---|---|---|---|
| Molecular weight of repeating unit | 170.25 | 198.3 | 210.31 | 262.39 |
| Number of $CH_3$ partial structure on the side chain | 4 | 5 | 2 | 2 |
| Content of side chain $CH_3$ partial structure (%) | 35.2 | 37.8 | 14.3 | 11.4 |
| Structure of repeating unit | | | | |

| No. | Y-9 | Y-10 | Y-11 | Y-12 |
|---|---|---|---|---|
| Molecular weight of repeating unit | 196.29 | 234.33 | 250.38 | 278.43 |
| Number of $CH_3$ partial structure of the side chain | 2 | 1 | 1 | 1 |
| Content of side chain $CH_3$ partial structure (%) | 15.3 | 6.4 | 6.0 | 5.4 |

TABLE 1-continued

| Structure of repeating unit | 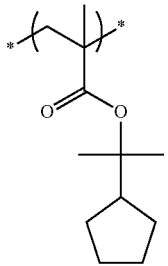 | 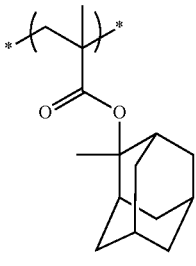 | 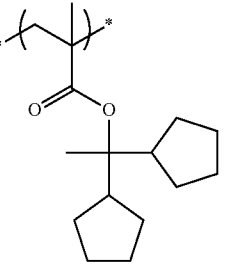 | 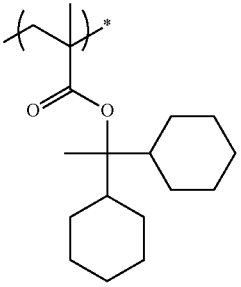 |
|---|---|---|---|---|
| No. | Y-13 | Y-14 | Y-15 | Y-16 |
| Molecular weight of repeating unit | 118.18 | 160.26 | 216.36 | 146.23 |
| Number of CH₃ partial structure of the side chain | 1 | 3 | 6 | 2 |
| Content of side chain CH₃ partial structure (%) | 12.7 | 28.1 | 41.6 | 20.5 |
| Structure of repeating unit | 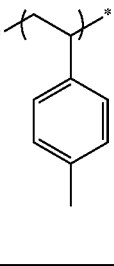 | 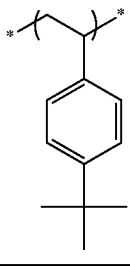 | 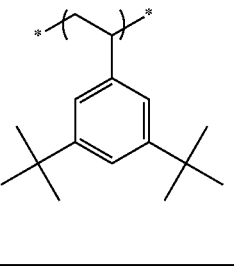 | 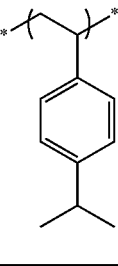 |
| No. | Y-17 | Y-18 | Y-19 | Y-20 |
| Molecular weight of repeating unit | 188.31 | 196.29 | 168.23 | 182.26 |
| Number of CH₃ partial structure of the side chain | 4 | 1 | 1 | 1 |
| Content of side chain CH₃ partial structure (%) | 31.9 | 7.6 | 8.9 | 8.2 |
| Structure of repeating unit | 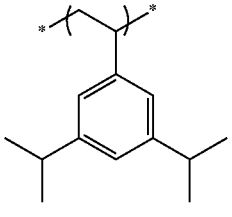 | 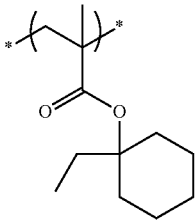 | 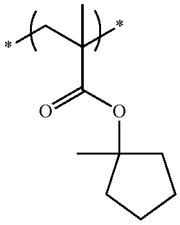 | 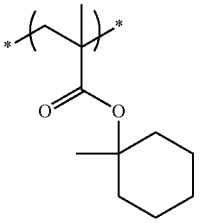 |

TABLE 2

| No. | Y-21 | Y-22 | Y-23 |
|---|---|---|---|
| Molecular weight of repeating unit | 100.12 | 142.2 | 156.22 |
| Number of CH₃ partial structure of the side chain | 1 | 2 | 3 |

TABLE 2-continued

| | | | |
|---|---|---|---|
| Content of side chain CH$_3$ partial structure (%) | 15.0 | 21.1 | 28.8 |
| Structure of repeating unit | (methyl ester acrylate repeating unit) | (isobutyl ester acrylate repeating unit) | (neopentyl ester acrylate repeating unit) |

| No. | Y-24 | Y-25 | Y-26 |
|---|---|---|---|
| Molecular weight of repeating unit | 128.17 | 170.25 | 170.25 |
| Number of CH$_3$ partial structure of the side chain | 2 | 4 | 3 |
| Content of side chain CH$_3$ partial structure (%) | 23.4 | 35.2 | 26.4 |
| Structure of repeating unit | (isopropyl ester acrylate) | (3,3-dimethylbutan-2-yl ester acrylate) | (3-methylpentan-2-yl ester acrylate) |

| No. | Y-27 | Y-28 | Y-29 |
|---|---|---|---|
| Molecular weight of repeating unit | 184.28 | 212.33 | 198.3 |
| Number of CH$_3$ partial structure of the side chain | 4 | 4 | 5 |
| Content of side chain CH$_3$ partial structure (%) | 32.6 | 28.3 | 37.8 |
| Structure of repeating unit | (2,4-dimethylpentan-3-yl ester acrylate) | (3-ethylpentan-3-yl variant) | (neopentyl-branched ester acrylate) |

| No. | Y-30 | Y-31 | Y-32 |
|---|---|---|---|
| Molecular weight of repeating unit | 212.33 | 182.26 | 196.29 |
| Number of CH$_3$ partial structure of the side chain | 6 | 1 | 2 |
| Content of side chain CH$_3$ partial structure (%) | 42.4 | 8.2 | 15.3 |

TABLE 2-continued

| Structure of repeating unit | 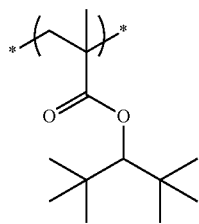 | 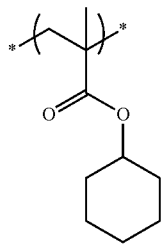 | 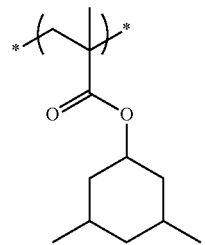 |
|---|---|---|---|
| No. | Y-33 | Y-34 | Y-35 |
| Molecular weight of repeating unit | 210.31 | 252.39 | 224.34 |
| Number of $CH_3$ partial structure of the side chain | 2 | 4 | 3 |
| Content of side chain $CH_3$ partial structure (%) | 14.3 | 23.8 | 20.1 |
| Structure of repeating unit | 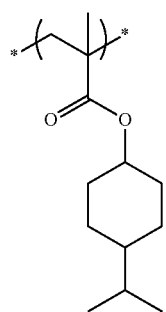 | 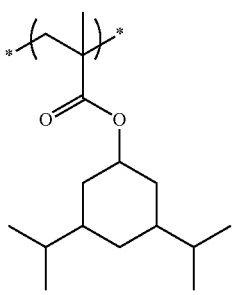 | 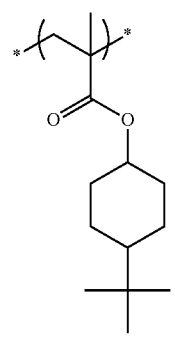 |
| No. | Y-36 | Y-37 | Y-38 |
| Molecular weight of repeating unit | 238.37 | 280.45 | 198.3 |
| Number of $CH_3$ partial structure of the side chain | 4 | 6 | 4 |
| Content of side chain $CH_3$ partial structure (%) | 25.2 | 32.1 | 30.3 |
| Structure of repeating unit | 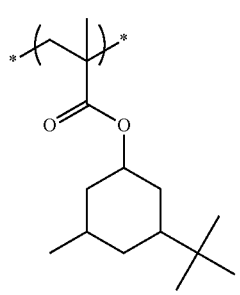 | 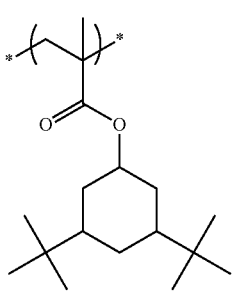 | 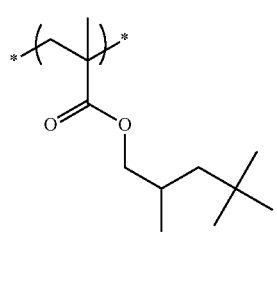 |
| No. | Y-39 | Y-40 | Y-41 |
| Molecular weight of repeating unit | 212.33 | 240.38 | 294.47 |

TABLE 2-continued

| | | | |
|---|---|---|---|
| Number of CH₃ partial structure of the side chain | 4 | 4 | 7 |
| Content of side chain CH₃ partial structure (%) | 28.3 | 25.0 | 35.7 |
| Structure of repeating unit | | | |

| No. | Y-42 | Y-43 | Y-44 |
|---|---|---|---|
| Molecular weight of repeating unit | 280.45 | 252.39 | 308.5 |
| Number of CH₃ partial structure of the side chain | 6 | 5 | 7 |
| Content of side chain CH₃ partial structure (%) | 32.1 | 29.7 | 34.0 |
| Structure of repeating unit | | | |

| No. | Y-45 | Y-46 | Y-47 |
|---|---|---|---|
| Molecular weight of repeating unit | 266.42 | 252.39 | 252.39 |
| Number of CH₃ partial structure of the side chain | 5 | 4 | 5 |
| Content of side chain CH₃ partial structure (%) | 28.2 | 23.8 | 29.7 |

TABLE 2-continued
| Structure of repeating unit | | | |
|---|---|---|---|
| 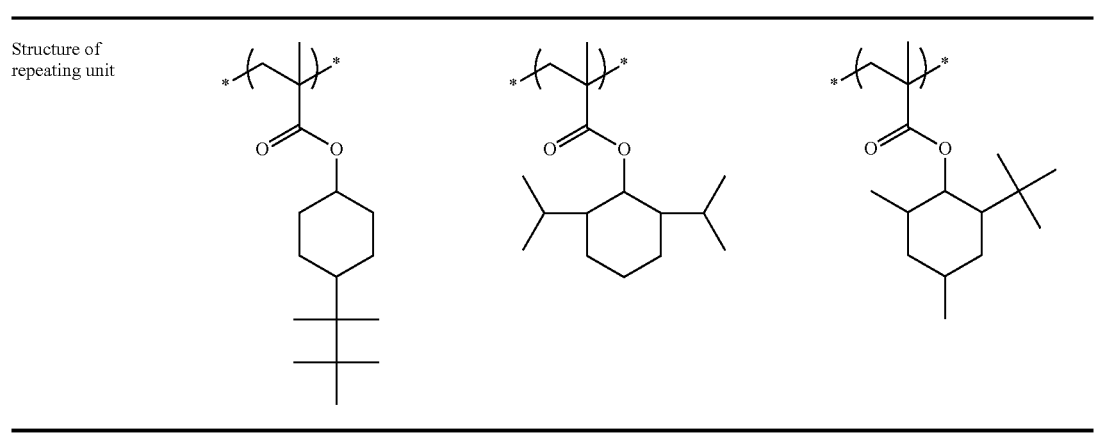 | | | |
| No. | Y-48 | Y-49 | Y-50 |
| Molecular weight of repeating unit | 172.3 | 360.79 | 182.26 |
| Number of CH$_3$ partial structure of the side chain | 3 | 9 | 1 |
| Content of side chain CH$_3$ partial structure (%) | 26.1 | 37.4 | 8.2 |
| Structure of repeating unit | | | |
| 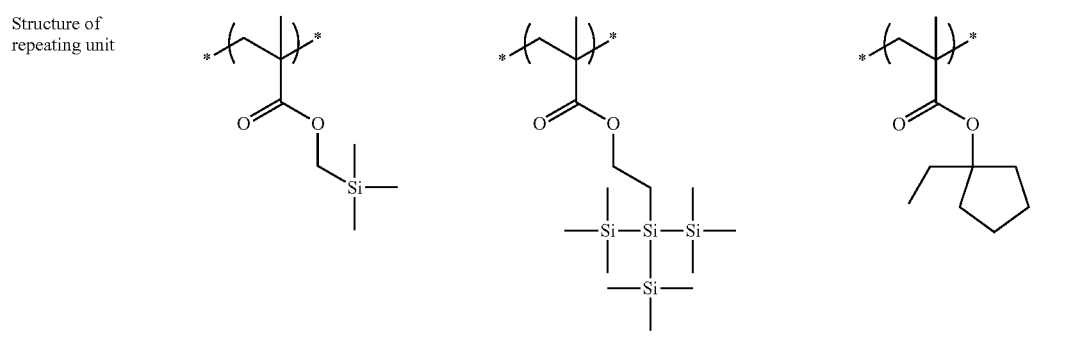 | | | |
TABLE 3
| No. | Y-51 | Y-52 | Y53 |
|---|---|---|---|
| Molecular weight of repeating unit | 186.32 | 200.35 | 200.35 |
| Number of CH$_3$ partial structure of the side chain | 3 | 3 | 5 |
| Content of side chain CH$_3$ partial structure (%) | 24.2 | 22.5 | 37.4 |

TABLE 3-continued

| No. | Y-54 | Y-55 | Y-56 |
|---|---|---|---|
| Molecular weight of repeating unit | 256.46 | 100.23 | 114.26 |
| Number of $CH_3$ partial structure of the side chain | 6 | 3 | 3 |
| Content of side chain $CH_3$ partial structure (%) | 35.1 | 44.9 | 39.4 |

| No. | Y-57 | Y-58 | Y-59 | Y-60 |
|---|---|---|---|---|
| Molecular weight of repeating unit | 128.29 | 142.31 | 174.39 | 272.53 |
| Number of $CH_3$ partial structure of the side chain | 3 | 5 | 5 | 6 |
| Content of side chain $CH_3$ partial structure (%) | 35.1 | 52.7 | 43.0 | 33.0 |

| No. | Y-61 | Y-62 | Y-63 |
|---|---|---|---|
| Molecular weight of repeating unit | 258.46 | 274.5 | 188.41 |
| Number of $CH_3$ partial structure of the side chain | 4 | 5 | 5 |

TABLE 3-continued

| | | | |
|---|---|---|---|
| Content of side chain CH₃ partial structure (%) | 23.2 | 27.3 | 39.8 |
| Structure of repeating unit | (structure) | (structure) | (structure) |

| No. | Y-64 | Y-65 | Y-66 |
|---|---|---|---|
| Molecular weight of repeating unit | 240.41 | 308.63 | 272.49 |
| Number of CH₃ partial structure of the side chain | 3 | 6 | 4 |
| Content of side chain CH₃ partial structure (%) | 18.7 | 29.2 | 22.0 |
| Structure of repeating unit | (structure) | (structure) | (structure) |

| No. | Y-67 | Y-68 | Y-69 |
|---|---|---|---|
| Molecular weight of repeating unit | 643.16 | 422.81 | 156.22 |
| Number of CH₃ partial structure of the side chain | 7 | 9 | 4 |
| Content of side chain CH₃ partial structure (%) | 16.3 | 31.9 | 38.4 |

TABLE 3-continued

| Structure of repeating unit | (Y-70: acrylate with propyl-POSS side chain) | (Y-71: acrylate with propyl-Si(OSi(Me)₃)₃ side chain) | (Y-72: acrylate with branched alkyl side chain) |
|---|---|---|---|
| No. | Y-70 | Y-71 | Y-72 | Y73 |
| Molecular weight of repeating unit | 210.31 | 198.3 | 170.25 | 156.22 |
| Number of CH₃ partial structure of the side chain | 3 | 6 | 4 | 4 |
| Content of side chain CH₃ partial structure (%) | 21.4 | 45.4 | 35.2 | 38.4 |

| Structure of repeating unit | (acrylate with 4-tert-butylcyclohexyl) | (acrylate with di-tert-butylmethyl) | (acrylate with diisopropylmethyl) | (acrylate with neopentyl-type) |
|---|---|---|---|---|
| No. | Y-74 | Y-75 | Y-76 | Y-77 |
| Molecular weight of repeating unit | 142.2 | 184.28 | 128.17 | 142.2 |
| Number of CH₃ partial structure of the side chain | 3 | 5 | 3 | 1 |
| Content of side chain CH₃ partial structure (%) | 31.6 | 40.7 | 35.1 | 10.5 |

| Structure of repeating unit | (acrylate side chain) | (acrylate side chain) | (acrylate side chain) |
|---|---|---|---|
| No. | Y-78 | Y-79 | Y-80 |
| Molecular weight of repeating unit | 254.41 | 236.35 | 327.44 |

TABLE 3-continued

| | | | |
|---|---|---|---|
| Number of CH₃ partial structure of the side chain | 4 | 3 | 2 |
| Content of side chain CH₃ partial structure (%) | 23.6 | 19.0 | 9.2 |
| Structure of repeating unit | | | |

The content of the repeating unit having at least one $CH_3$ partial structure is preferably 1 to 97 mol %, more preferably 5 to 95 mol %, and still more preferably 10 to 90 mol %, based on all the repeating units in the resin (D).

The resin (D) may contain a repeating unit having a $CF_3$ partial structure so long as the advantage of the invention is not impaired.

The specific examples of the repeating units having a $CF_3$ partial structure are shown below, but the invention is not restricted thereto.

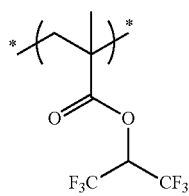

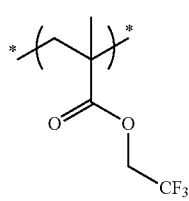

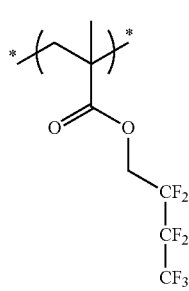

-continued

When the resin (D) contains a repeating unit having a $CF_3$ partial structure, the content thereof is preferably 10 mol % or less, more preferably 8 mol % or less, and still more preferably 5 mol % or less, based on all the repeating units in the resin (D). Ideally, the resin (D) does not contain a $CF_3$ partial structure.

The resin (D) may contain a repeating unit having an acid group.

The specific examples of the repeating units having an acid group are shown below, but the invention is not restricted thereto.

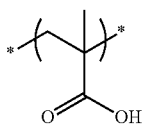

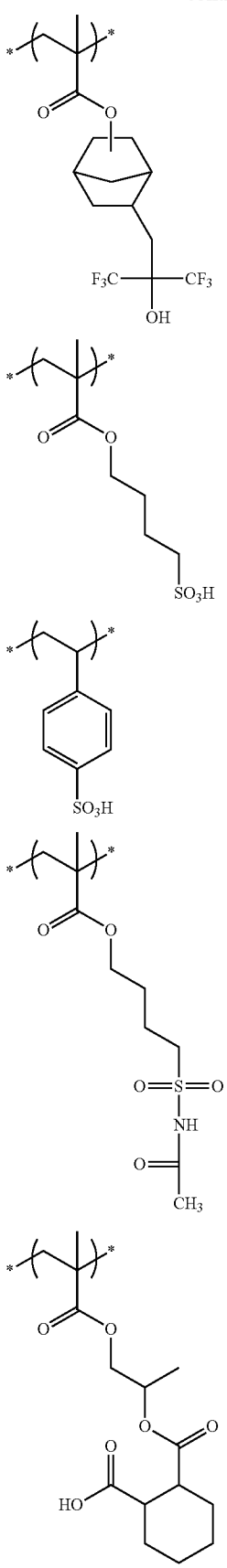

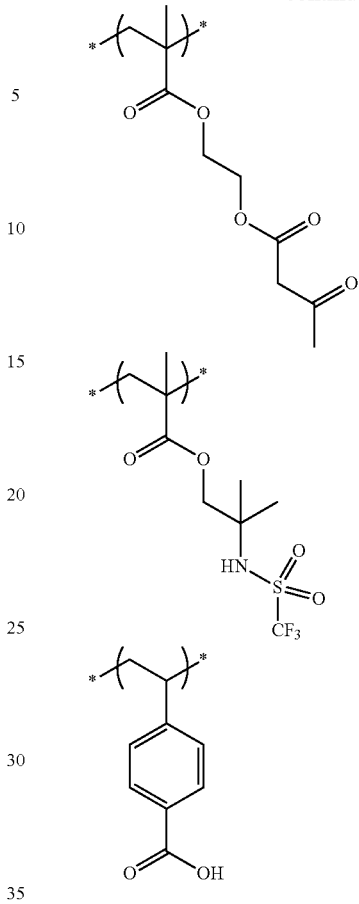

The content of the repeating unit having an acid group is preferably 20 mol % or less, more preferably 15 mol % or less, still more preferably 10 mol % or less, and especially preferably 1 mol % to 5 mol %, based on all the repeating units in the resin (D).

The content of a repeating unit having an acid-decomposable group in the resin (D) is preferably 10 mol % or less based on all the repeating units in the resin (D), more preferably 5 mol % or less, still more preferably 3 mol % or less, and ideally 0 mol %, that is, especially preferably the resin (D) does not contain a repeating unit having an acid-decomposable group.

The content of a repeating unit having a group capable of decomposing by the action of an alkali developer (for example, a group having a lactone structure having a cyano group as the substituent, or the like) in the resin (D) is preferably 10 mol % or less based on all the repeating units in the resin (D), more preferably 5 mol % or less, still more preferably 3 mol % or less, and ideally 0 mol %, that is, especially preferably the resin (D) does not contain a repeating unit having a group capable of decomposing by the action of an alkali developer.

The weight average molecular weight of the resin (D) is preferably in the range of 15,000 to 100,000, more preferably in the range of 15,000 to 70,000, and especially preferably in the range of 15,000 to 40,000. In particular, by bringing the weight average molecular weight into the range of 15,000 to 40,000, reductions of bridge defect and particle generation are liable to be bettered in fine pattern formation, especially in fine pattern formation by immersion exposure.

The mass average molecular weight of a resin shows the value in terms of polystyrene measured with the apparatus TOSOH HLC-8120GPC, TOSOH TSK guard column MP (XL) 6.0 mm (ID)×4.0 cm (L), column: TOSOH TSK gel Multipore HXL-M 7.8 mm (ID)×30.0 cm (L), connecting three pieces, carrier: tetrahydrofuran (THF) or N-methyl-2-pyrrolidone (NMP), RI detection.

When the mass average molecular weight is too small, the hydrophobic property of the resin (D) becomes insufficient and the contact angle characteristic to water as the immersion liquid is liable to be damaged.

The polydispersity (Mw/Mn) is preferably 1.00 to 5.00, more preferably 1.03 to 3.50, and still more preferably 1.05 to 2.50. The smaller the molecular weight, the more excellent are the resolution and resist profile.

As the resin (D), commercially available products can be used, or can be synthesized by conventional synthesizing method (e.g., radical polymerization). More specifically, the resin (D) can be synthesized according to the synthesizing method described above in the resin (A).

One kind of the resin (D) may be used alone, or two or more kinds may be used in combination. The content of the resin (D) preferably 0.1 mass % to 10 mass %, more preferably 0.1 mass % to 9 mass %, still more preferably 0.1 mass % to 7 mass %, and especially preferably 0.1 mass % to 5 mass %, based on the total solid content of the actinic ray-sensitive or radiation-sensitive resin composition according to the invention.

[4] Hydrophobic Resin (E) for Use in Combination Having at Least Either a Fluorine Atom or a Silicon Atom and Different from the Resin (A) and the Resin (D)

The actinic ray-sensitive or radiation-sensitive resin composition according to the invention may contain, especially when the composition is applied to immersion exposure, a hydrophobic resin having at least either a fluorine atom or a silicon atom and different from the resin (A) and the resin (D) (hereinafter referred to as "hydrophobic resin (E) for use in combination" or also referred to as merely "resin (E)"), by which the hydrophobic resin (E) for use in combination localizes on the surface layer of the film, and in the case where water is used as the immersion medium, the static/dynamic contact angle of the resist film surface to water is improved and following ability after the immersion liquid can be heightened.

As described above, the hydrophobic resin (E) for use in combination is preferably designed so as to be localized at the interface, but different from a surfactant, and it is not necessarily for the resin (E) to have a hydrophilic group in the molecule, and is not necessary to contribute to homogeneously mixing of polar/non-polar materials.

The hydrophobic resin (E) for use in combination may contain any of repeating units described in the item of the resin (D) other than the repeating unit represented by formula (1).

The hydrophobic resin (E) for use in combination contains a fluorine atom and/or a silicon atom. The fluorine atom and/or silicon atom in the hydrophobic resin (E) for use in combination may be contained in the main chain or side chain of the resin.

In the case where the hydrophobic resin (E) for use in combination contains a fluorine atom, the resin is preferably a resin having an alkyl group having a fluorine atom, a cycloalkyl group having a fluorine atom, or an aryl group having a fluorine atom as the partial structure.

The alkyl group (preferably having 1 to 10 carbon atoms, and more preferably having 1 to 4 carbon atoms) having a fluorine atom is a linear or branched alkyl group in which at least one hydrogen atom is substituted with a fluorine atom, further, the alkyl group may further have a substituent other than the fluorine atom.

The cycloalkyl group having a fluorine atom is a monocyclic or polycyclic cycloalkyl group in which at least one hydrogen atom is substituted with a fluorine atom, and the cycloalkyl group may further have a substituent other than the fluorine atom.

As the aryl group having a fluorine atom is an aryl group, such as a phenyl group or a naphthyl group, in which at least one hydrogen atom is substituted with a fluorine atom, and the aryl group may further have a substituent other than the fluorine atom.

The alkyl group having a fluorine atom, the cycloalkyl group having a fluorine atom, and the aryl group having a fluorine atom are preferably represented by the following formula (F2), (F3) or (F4), but the invention is not restricted thereto.

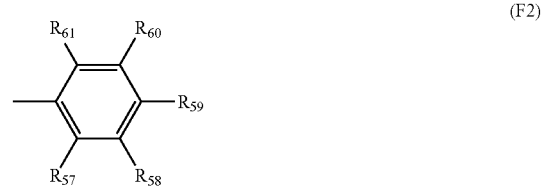

(F2)

(F3)

(F4)

In formulae (F2) to (F4), each of $R_{57}$ to $R_{68}$ independently represents a hydrogen atom, a fluorine atom, or an alkyl group (linear or branched), provided that at least one of $R_{57}$ to $R_{61}$, at least one of $R_{62}$ to $R_{64}$, and at least one of $R_{65}$ to $R_{68}$ each independently represents a fluorine atom or an alkyl group (preferably having 1 to 4 carbon atoms) in which at least one hydrogen atom is substituted with a fluorine atom.

All of $R_{57}$ to $R_{61}$ and $R_{65}$ to $R_{67}$ preferably represent a fluorine atom. $R_{62}$, $R_{63}$ and $R_{68}$ preferably represent an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be bonded to each other to form a ring.

The specific examples of the groups represented by formula (F2) include, for example, a p-fluorophenyl group, a pentafluorophenyl group, or a 3,5-di(trifluoro-methyl)phenyl group.

The specific examples of the groups represented by formula (F3) include, for example, a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these groups, a hexafluoroisopropyl group, a heptafluoroisopropyl group, a hexafluoro (2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

The specific examples of the groups represented by formula (F4) include, for example, —C(CF$_3$)$_2$OH, —C(C$_2$F$_5$)$_2$OH, —C(CF$_3$)(CH$_3$)OH and —CH(CF$_3$)OH, and —C(CF$_3$)$_2$OH is preferred.

The partial structure containing a fluorine atom may be directly bonded to the main chain, or may be bonded to the main chain through a group selected from the group consisting of an alkylene group, a phenylene group, an ether bond, a thioether bond, a carbonyl group, an ester bond, an amido bond, a urethane bond, and a ureylene bond, or a group of combining two or more of these groups.

The specific examples of the repeating units having a fluorine atom are shown below, but the invention is not restricted thereto.

In the specific examples, $X_1$ represents a hydrogen atom, —CH$_3$, —F or —CF$_3$. $X_2$ represents —F or —CF$_3$.

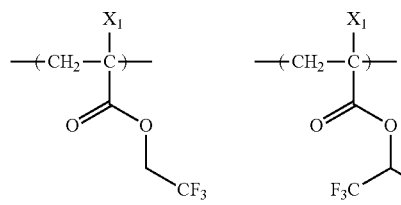
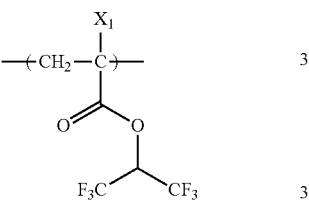
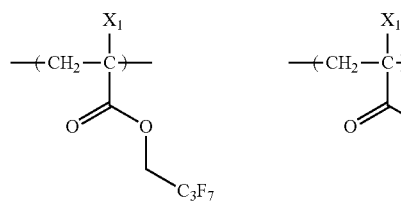
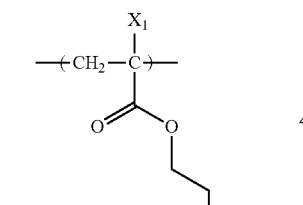
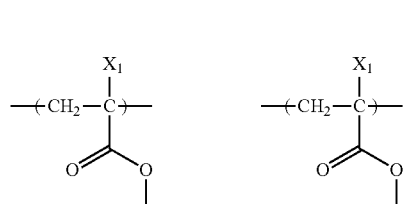
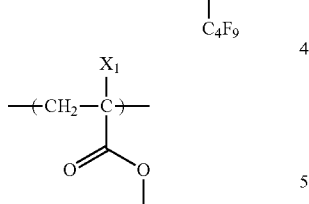
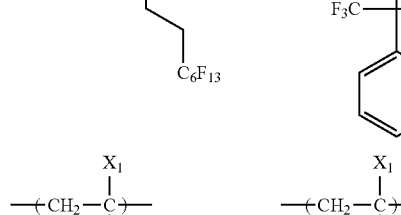
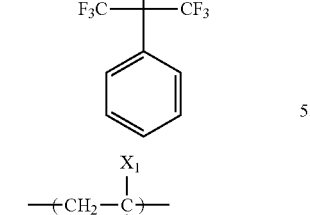

-continued

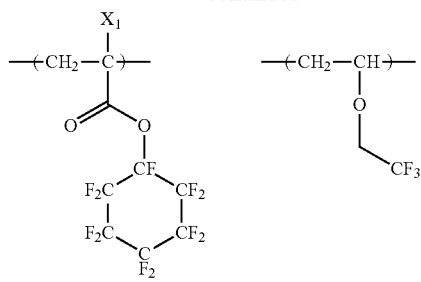
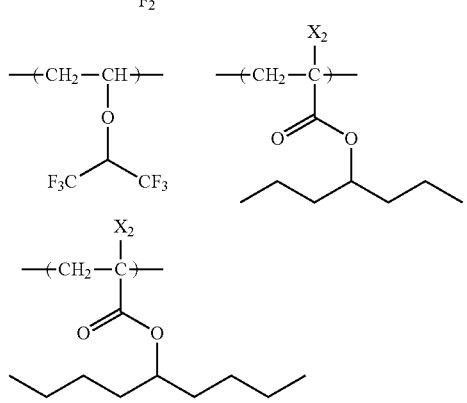
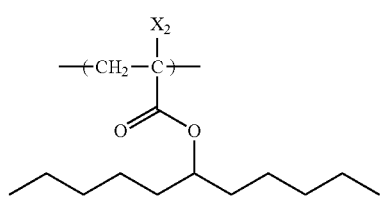
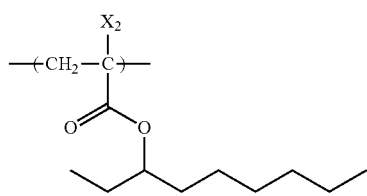
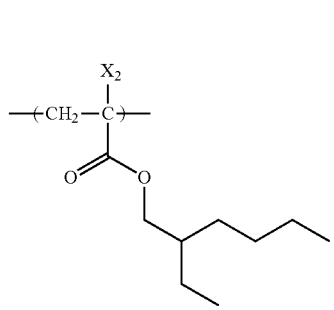
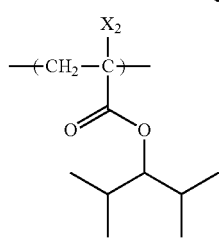
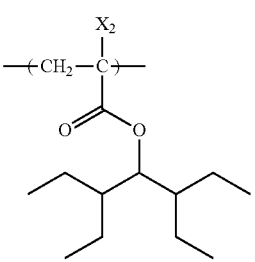

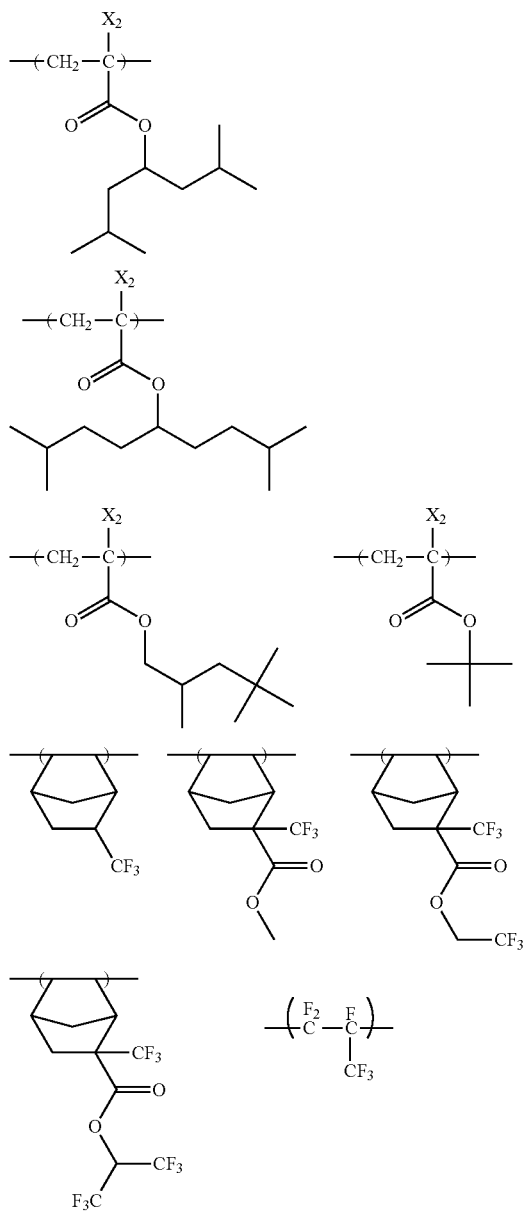

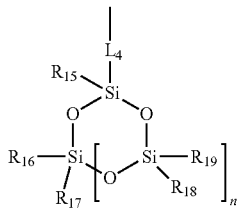

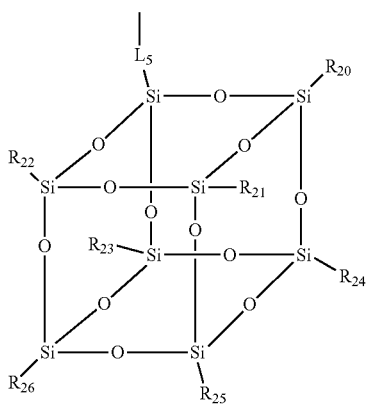

The hydrophobic resin (E) for use in combination may contain a silicon atom. As the partial structure having a silicon atom, a resin having an alkylsilyl structure (preferably a trialkylsilyl group), or a resin having a cyclic siloxane structure is preferred.

As the alkylsilyl structure or cyclic siloxane structure, specifically the group represented by any of the following formulae (CS-1) to (CS-3) can be exemplified.

(CS-1)

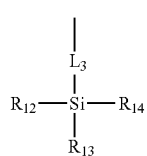

(CS-2)

(CS-3)

In formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a divalent linking group. The examples of the divalent linking groups include a single group or combinations of two or more groups (preferably having total carbon atoms of 12 or less) selected from the group consisting of an alkylene group, a phenylene group, an ether bond, a thioether bond, a carbonyl group, an ester bond, an amido bond, a urethane bond, and a urea bond.

n represents an integer of 1 to 5, and preferably an integer of 2 to 4.

The specific examples of the repeating units having the group represented by any of formulae (CS-1) to (CS-3) are shown below, but the invention is not restricted thereto. In the specific examples, $X_1$ represents a hydrogen atom, —$CH_3$, —F or —$CF_3$.

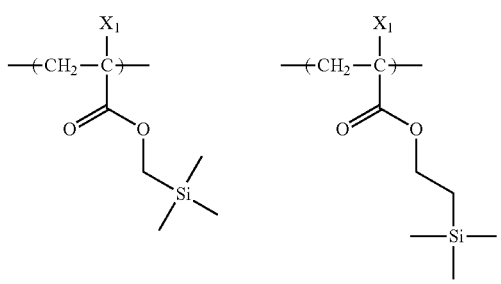

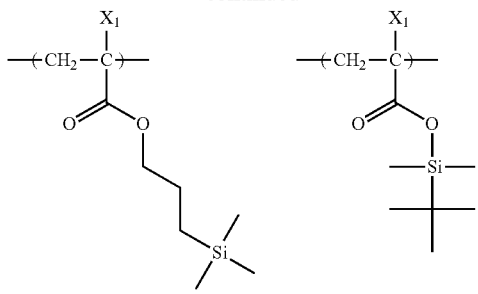
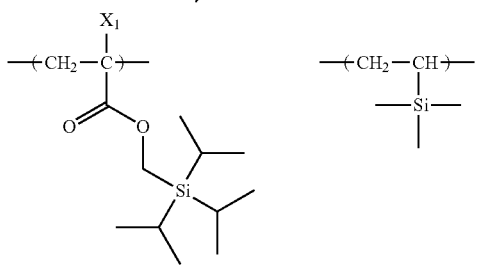
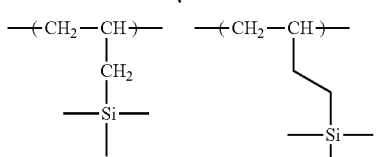
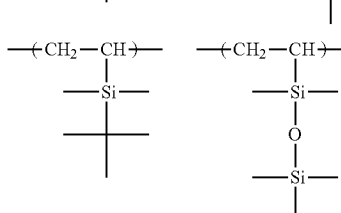
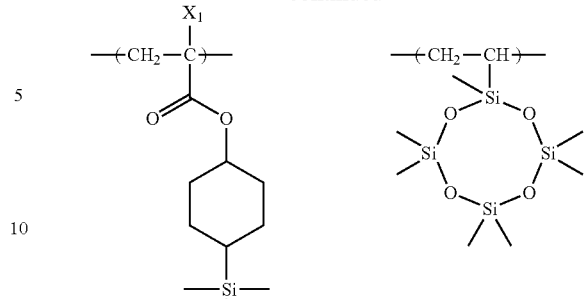
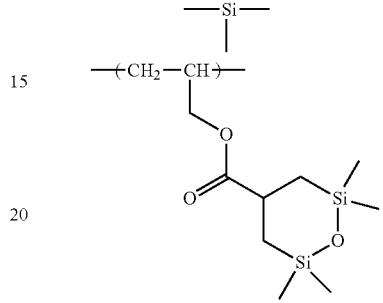
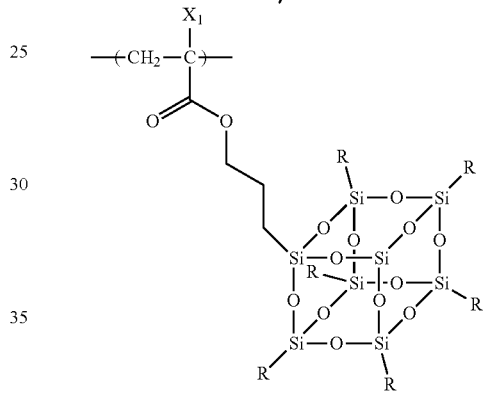

R = CH₃, C₂H₅, C₃H₇, C₄H₉

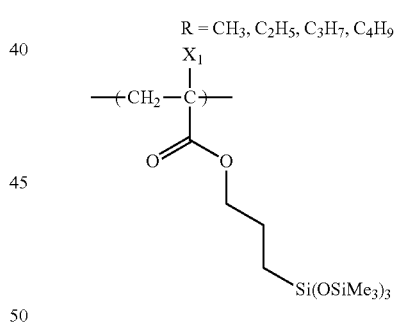
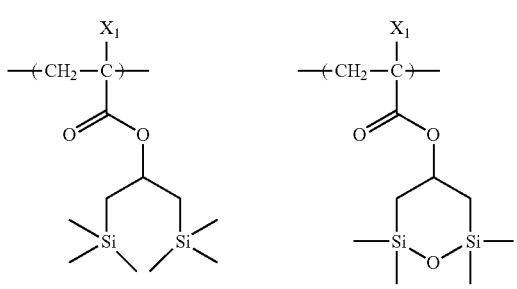
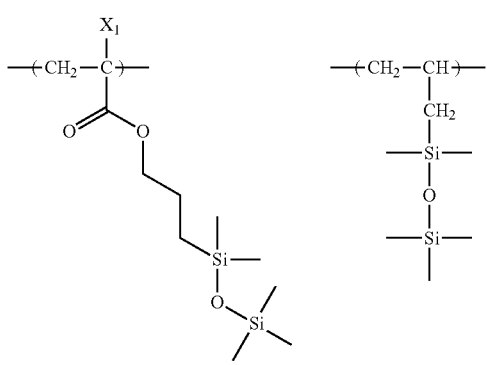

Further, the hydrophobic resin (E) for use in combination may have at least one group selected from the group consisting of the following (x), (y) and (z).

(x) an acid group,
(y) a group having a lactone structure, an acid anhydride group, or an acid imide group, and
(z) a group capable of decomposing by the action of an acid.

The examples of the acid groups (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred acid groups include a fluorinated alcohol group (preferably hexafluoroisopropanol), a sulfonimide group and a bis(alkylcarbonyl)methylene group.

As the repeating units having (x) an acid group, for example, the same repeating units with the repeating units having an acid group as described in the resin (D) above are exemplified.

The content of the repeating unit having an acid group (x) is preferably 1 mol % to 50 mol %, more preferably 3 mol % to 35 mol %, and still more preferably 5 mol % to 20 mol %, based on all the repeating units in the hydrophobic resin (E) for use in combination.

As (y) the group having a lactone structure, an acid anhydride group, or an acid imide group, a group having a lactone structure is especially preferred.

The repeating unit containing any of these groups is, for example, a repeating unit in which the group is directly bonded to the main chain of the resin, such as a repeating unit by an acrylic ester or methacrylic ester. This repeating unit may be a repeating unit in which the group is bonded to the main chain of the resin through a linking group. Alternatively, the repeating unit may be a repeating unit in which the group is introduced into the terminal of the resin by using a polymerization initiator or a chain transfer agent having the group at the time of polymerization.

As the examples of the repeating units having a group having a lactone structure, for example, the same repeating units having a lactone structure with the repeating units having a lactone structure as described in the acid-decomposable resin (A) above are exemplified.

The content of the repeating unit having a group having a lactone structure, an acid anhydride group, or an acid imide group is preferably 1 mol % to 100 mol %, more preferably 3 mol % to 98 mol %, and still more preferably 5 mol % to 95 mol %, based on all the repeating units in the hydrophobic resin (E) for use in combination As the repeating units having (z) a group capable of decomposing by the action of an acid in the hydrophobic resin (E) for use in combination, the same repeating units with the repeating units having an acid-decomposable group as described in the resin (A) above are exemplified. The repeating unit having (z) a group capable of decomposing by the action of an acid may have at least either a fluorine atom or a silicon atom. The content of the repeating units having (z) a group capable of decomposing by the action of an acid in the hydrophobic resin (E) is preferably 1 mol % to 80 mol %, more preferably 10 mol % to 80 mol %, and still more preferably 20 mol % to 60 mol %, based on all the repeating units in the resin (E).

When the hydrophobic resin (E) for use in combination has a fluorine atom, the content of the fluorine atom is preferably 5 mol % to 80 mol %, and more preferably 10 mol % to 80 mol %, based on the weight average molecular weight of the hydrophobic resin (E) for use in combination. Further, the content of the repeating unit containing a fluorine atom is preferably 10 mol % to 100 mol %, and more preferably 30 mol % to 100 mol %, in all the repeating units contained in the hydrophobic resin (E) for use in combination.

When the hydrophobic resin (E) for use in combination has a silicon atom, the content of the silicon atom is preferably 2 mol % to 50 mol %, and more preferably 2 mol % to 30 mol %, based on the weight average molecular weight of the hydrophobic resin (E) for use in combination. Further, the content of the repeating unit containing a silicon atom is preferably 10 mol % to 100 mol %, and more preferably 20 mol % to 100 mol %, in all the repeating units contained in the hydrophobic resin (E) for use in combination.

The weight average molecular weight of the hydrophobic resin (E) for use in combination is preferably 1,000 to 100,000, more preferably 1,000 to 50,000, and still more preferably 2,000 to 15,000, in terms of standard polystyrene.

The hydrophobic resin (E) for use in combination may be used by one kind alone, or two or more kinds may be used in combination.

The content of the hydrophobic resin (E) for use in combination in the composition is preferably 0.01 mass % to 10 mass %, more preferably 0.05 mass % to 8 mass %, and still more preferably 0.1 mass % to 5 mass %, based on the total solid content in the composition In the hydrophobic resin (E) for use in combination, similarly to the resin (A), it is of course preferred that the content of impurities such as metals is small, but the content of residual monomers and oligomer components is also preferably from 0.01 mass % to 5 mass %, more preferably 0.01 mass % to 3 mass %, and still more preferably 0.05 mass % to 1 mass %. Within this range, an actinic ray-sensitive or radiation-sensitive resin composition free from in-liquid foreign materials and change of sensitivity with aging or the like can be obtained. Further, from resolution, resist profile, the side wall of resist pattern, roughness and the like, the molecular weight distribution (Mw/Mn, also referred to as "polydispersity") is preferably in the range of 1 to 5, more preferably 1 to 3, and still more preferably in the range of 1 to 2.

As the hydrophobic resin (E) for use in combination, various commercially available products can be used, or the resin can be synthesized by conventional synthesizing method (e.g., radical polymerization). The examples of the general synthesizing methods include a batch polymerization method of dissolving monomer species and an initiator in a solvent and heating the solution to thereby effect the polymerization, and a dropping polymerization method of dropwise adding a solution containing monomer species and an initiator to a heated solvent over 1 to 10 hours. The dropping polymerization method is preferably used.

The reaction solvent, the polymerization initiator, the reaction conditions (e.g., temperature and concentration) and the purification method after reaction are the same with those described in the resin (A), but in the synthesis of the hydrophobic resin (E) for use in combination, the concentration at the reaction is preferably 30 mass % to 50 mass %.

As the specific examples of the hydrophobic resin (E) for use in combination, of the compounds described in JP-A-2011-197587, paragraphs [0314] to [0320], (HR-1) to (HR-90), the resins not corresponding to the resin (D) are exemplified, but the invention is not restricted thereto.

[5-1] (N) Basic Compound or Ammonium Salt Compound Capable of Decreasing the Basicity Upon Irradiation with an Actinic Ray or Radiation It is preferred that the actinic ray-sensitive or radiation-sensitive resin composition in the invention contains a basic compound or ammonium salt compound capable of decreasing the basicity upon irradiation with an actinic ray or radiation (hereinafter also referred to as "compound (N)").

The compound (N) is preferably a compound having a basic functional group or an ammonium salt group and a group capable of generating an acidic functional group upon irradiation with an actinic ray or radiation (N-1). That is, the compound (N) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

Specifically, a compound obtained by leaving a proton from an acidic functional group of a compound having a basic functional group or an ammonium group and an acidic functional group to form an anion, and the anion and an onium cation form a salt is exemplified.

As the basic functional group, for example, atomic groups containing a crown ether structure, a primary to tertiary amine structure, or a nitrogen-containing heterocyclic structure (e.g., pyridine, imidazole, pyrazine and the like) are exemplified. The preferred structures of the ammonium group includes, for example, atomic groups containing a primary to tertiary ammonium structure, a pyridinium structure, an imidazolinium structure, a pyrazinium structure and the like. The basic functional group is preferably a functional group having a nitrogen atom, and more preferably a structure having a primary to tertiary amino group or a nitrogen-containing heterocyclic structure. In such a structure, from the standpoint of enhancing the basicity, all the atoms contiguous to the nitrogen atom contained in the structure are preferably a carbon atom or a hydrogen atom. Also, in view of enhancing the basicity, an electron-withdrawing functional group (a carbonyl group, a sulfonyl group, a cyano group, a halogen atom and the like) is preferably not directly bonded to the nitrogen atom.

As the acidic functional group, a carboxylic acid group, a sulfonic acid group or a group having a structure of —X—NH—X— (X=CO or $SO_2$).

As the onium cations, a sulfonium cation and an iodonium cation can be exemplified. More specifically, those described as the cation moieties of the acid generator (B) in formulae (ZI) and (ZII) can be exemplified.

More specifically, the compound which is generated by the decomposition of the compound (N) or (N-1) upon irradiation with an actinic ray or radiation and whose basicity is decreased includes compounds represented by the following formulae (PA-I), (PA-II) and (PA-III), and from the standpoint that effects can be attained in a high level in terms of all of LWR, local pattern dimension uniformity and DOF, compounds represented by formulae (PA-II) and (PA-III) are preferred.

The compound represented by (PA-I) is described below.

     (PA-I)

In formula (PA-I), $A_1$ represents a single bond or a divalent linking group.

Q represents —$SO_3H$ or —$CO_2H$. Q corresponds to an acidic functional group generated upon irradiation with an actinic ray or radiation.

X represents —$SO_2$— or —CO—.

n represents 0 or 1.

B represents a single bond, an oxygen atom, or —N(Rx)-.

Rx represents a hydrogen atom or a monovalent organic group.

R represents a monovalent organic group having a basic functional group, or a monovalent organic group having an ammonium group.

The divalent linking group of A1 is preferably a divalent organic group having 2 to 12 carbon atoms, and the examples include an alkylene group and a phenylene group. An alkylene group having at least one fluorine atom is preferred, and the carbon atom number is preferably 2 to 6, and more preferably 2 to 4. The alkylene chain may contain a linking group such as an oxygen atom or a sulfur atom. The alkylene group is preferably an alkylene group in which 30% to 100% by number of hydrogen atoms are substituted with a fluorine atom, more preferably an alkylene group in which the carbon atom bonded to Q site has a fluorine atom, still more preferably a perfluoroalkylene group, and still yet preferably a perfluoroethylene group, a perfluoropropylene group or a perfluorobutylene group.

The monovalent organic group of Rx is preferably a monovalent organic group having 4 to 30 carbon atoms, e.g., an alkyl group, a cycloalkyl group, an aryl group, an aralkyl group, and an alkenyl group are exemplified.

The alkyl group of Rx may have a substituent, and is preferably a linear or branched alkyl group having 1 to 20 carbon atoms, and the alkyl chain may contain an oxygen atom, a sulfur atom or a nitrogen atom.

Here, the alkyl group having a substituent includes especially a group where a cycloalkyl group is substituted on a linear or branched alkyl group (e.g., an adamantylmethyl group, an adamantylethyl group, a cyclohexylethyl group, a camphor residue).

The cycloalkyl of Rx may have a substituent, and is preferably a cycloalkyl group having 3 to 20 carbon atoms, and the ring may contain an oxygen atom.

The aryl group of Rx may have a substituent, and is preferably an aryl group having 6 to 14 carbon atoms.

The aralkyl group of Rx may have a substituent, and is preferably an aralkyl group having 7 to 20 carbon atoms.

The alkenyl group of Rx may have a substituent, and the examples include a group having a double bond at an arbitrary position of the alkyl group exemplified as Rx.

The preferred examples of the partial structure of the basic functional group include a crown ether structure, a primary to tertiary amine structure, and a nitrogen-containing heterocyclic structure (e.g., pyridine, imidazole, pyrazine).

The preferred examples of the partial structure of the ammonium group include a primary to tertiary ammonium structure, a pyridinium structure, an imidazolinium structure, and a pyrazinium structure.

The basic functional group is preferably a functional group having a nitrogen atom, and more preferably a structure having a primary to tertiary amino group or a nitrogen-containing heterocyclic group. In such a structure, from the standpoint of enhancing the basicity, all the atoms contiguous to the nitrogen atom contained in the structure are preferably a carbon atom or a halogen atom. Also, in view of enhancing the bacisity, an electron-withdrawing functional group (e.g., a carbonyl group, a sulfonyl group, a cyano group, a halogen atom) is preferably not directly bonded to the nitrogen atom.

The monovalent organic group in the monovalent organic group (group R) containing such a structure is preferably an organic group having 4 to 30 carbon atoms, and the examples thereof include an alkyl group, a cycloalkyl group, an aryl group, an aralkyl group, and an alkenyl group. Each of these groups may have a substituent.

The examples of the alkyl group, cycloalkyl group, aryl group, aralkyl group, and alkenyl group in the alkyl group, cycloalkyl group, aryl group, aralkyl group, and alkenyl group each containing a basic functional group or an ammonium group of R are the same with those of the alkyl group, cycloalkyl group, aryl group, aralkyl group, and alkenyl group exemplified as Rx.

The examples of the substituents which each of the above groups may have include a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminocycl group (preferably having 2 to 20 carbon atoms). The cyclic structure in the aryl group, cycloalkyl group and the like may further have an alkyl group (preferably having 1 to 20 carbon atoms) as the substituent. The aminoacyl group may further have one or two alkyl groups (preferably having 1 to 20 carbon atoms) as the substituent.

When B is —N(Rx)-, R and Rx are preferably combined to each other to form a ring. By forming a cyclic structure, the stability is improved and storage stability of the composition using this compound is also enhanced. The number of carbon atoms constituting the ring is preferably 4 to 20, and the ring may be monocyclic or polycyclic and may contain an oxygen atom, a sulfur atom or a nitrogen atom.

The examples of the monocyclic structure include a 4- to 8-membered ring containing a nitrogen atom. The examples of the polycyclic structure include a structure formed by combining two monocyclic structures or three or more monocyclic structures. The monocyclic structure and polycyclic structure may have a substituent, and preferred examples of the substituents include a halogen atom, a hydroxyl group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and an aminoacyl group (preferably having 2 to 20 carbon atoms). The cyclic structure in the aryl group, cycloalkyl group and the like may further have an alkyl group (preferably having 1 to 15 carbon atoms) as the substituent. The aminoacyl group may further have one or two alkyl groups (preferably having 1 to 15 carbon atoms).

Of the compounds represented by formula (PA-I), a compound in which the Q site is a sulfonic acid can be synthesized using a general sulfonamidation reaction. For example, the compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through a reaction with an amine compound.

The compound represented by formula (PA-II) is described below.

$$Q_1\text{-}X_1\text{—NH—}X_2\text{-}Q_2 \quad\quad\quad \text{(PA-II)}$$

In formula (PA-II), each of $Q_1$ and $Q_2$ independently represents a monovalent organic group, provided that either one of $Q_1$ and $Q_2$ has a basic functional group. $Q_1$ and $Q_2$ may be bonded to each other to form a ring, and the formed ring may have a basic functional group.

Each of $X_1$ and $X_2$ independently represents —CO— or —SO$_2$—.

—NH— corresponds to an acidic functional group generated upon irradiation with an actinic ray or radiation.

The monovalent organic group of $Q_1$ and $Q_2$ in formula (PA-II) is preferably a monovalent organic group having 1 to 40 carbon atoms, and the examples thereof include an alkyl group, a cycloalkyl group, an aryl group, an aralkyl group and an alkenyl group.

The alkyl group of $Q_1$ and $Q_2$ may have a substituent, and is preferably a linear or branched alkyl group having 1 to 30 carbon atoms, and the alkyl chain may contain an oxygen atom, a sulfur atom or a nitrogen atom.

The cycloalkyl of $Q_1$ and $Q_2$ may have a substituent, and is preferably a cycloalkyl group having 3 to 20 carbon atoms, and the ring may contain an oxygen atom or a nitrogen atom.

The aryl group of $Q_1$ and $Q_2$ may have a substituent, and is preferably an aryl group having 6 to 14 carbon atoms.

The aralkyl group of $Q_1$ and $Q_2$ may have a substituent, and is preferably an aralkyl group having 7 to 20 carbon atoms.

The alkenyl group of $Q_1$ and $Q_2$ may have a substituent, and the examples include a group having a double bond at an arbitrary position of the above alkyl group.

The examples of the substituents which each of the above groups may have include a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). The cyclic structure in the aryl group, cycloalkyl group and the like may further have an alkyl group (preferably having 1 to 10 carbon atoms) as the substituent. The aminoacyl group may further have one or two alkyl groups (preferably having 1 to 10 carbon atoms) as the substituent. The examples of the alkyl group having a substituent include a perfluoroalkyl group such as a perfluoromethyl group, a perfluoroethyl group, a perfluoropropyl group, and a perfluorobutyl group.

The preferred examples of the partial structure of the basic functional group contained in at least either $Q_1$ or $Q_2$ are the same with the basic functional groups described in the basic functional group contained in R of formula (PA-I).

The examples of the structure where $Q_1$ and $Q_2$ are combined to form a ring and the ring formed has a basic functional group include a structure in which an alkylene group, an oxy group, an imino group or the like is further bonded to the organic group of $Q_1$ or $Q_2$.

In formula (PA-II), at least either one of $X_1$ and $X_2$ is preferably

The compound represented by formula (PA-III) is described below.

$$Q_1\text{-}X_1\text{—NH—}X_2\text{-}A_2\text{-}(X_3)_m\text{—B-}Q_3 \quad\quad\quad \text{(PA-III)}$$

In formula (PA-III), each of $Q_1$ and $Q_3$ independently represents a monovalent organic group, provided that either one of $Q_1$ and $Q_3$ has a basic functional group. $Q_1$ and $Q_3$ may be bonded to each other to form a ring, and the formed ring may have a basic functional group.

Each of $X_1$, $X_2$ and $X_3$ independently represents —CO— or —SO$_2$—.

$A_2$ represents a divalent linking group.

B represents a single bond, an oxygen atom, or —N(Qx)-.

Qx represents a hydrogen atom or a monovalent organic group.

When B is —N(Qx)-, $Q_3$ and Qx may be bonded to each other to form a ring.

m represents 0 or 1.

—NH— corresponds to an acidic functional group generated upon irradiation with an actinic ray or radiation.

$Q_1$ has the same meaning with $Q_1$ in formula (PA-II).

As the organic group of $Q_3$, the same organic group of $Q_1$ and $Q_2$ in formula (PA-II) can be exemplified.

The examples of the structure where $Q_1$ and $Q_3$ are combined to form a ring and the ring formed has a basic functional group include a structure in which an alkylene group, an oxy group, an imino group or the like is further bonded to the organic group of $Q_1$ or $Q_3$.

The divalent linking group of $A_2$ is preferably a divalent linking group having 1 to 8 carbon atoms and having a fluorine atom, and the examples include an alkylene group having 1 to 8 carbon atoms and having a fluorine atom, and a phenylene group having a fluorine atom. An alkylene group having a fluorine atom is more preferred, and the number of carbon atoms is preferably 2 to 6, and more preferably 2 to 4. The alkylene chain may contain a linking group such as an oxygen atom and a sulfur atom. The alkylene group is preferably an alkylene group in which 30% to 100% by number of hydrogen atoms are substituted with a fluorine atom, more preferably a perfluoroalkylene group, especially preferably a perfluoroalkylene group having 2 to 4 carbon atoms.

The monovalent organic group of Qx is preferably a monovalent organic group having 4 to 30 carbon atoms, e.g., an alkyl group, a cycloalkyl group, an aryl group, an aralkyl group, and an alkenyl group are exemplified. The alkyl group, cycloalkyl group, aryl group, aralkyl group, and alkenyl group are the same as those defined as to Rx in formula (PA-I).

In formula (PA-III), $X_1$, $X_2$ and $X_3$ are preferably —$SO_2$—.

The compound (N) is preferably a sulfonium salt compound of the compound represented by formula (PA-I), (PA-II) or (PA-III) or an iodonium salt compound of the compound represented by formula (PA-I), (PA-II) or (PA-III), and more preferably a compound represented by the following formula (PA1) or (PA2).

In formula (PA1), each of $R'_{201}$, $R'_{202}$ and $R'_{203}$ independently represents an organic group, and specific examples thereof are the same as those for $R_{201}$, $R_{202}$ and $R_{203}$ of formula (ZI) in the component (B).

$X^-$ represents a sulfonate or carboxylate anion after elimination of a hydrogen atom in the —$SO_3H$ moiety or —COOH moiety of the compound represented by formula (PA-I), or an anion after elimination of a hydrogen atom from the —NH— moiety of the compound represented by formula (PA-II) or (PA-III).

In formula (PA2), each of $R'_{204}$ and $R'_{205}$ independently represents an aryl group, an alkyl group or a cycloalkyl group. Specific examples thereof are the same as those for $R_{204}$ and $R_{205}$ of formula (ZII) in the component (B).

$X^-$ represents a sulfonate or carboxylate anion after elimination of a hydrogen atom in the —$SO_3H$ moiety or —COOH moiety of the compound represented by formula (PA-I), or an anion after elimination of a hydrogen atom from the —NH— moiety of the compound represented by formula (PA-II) or (PA-III).

The compound (N) decomposes upon irradiation with an actinic ray or radiation to generate, for example, a compound represented by formula (PA-I), (PA-II) or (PA-HI).

The compound represented by formula (PA-I) is a compound having a sulfonic acid group or a carboxylic acid group together with a basic functional group or an ammonium group and thereby being reduced in or deprived of the basicity or changed from basic to acidic, relative to the compound (N).

The compound represented by formula (PA-II) or (PA-III) is a compound having an organic sulfonylimino group or an organic carbonylimino group together with a basic functional group and thereby being reduced in or deprived of the basicity or changed from basic to acidic, relative to the compound (N).

In the present invention, the expression "reduced in the basicity upon irradiation with an actinic ray or radiation" means that the acceptor property for a proton (an acid generated upon irradiation with an actinic ray or radiation) of the compound (N) is decreased by the irradiation with an actinic ray or radiation. The expression "reduced in the acceptor property" means that when an equilibrium reaction of producing a noncovalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

A compound (N) whose basicity decreases upon irradiation with an actinic ray or radiation is contained in the resist film, so that in the unexposed area, the acceptor property of the compound (N) is sufficiently brought out and an unintended reaction between an acid diffused from the exposed area or the like and the resin (A) can be suppressed, whereas in the exposed area, the acceptor property of the compound (N) decreases and the intended reaction of an acid with the resin (A) unfailingly occurs. It is presumed that by virtue of such an operation mechanism, a pattern excellent in terms of line width roughness (LWR), local pattern dimension uniformity, focus latitude (DOF) and pattern profile is obtained.

The basicity can be confirmed by measuring the pH, or a calculation value can be computed using a commercially available software.

Specific examples of the compound (N) capable of generating a compound represented by formula (PA-I) upon irradiation with an actinic ray or radiation are illustrated below, but the present invention is not limited thereto.

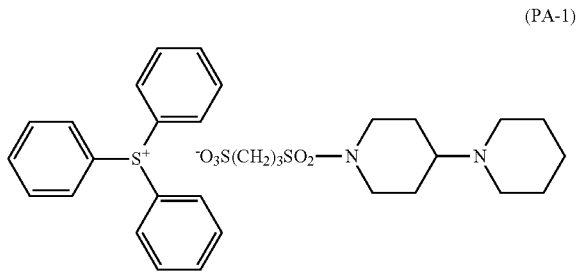

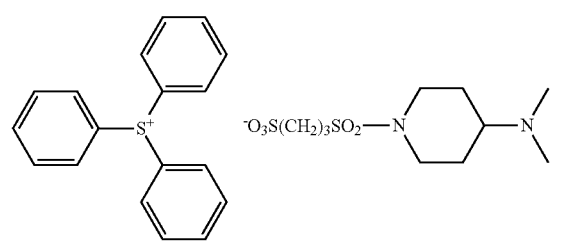

(PA-3)
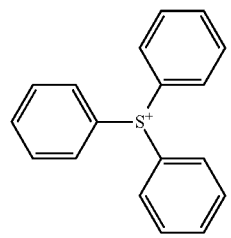
(PA-4)
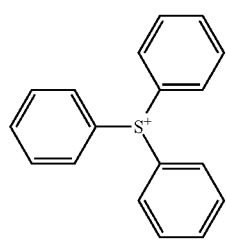
(PA-5)
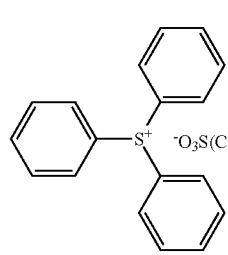
(PA-6)
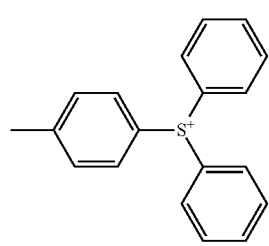
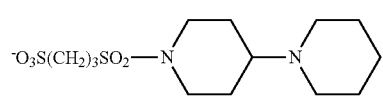
(PA-7)
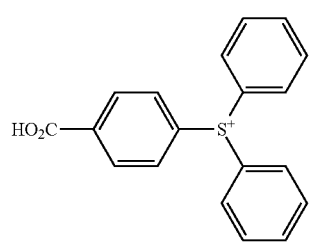
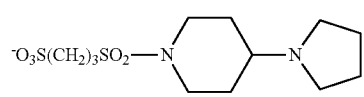
(PA-8)
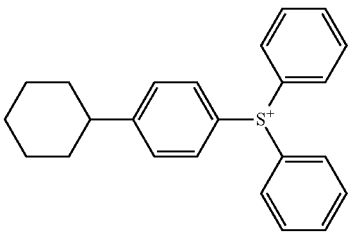
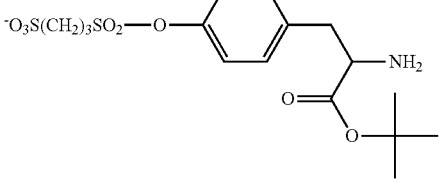
(PA-9)
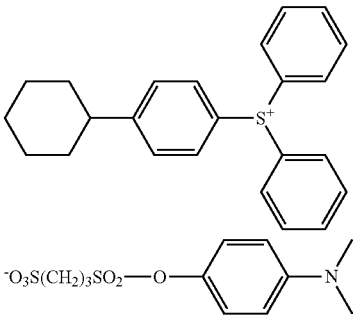
(PA-10)
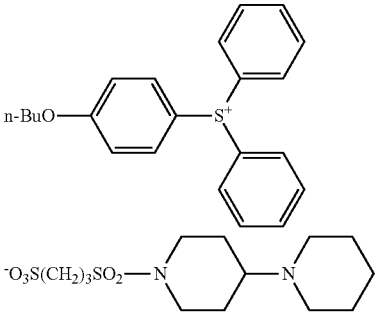
(PA-11)
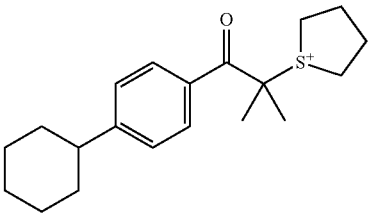
(PA-12)

(PA-13) 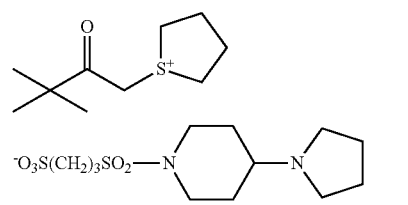
(PA-14) 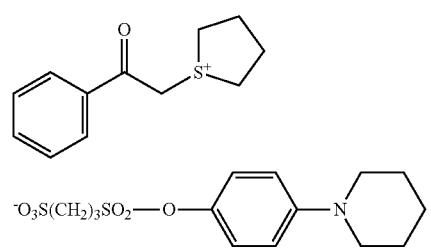
(PA-15) 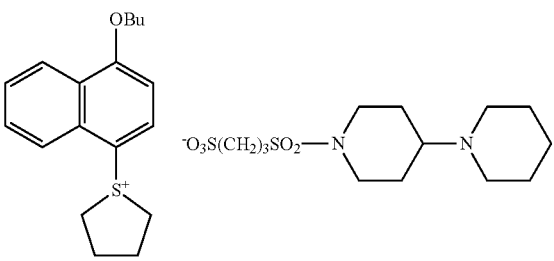
(PA-16) 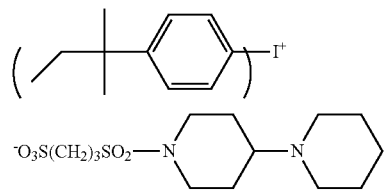
(PA-17) 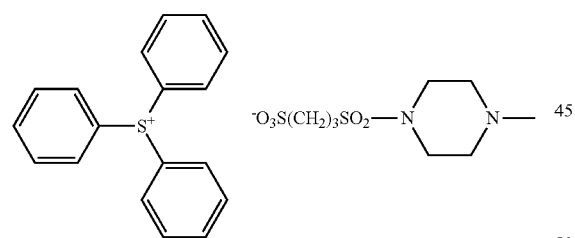
(PA-18) 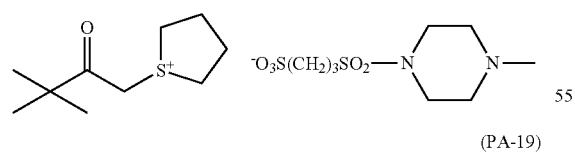
(PA-19) 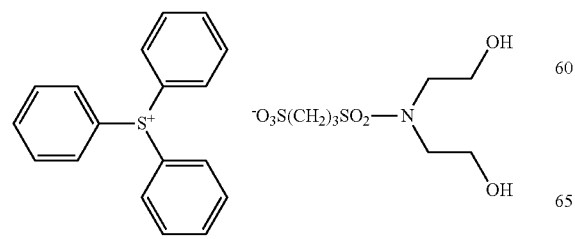
(PA-20) 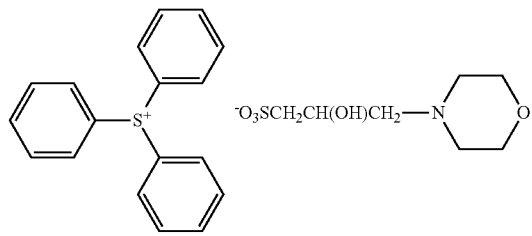
(PA-21) 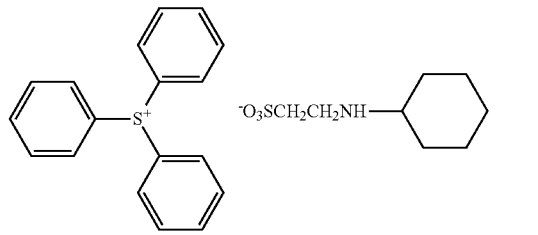
(PA-22) 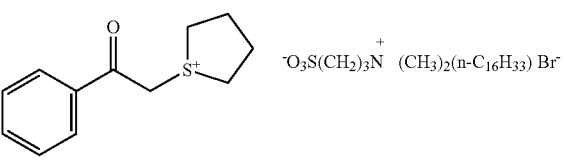
(PA-23) 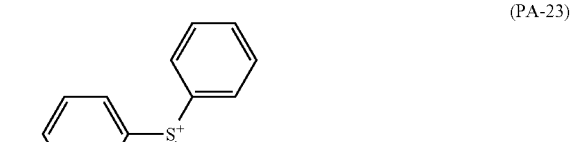
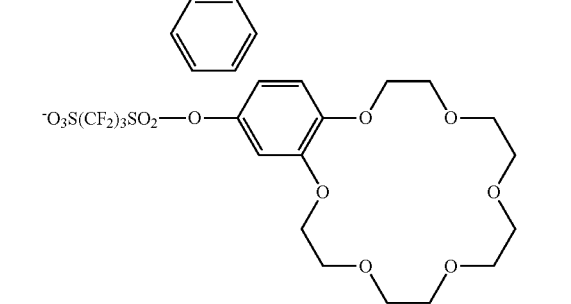
(PA-24) 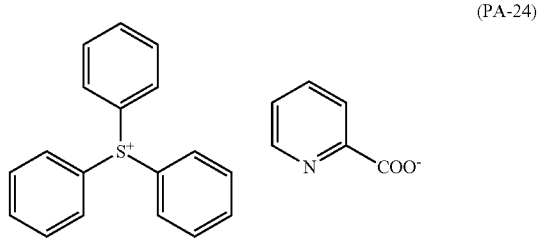
(PA-25) 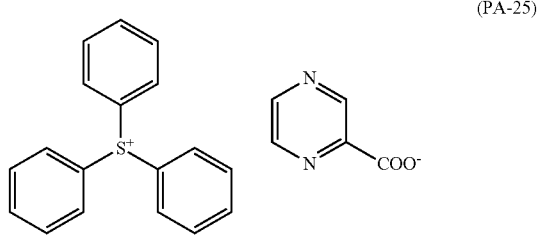

(PA-26)

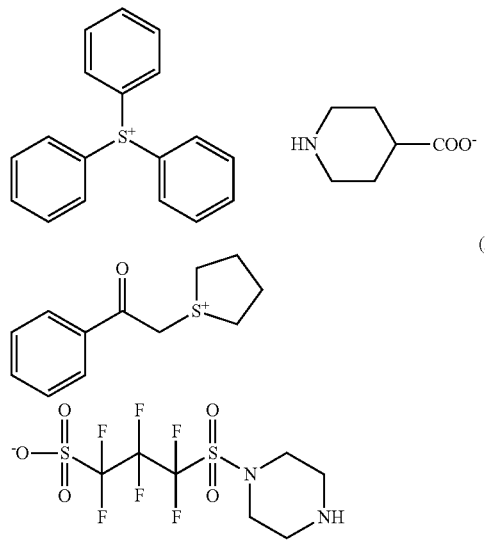

(PA-27)

(PA-30)

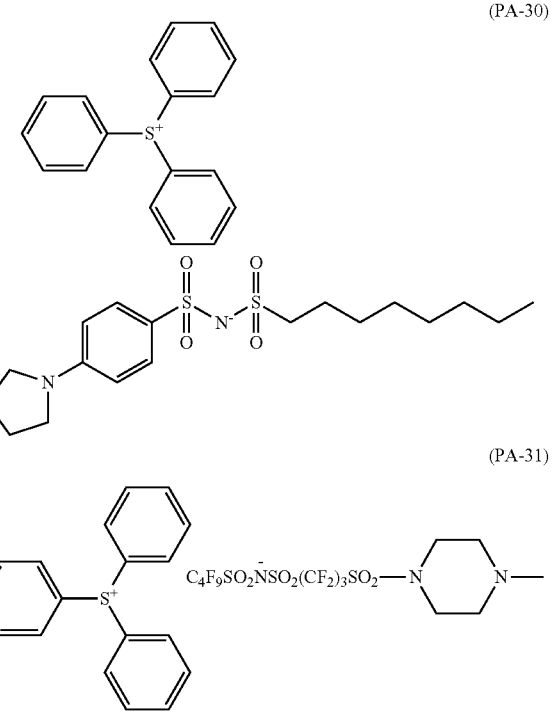

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may be also performed in accordance with the synthesis method described in JP-A-7-333851.

Specific examples of the compound (N) capable of generating a compound represented by formula (PA-II) or (PA-III) upon irradiation with an actinic ray or radiation are illustrated below, but the present invention is not limited thereto.

(PA-28)

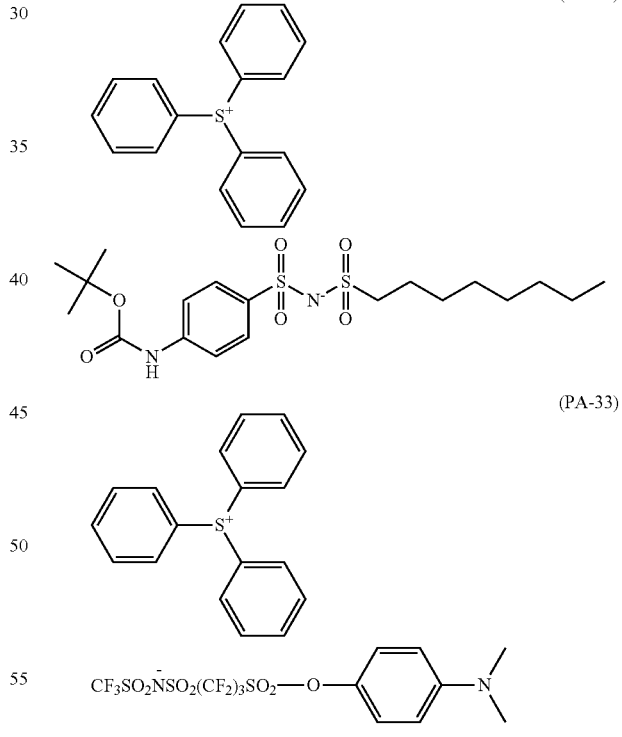

(PA-29)

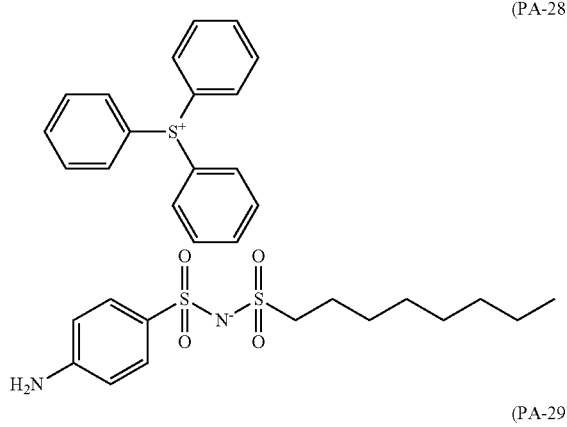

(PA-34)

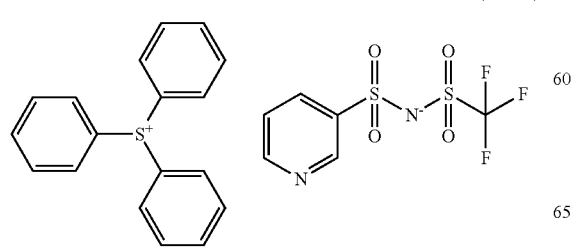

-continued (PA-35)

(PA-36)

(PA-37)

(PA-38)

(PA-39)

-continued (PA-40)

(PA-41)

(PA-42)

(PA-43)

(PA-44)
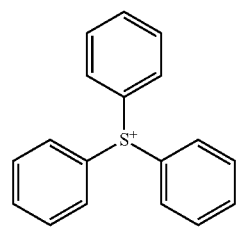
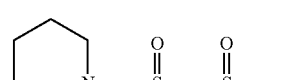
(PA-45)
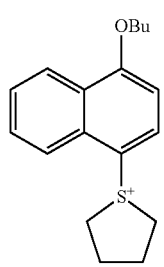
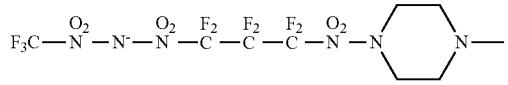
(PA-46)
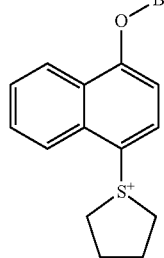
(PA-47)
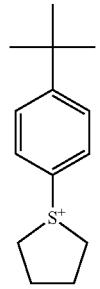
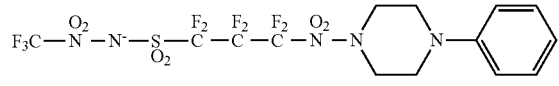
(PA-48)
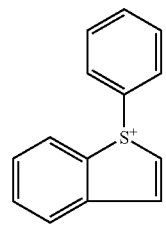
(PA-49)
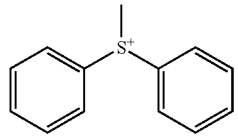
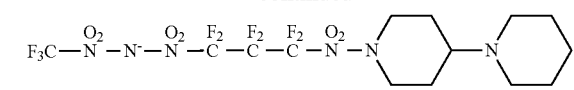
(PA-50)
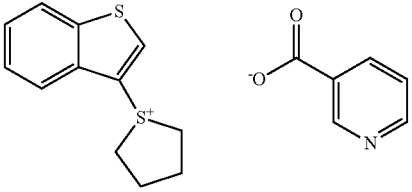
(PA-51)
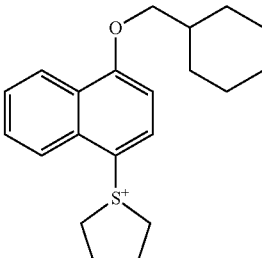
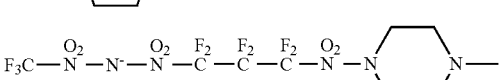
(PA-52)
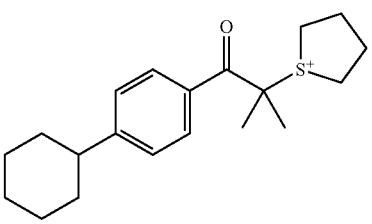
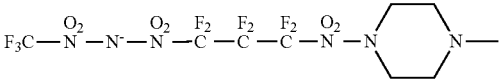
(PA-53)
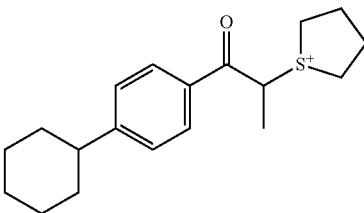
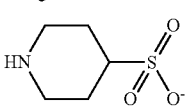
(PA-54)
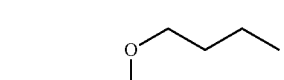
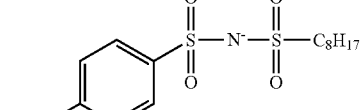

(PA-55)
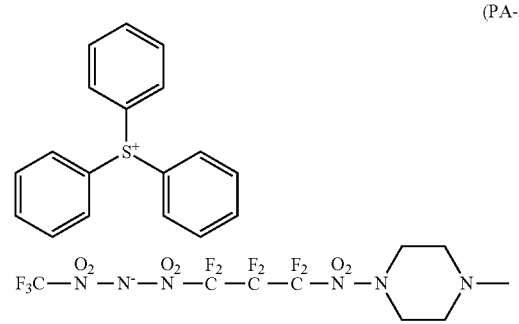
(PA-56)
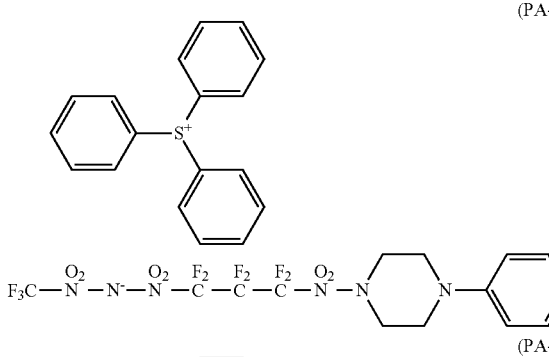
(PA-57)
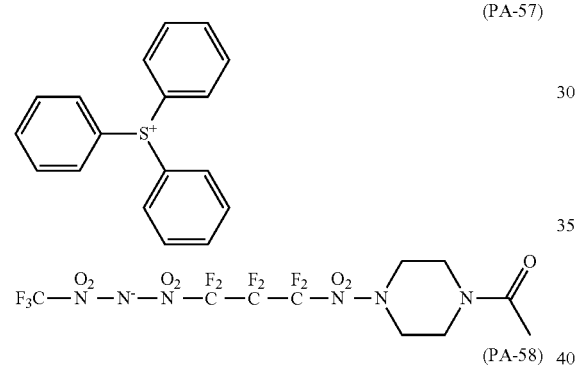
(PA-58)
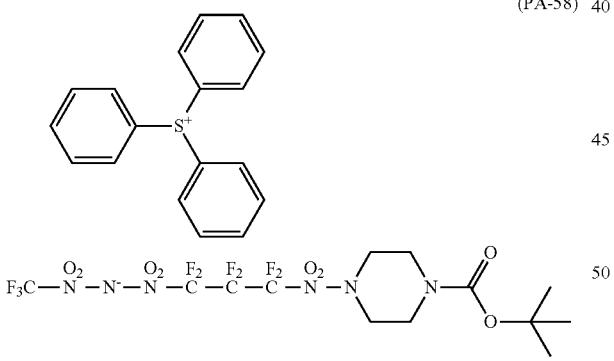
(PA-59)
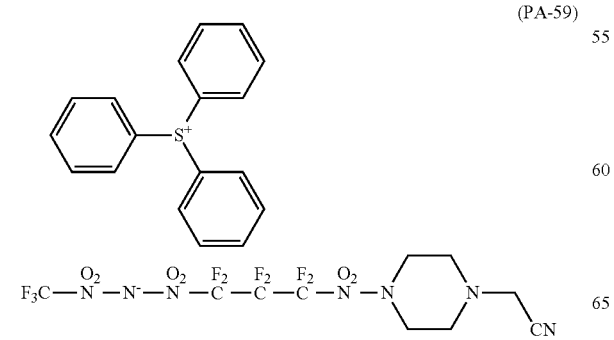
(PA-60)
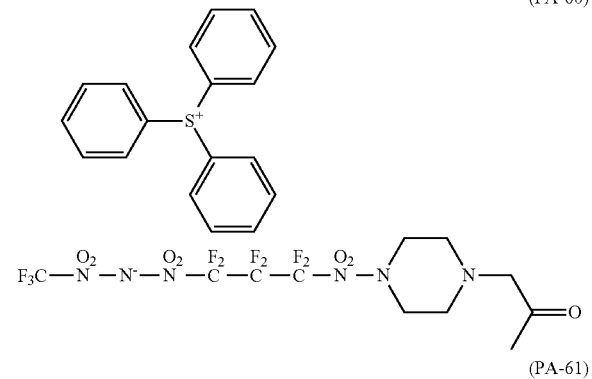
(PA-61)
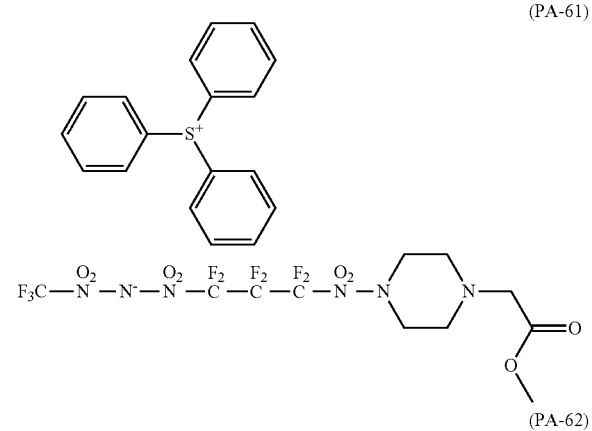
(PA-62)
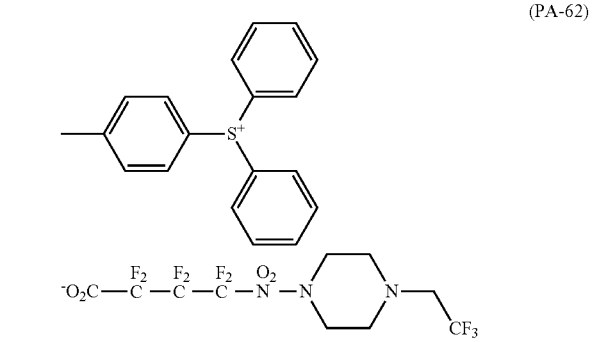
(PA-63)
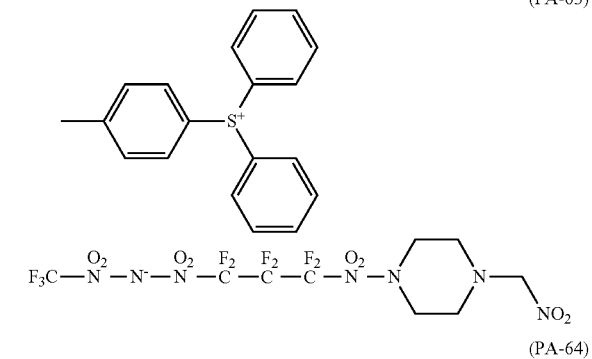
(PA-64)

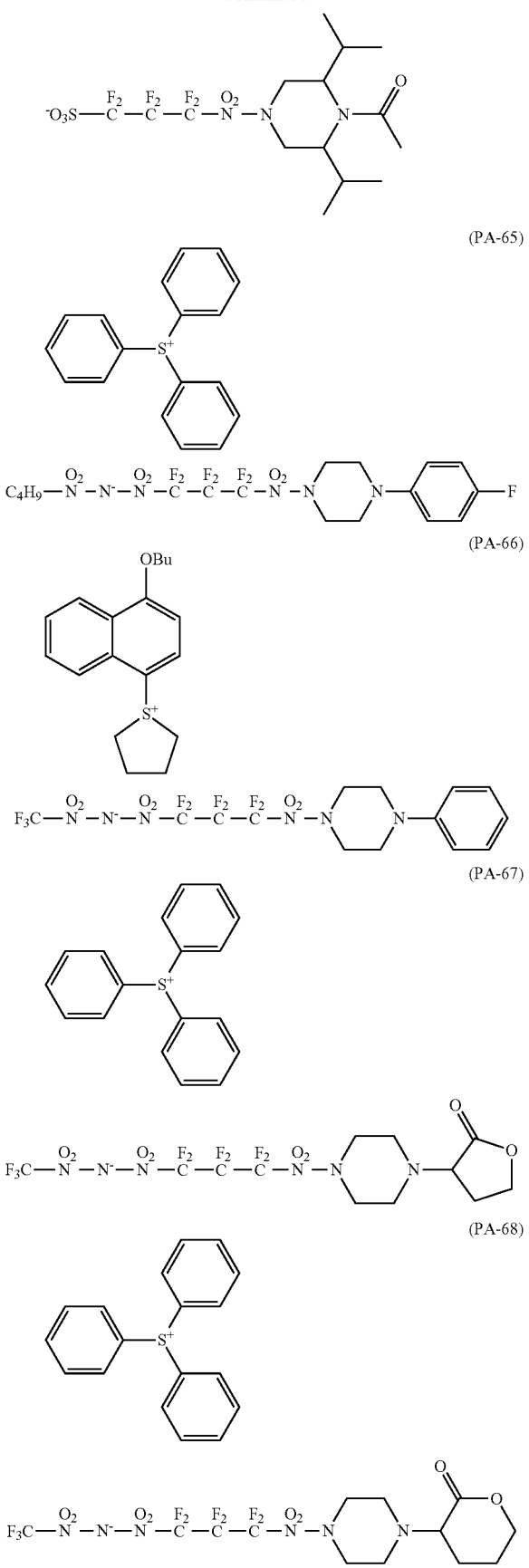

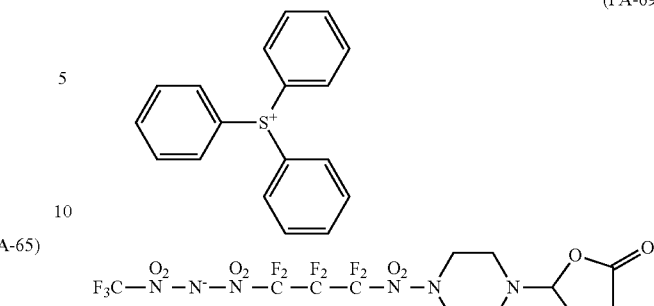

These compounds can be easily synthesized by using a general sulfonic acid esterification reaction or sulfonamidation reaction. For example, the compound may be obtained by a method of reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a structure represented by formula (PA-II) or (PA-III) can be synthesized by reacting an amine or alcohol with an anhydride (e.g., R'O$_2$C)$_2$, (R'SO$_2$)$_2$O) or an acid chloride compound (e.g., R'O$_2$CCl, R'SO$_2$Cl) under basic conditions (R' is, for example, a methyl group, an n-octyl group or a trifluoromethyl group). In particular, the synthesis may be performed in accordance with the synthesis examples and the like in JP-A-2006-30098.

Moreover, the basic compound capable of decreasing the basicity upon irradiation with an actinic ray or radiation may be an ionic compound composed of an onium cation and an acid anion of weak acid such as carboxylic acid.

The molecular weight of the compound (N) is preferably from 500 to 1,000.

The actinic ray-sensitive or radiation-sensitive resin composition of the present invention may or may not contain the compound (N), but in the case of containing the compound (N), the content thereof is preferably from 0.1 to 20 mass %, more preferably from 0.1 to 10 mass %, based on the solid content of the actinic ray-sensitive or radiation-sensitive resin composition.

[5-2] (N') Basic Compound

The actinic ray-sensitive or radiation-sensitive resin composition of the present invention may contain (N') a basic compound so as to reduce the change in performance with aging from exposure to heating.

Preferred basic compounds include a compound having a structure represented by the following formulae (A) to (E):

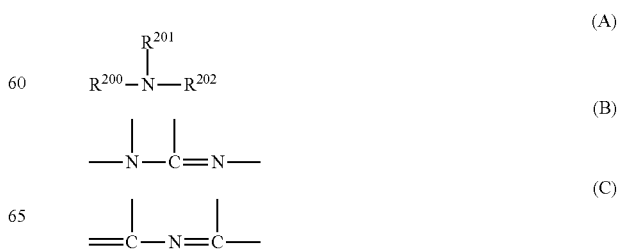

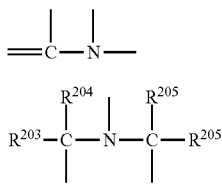

In formulae (A) and (E), $R^{200}$, $R^{201}$ and $R^{202}$, which may be the same with or different from each other, each represents a hydrogen atom, an alkyl group (preferably having 1 to 20 carbon atoms), a cycloalkyl group (preferably having 3 to 20 carbon atoms), or an aryl group (preferably having 6 to 20 carbon atoms), and $R^{201}$ and $R^{202}$ may be bonded to each other to form a ring. $R^{203}$, $R^{204}$, $R^{205}$ and $R^{206}$, which may be the same with or different from each other, each represents an alkyl group having 1 to 20 carbon atoms.

As for the above alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferred.

These alkyl groups in formulae (A) and (E) are preferably unsubstituted alkyl groups.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate, and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound, and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom and also, the alkyl chain preferably contains an oxygen atom to form an oxyalkylene group. The number of oxyalkylene groups in the molecule is 1 or more, preferably from 3 to 9, more preferably from 4 to 6. Among oxyalkylene groups, those having a structure of —$CH_2CH_2O$—, —$CH(CH_3)CH_2O$— or —$CH_2CH_2CH_2O$— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication 2007/0224539.

A nitrogen-containing organic compound having a group capable of leaving by the action of an acid may be also used as a kind of the basic compound. Examples of this compound include a compound represented by the following formula (F). Incidentally, the compound represented by the following formula (F) exhibits an effective basicity in the system as a result of elimination of the group capable of leaving by the action of an acid.

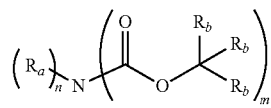

In formula (F), each Ra independently represents a hydrogen atom, an alkyl group, a cycloalkyl group, an aryl group, or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group.

At least two Rb's may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (F), each of the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group, or a halogen atom.

Examples of the alkyl group, cycloalkyl group, aryl group and aralkyl group (each of these alkyl group, cycloalkyl group, aryl group and aralkyl group may be substituted with the above-described functional group, an alkoxy group or a halogen atom) of R include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl group such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl group or aromatic compound-derived group; a group where the group derived from a linear or branched alkane or the group derived from a cycloalkane is substituted with one or more kinds of or one or more groups of aromatic compound-derived group such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived group, cycloalkane-derived group, aromatic compound-derived group, heterocyclic compound-derived group, and functional group such as hydroxyl group, cyano group, amino group, pyrrolidino group, piperidino group, morpholino group and oxo group.

Specific examples of the nitrogen-containing organic compound having a group capable of leaving by the action of an acid, which are particularly preferred in the present invention, are illustrated below, but the present invention is not limited thereto.

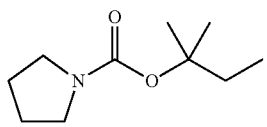

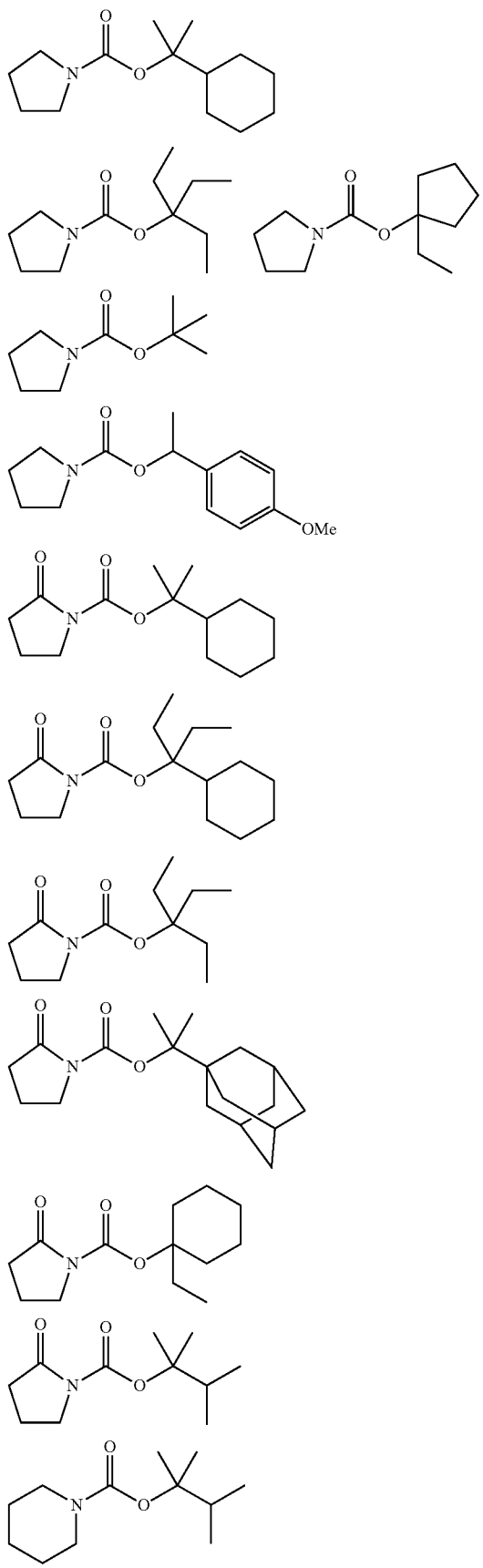

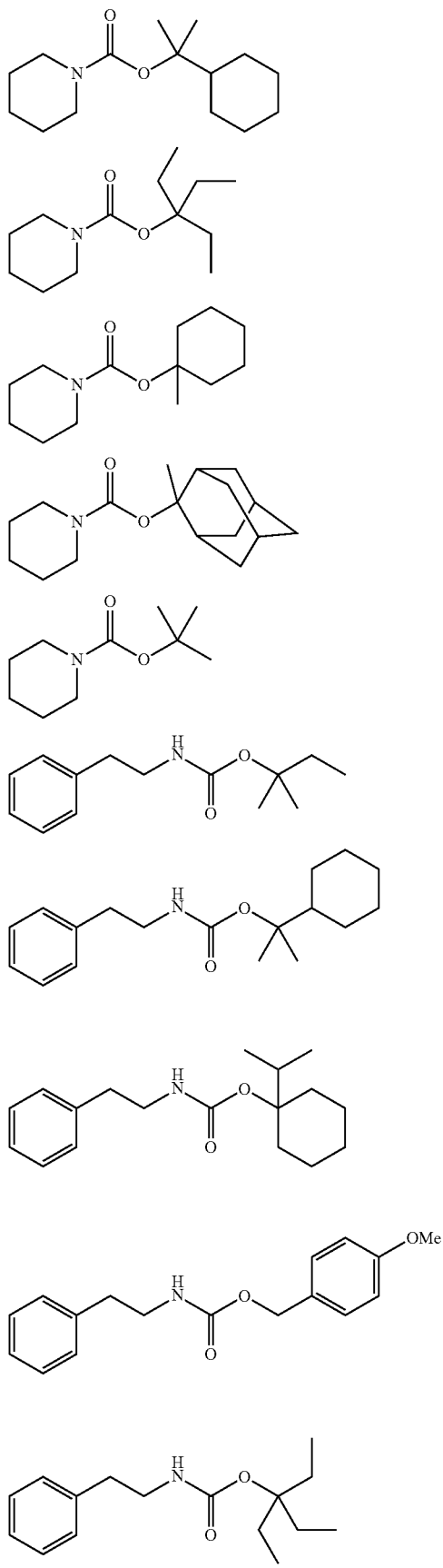
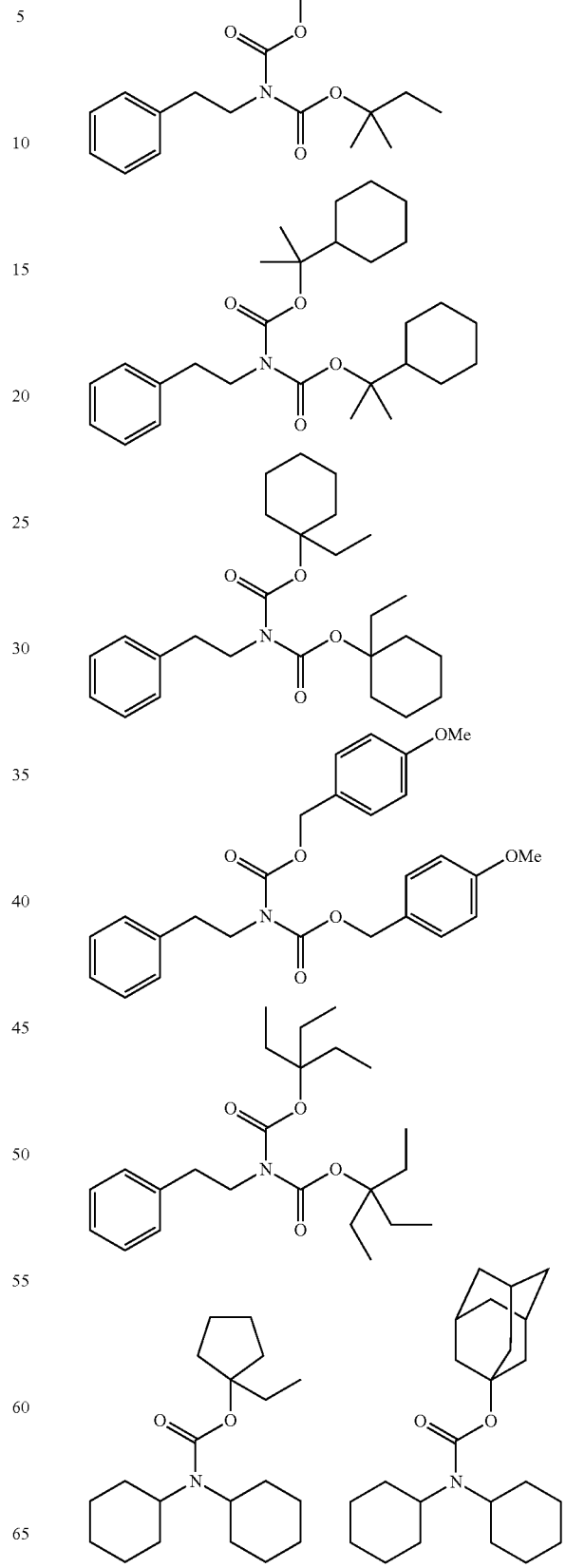

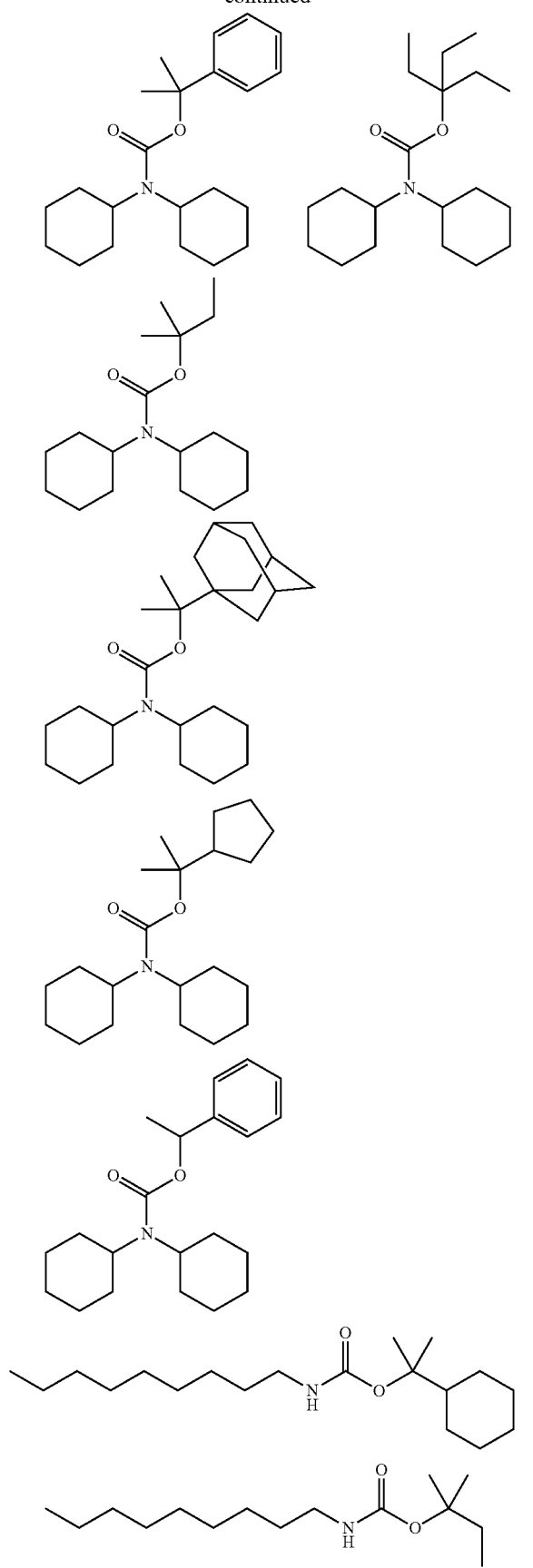
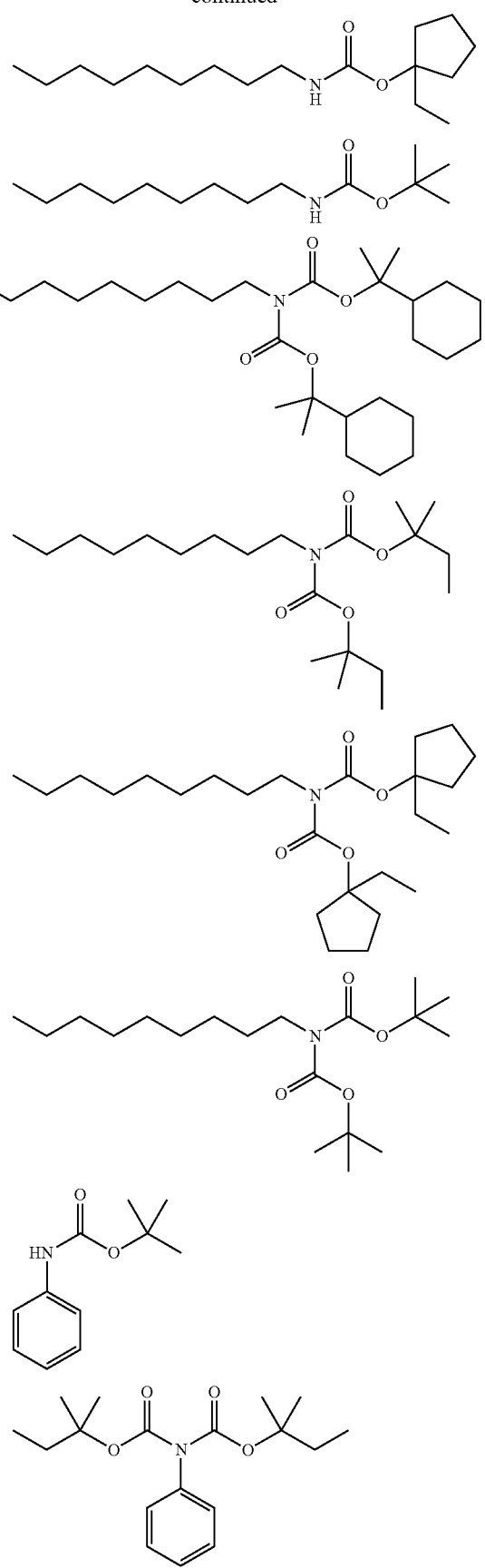

-continued

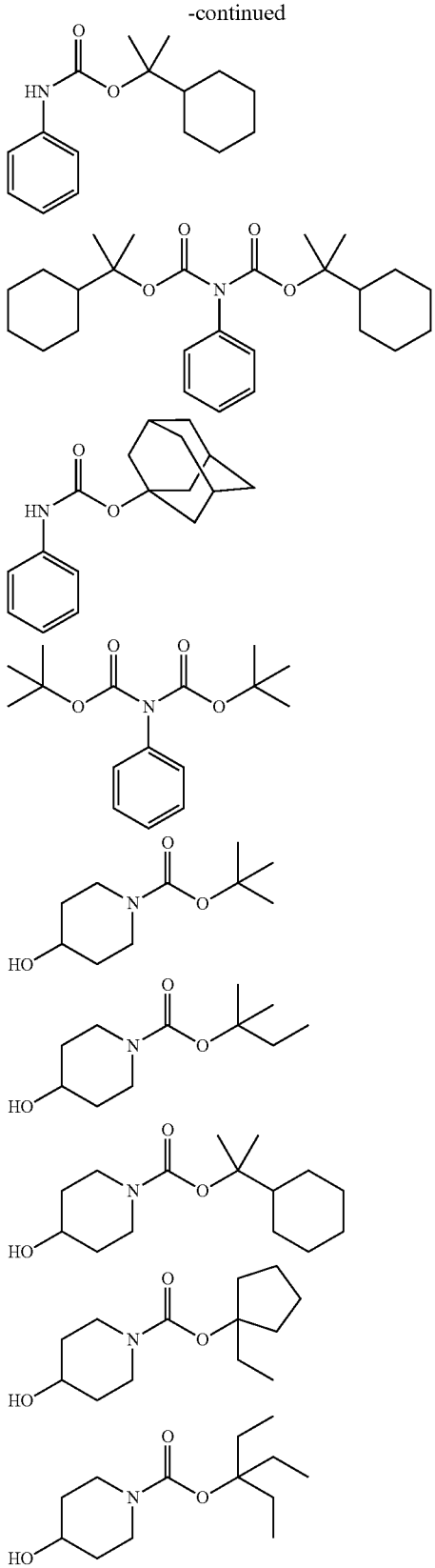

As for the compound represented by formula (F), a commercially available product may be used, or the compound may be synthesized from a commercially available amine by the method described, for example, in Protective Groups in Organic Synthesis, 4th Ed. As a most ordinary method, the compound can be synthesized in accordance with the method described, for example, in JP-A-2009-199021.

Also, as the basic compound, the compound having a fluorine atom and a silicon atom, and having basicity, or the basicity increases by the action of an acid, as described in JP-A-2011-141494, may be used. The specific examples thereof include Compounds (B-7) to (B-18) which are used in the Examples in the same patent.

As the basic compound, a compound having an amine oxide structure may also be used. The specific examples of the compound which can be used include triethylaminepyridine N-oxide, tributylamine N-oxide, triethanolamine N-oxide, tris(methoxyethyl)amine N-oxide, tris[2-(methoxymethoxy)ethyl]amine-oxide, 2,2',2"-nitrilotriethylpropionate N-oxide, N-2-(2-methoxyethoxyl)methoxyethyl-morpholine N-oxide, and amine oxide compounds exemplified in JP-A-2008-102383.

The molecular weight of the basic compound is preferably 250 to 2,000, and more preferably 400 to 1,000. In view of further reduction of LWR and uniformity of local pattern dimension, the molecular weight of the basic compound is preferably 400 or more, more preferably 500 or more, and still more preferably 600 or more.

These basic compounds may be used in combination with the compound (N), and may be used by one kind alone, or two or more in combination.

The actinic ray-sensitive or radiation-sensitive resin composition in the invention may contain or may not contain a basic compound, but in the case of containing the basic compound, the amount used of the compound is usually 0.001 mass % to 10 mass %, and preferably 0.01 mass % to 5 mass %, based on the solids content of the actinic ray-sensitive or radiation-sensitive resin composition The use ratio of the acid generator and the basic compound in the composition is preferably in the range of acid generator/basic compound (molar ratio) of 2.5 to 300. That is, from the point of sensitivity and resolution, the molar ratio is preferably 2.5 or more, and from the point of suppression of the reduction of resolution due to fattening of the resist pattern by aging after exposure until heat treatment, preferably 300 or less. Acid generator/basic compound (molar ratio) is more preferably 5.0 to 200, and more preferably 7.0 to 150.

In the chemical amplification resist composition in the invention, a compound having both an onium salt structure and an acid anion structure in one molecule (hereinafter also referred to as a betaine compound) can also be preferably used, such as the compound included in formula (I) in JP-A-2012-189977; the compound represented by formula (I) in JP-A-2013-6827; the compound represented by formula (I) in JP-A-2013-8020; and the compound represented by formula (I) in JP-A-2012-252124. The examples of the onium salt structures include a sulfonium structure, an iodoniumstructure, and an ammonium structure, and a sulfonium structure and an iodoniumstructure are preferred. As the acid anion structure, a sulfonate anion and a carboxylate anion are preferred. The following can be exemplified as the examples of such compounds.

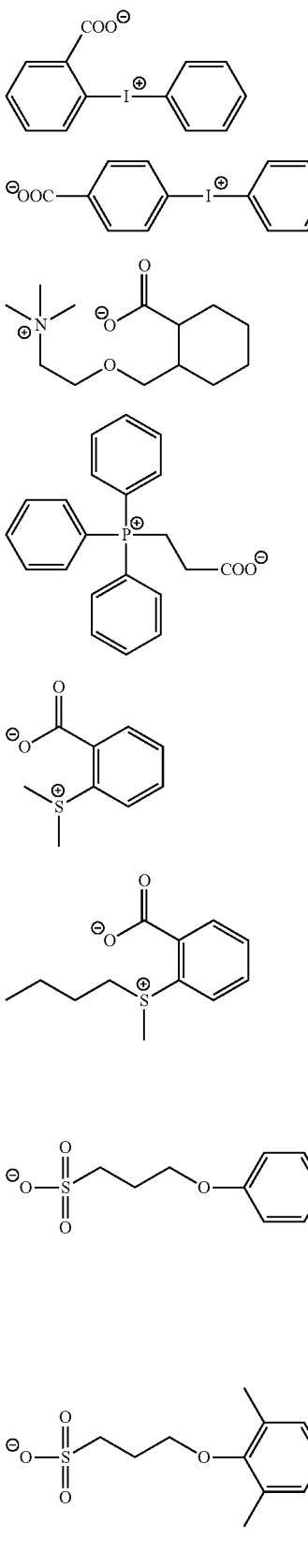

[6] (C) Solvent

Examples of the solvent which can be used at the preparation of the actinic ray-sensitive or radiation-sensitive resin composition of the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may have a ring, alkylene carbonate, alkyl alkoxyacetate and alkyl pyruvate.

Specific examples of these solvents include those described in paragraphs [0441] to [0455] of U.S. Patent Application Publication No. 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but preferred examples of the solvent containing a hydroxyl group include an alkylene glycol monoalkyl ether and an alkyl lactate, with propylene glycol monomethyl ether (PGME, another name: 1-methoxy-2-propanol) and ethyl lactate being more preferred. Preferred examples of the solvent not containing a hydroxyl group include an alkylene glycol monoalkyl ether acetate, an alkyl alkoxypropionate, a monoketone compound which may contain a ring, a cyclic lactone, and an alkyl acetate. Among these, propylene glycol monomethyl ether acetate (PGMEA, another name: 1-methoxy-2-acetoxypropane), ethyl ethoxypropionate, 2-heptanone, γ-butyrolactone, cyclohexanone and butyl acetate are more preferred, and propylene glycol monomethyl ether acetate, ethyl ethoxypropionate and 2-heptanone are most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in a ratio of 50 mass % or more is particularly preferred in view of coating uniformity.

The solvent preferably contains propylene glycol monomethyl ether acetate and is preferably a solvent composed of propylene glycol monomethyl ether acetate alone or a mixed solvent of two or more kinds of solvents containing propylene glycol monomethyl ether acetate.

[7] (F) Surfactant

The actinic ray-sensitive or radiation-sensitive resin composition of the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing the surfactant, the actinic ray-sensitive or radiation-sensitive resin composition of the present invention can give a resist pattern improved in the sensitivity, resolution and adherence and reduced in the development defect when an exposure light source of 250 nm or less, particularly 220 nm or less, is used.

The fluorine-containing and/or silicon-containing surfactants include the surfactants described in paragraph [0276] of U.S. Patent Application Publication No. 2008/0248425, and examples thereof include EFtop EF301 and EF303 (produced by Shin-Akita Kasei K.K.); Florad FC430, 431 and 4430

(produced by Sumitomo 3M Inc.); Megaface F171, F173, F176, F189, F113, F110, F177, F120 and R08 (produced by DIC Corp.); Surflon S-382, SC101, 102, 103, 104, 105 and 106, and KH-20 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, Polysiloxane Polymer KP-341 (produced by Shin-Etsu Chemical Co., Ltd.) may be also used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under the surfactant above include Megaface F178, F-470, F-473, F-475, F-476 and F-472 (produced by DIC Corp.); a copolymer of a $C_6F_{13}$ group-containing acrylate (or methacrylate) with a (poly (oxyalkylene)) acrylate (or methacrylate); and a copolymer of a $C_3F_7$ group-containing acrylate (or methacrylate) with a (poly(oxyethylene)) acrylate (or methacrylate) and a (poly (oxypropylene)) acrylate (or methacrylate).

In the present invention, a surfactant other than the fluorine-containing and/or silicon-containing surfactants, described in paragraph [0280] of U.S. Patent Application Publication No. 2008/0248425 may be also used.

One of these surfactants may be used alone, or some of them may be used in combination.

In the case where the actinic ray-sensitive or radiation-sensitive resin composition contains a surfactant, the amount of the surfactant used is preferably from 0.0001 to 2 mass %, more preferably from 0.0005 to 1 mass %, based on the total amount of the actinic ray-sensitive or radiation-sensitive resin composition (excluding the solvent).

On the other hand, when the amount of the surfactant added is set to 10 ppm or less based on the total amount of the actinic ray-sensitive or radiation-sensitive resin composition (excluding the solvent), the resin (D) for use in the present invention is more unevenly distributed to the surface, so that the resist film surface can be made more hydrophobic and the followability of water at the immersion exposure can be more enhanced.

[8] (G) Other Additives

The actinic ray-sensitive or radiation-sensitive resin composition of the present invention may or may not contain an onium carboxylate. Examples of the onium carboxylate include those described in paragraphs [0605] to [0606] of U.S. Patent Application Publication No. 2008/0187860.

Such an onium carboxylate can be synthesized by reacting a sulfonium hydroxide, iodonium hydroxide or ammonium hydroxide and a carboxylic acid with silver oxide in an appropriate solvent.

In the case where the actinic ray-sensitive or radiation-sensitive resin composition contains an onium carboxylate, the content thereof is generally from 0.1 to 20 mass %, preferably from 0.5 to 10 mass %, more preferably from 1 to 7 mass %, based on the total solid content of the composition.

The actinic ray-sensitive or radiation-sensitive resin composition of the present invention may further contain, for example, a dye, a plasticizer, a photosensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid, and a cyclohexanedicarboxylic acid.

From the standpoint of enhancing the resolution, the actinic ray-sensitive or radiation-sensitive resin composition of the present invention is preferably used in a film thickness of 30 to 250 nm, more preferably from 30 to 200 nm. Such a film thickness can be achieved by setting the solid content concentration in the composition to an appropriate range, thereby imparting an appropriate viscosity and enhancing the coatability and film-forming property.

The solid content concentration of the actinic ray-sensitive or radiation-sensitive resin composition of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition.

The actinic ray-sensitive or radiation-sensitive resin composition of the present invention is used by dissolving the components above in a predetermined organic solvent, preferably in the above-described mixed solvent, filtering the solution through a filter, and coating the filtrate on a predetermined support (substrate). The filter used for filtration is preferably a polytetrafluoroethylene-, polyethylene- or nylon-made filter having a pore size of 0.1 μm or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

[9] Pattern Forming Method

The pattern forming method (a negative pattern forming method) of the invention comprises at least:

(i) a step of forming a film (a resist film) by the actinic ray-sensitive or radiation-sensitive resin composition of the invention, (ii) a step of exposing the film, and (iii) a step of developing by using a developer.

The exposure in process (ii) may be immersion exposure.

The pattern forming method of the invention preferably has (v) a heating step after exposure step (ii).

The pattern forming method of the invention may further have (vi) a step of development by using an alkali developer. By performing this process, it is expected that the pattern of ½ of an optical image of line and space can be formed by one exposure. As for this technique, please refer to FIGS. 2 and 3 in WO 2008/153110A and FIGS. 1 to 11 in U.S. Pat. No. 8,227,183B.

The pattern forming method of the invention can perform (ii) the step of exposure a plurality of times.

The pattern forming method of the invention can perform (v) the step of heating a plurality of times.

The resist film is formed from the above-described actinic ray-sensitive or radiation-sensitive resin composition of the invention and, more specifically, the resist film is a film formed by coating the actinic ray-sensitive or radiation-sensitive resin composition on a substrate. In the pattern forming method of the invention, the process of forming a film of the actinic ray-sensitive or radiation-sensitive resin composition on a substrate, the process of exposing the film, and the development process can be carried out by generally methods.

It is also preferred to include, after film formation, a pre-baking step (PB) before entering the exposure step.

Furthermore, it is also preferred to include a post-exposure baking step (PEB) after the exposure step but before the development step.

As for the heating temperature, both PB and PEB are preferably performed at 70 to 130° C., more preferably at 80 to 120° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source of the exposure apparatus for use in the present invention is not particularly limited in its wavelength but includes, for example, infrared light, visible light, ultraviolet light, far ultraviolet light, extreme-ultraviolet light, X-ray and electron beam and is preferably far ultraviolet light having a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, EUV (13 nm), and electron beam. Among these, KrF excimer laser, ArF excimer laser, EUV and electron beam are preferred, and ArF excimer laser is more preferred.

In the present invention, an immersion exposure method can be applied in the step of performing exposure.

The immersion exposure method is a technique to increase the resolution, and this is a technique of performing exposure by filling a space between the projection lens and the sample with a high refractive-index liquid (hereinafter, sometimes referred to as an "immersion liquid").

As for the "effect of immersion", assuming that $\lambda_0$ is the wavelength of exposure light in air, n is the refractive index of the immersion liquid for air, θ is the convergence half-angle of beam and $NA_0 = \sin\theta$, the resolution and the depth of focus in immersion can be expressed by the following formulae. Here, $k_1$ and $k_2$ are coefficients related to the process.

(Resolution)=$k_1 \cdot (\lambda_0/n)/NA_0$ (Depth of focus)=$\pm k_2 \cdot (\lambda_0/n)/NA_0^2$ That is, the effect of immersion is equal to use of an exposure wavelength of 1/n. In other words, in the case of a projection optical system having the same NA, the depth of focus can be made n times larger by immersion. This is effective for all pattern profiles and furthermore, can be combined with the super-resolution technology under study at present, such as phase-shift method and modified illumination method.

In the case of performing immersion exposure, a step of washing the film surface with an aqueous chemical solution may be performed (1) before the exposure step after forming the film on a substrate and/or (2) after the step of exposing the film through an immersion liquid but before the step of baking the film.

The immersion liquid is preferably a liquid being transparent to light at the exposure wavelength and having as small a temperature coefficient of refractive index as possible in order to minimize the distortion of an optical image projected on the film. In particular, when the exposure light source is ArF excimer laser (wavelength: 193 nm), water is preferably used in view of easy availability and easy handleability in addition to the above-described aspects.

In the case of using water, an additive (liquid) capable of decreasing the surface tension of water and increasing the interface activity may be added in a small ratio. This additive is preferably an additive that does not dissolve the resist layer on the wafer and at the same time, gives only a negligible effect on the optical coat at the undersurface of the lens element.

Such an additive is preferably, for example, an aliphatic alcohol having a refractive index substantially equal to that of water, and specific examples thereof include methyl alcohol, ethyl alcohol and isopropyl alcohol. By virtue of adding an alcohol having a refractive index substantially equal to that of water, even when the alcohol component in water is evaporated and its content concentration is changed, the change in the refractive index of the liquid as a whole can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Furthermore, pure water after filtration through an ion exchange filter or the like may be also used.

The electrical resistance of water used as the immersion liquid is preferably 18.3 MΩcm or more, and TOC (total organic carbon) is preferably 20 ppb or less. The water is preferably subjected to a deaeration treatment.

Also, the lithography performance can be enhanced by raising the refractive index of the immersion liquid. From such a standpoint, an additive for raising the refractive index may be added to water, or heavy water ($D_2O$) may be used in place of water.

In the case where the film formed using the composition of the present invention is exposed through an immersion medium, the receding contact angle on the surface is increased by the addition of the resin (D) for use in the present invention. The receding contact angle of the film is preferably from 60 to 90°, more preferably 70° or more.

In the immersion exposure step, the immersion liquid must move on a wafer following the movement of an exposure head that is scanning the wafer at a high speed and forming an exposure pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

In order to prevent the film from directly contacting with the immersion liquid, a film (hereinafter, sometimes referred to as a "topcoat") sparingly soluble in the immersion liquid may be provided between the film formed using the composition of the present invention and the immersion liquid. The functions required of the topcoat are suitability for coating as a resist overlayer, transparency to radiation, particularly, radiation having a wavelength of 193 nm, and sparing solubility in immersion liquid. The topcoat is preferably unmixable with the resist and capable of being uniformly coated as a resist overlayer.

In view of transparency to light at 193 nm, the topcoat is preferably an aromatic-free polymer.

Specific examples thereof include a hydrocarbon polymer, an acrylic acid ester polymer, a polymethacrylic acid, a polyacrylic acid, a polyvinyl ether, a silicon-containing polymer, and a fluorine-containing polymer. The resin (D) for use in the present invention is suitable also as the topcoat. If impurities are dissolved out into the immersion liquid from the topcoat, the optical lens is contaminated. For this reason, residual monomer components of the polymer are preferably little contained in the topcoat.

On removing the topcoat, a developer may be used, or a release agent may be separately used. The release agent is preferably a solvent less likely to permeate the film. From the standpoint that the removing step can be performed simultaneously with the development step of the film, the topcoat is preferably removable with an alkali developer and in view of removal with an alkali developer, the topcoat is preferably acidic, but considering non-intermixing with the film, the topcoat may be neutral or alkaline.

The difference in the refractive index between the topcoat and the immersion liquid is preferably null or small. In this case, the resolution can be enhanced. In the case where the exposure light source is ArF excimer laser (wavelength: 193 nm), water is preferably used as the immersion liquid and therefore, the topcoat for ArF immersion exposure preferably has a refractive index close to the refractive index (1.44) of water. Also, in view of transparency and refractive index, the topcoat is preferably a thin film.

The topcoat is preferably unmixable with the film and further unmixable also with the immersion liquid. From this standpoint, when the immersion liquid is water, the solvent used for the topcoat is preferably a medium that is sparingly soluble in the solvent used for the composition of the present invention and is water-insoluble. Furthermore, when the immersion liquid is an organic solvent, the topcoat may be either water-soluble or water-insoluble.

In the present invention, the substrate on which the film is formed is not particularly limited, and a substrate generally used in the process of producing a semiconductor such as IC or producing a liquid crystal device or a circuit board such as thermal head or in the lithography of other photo-fabrication processes, for example, an inorganic substrate such as silicon, SiN, SiO$_2$ and SiN, or a coating-type inorganic substrate such as SOG, can be used. If desired, an organic antireflection film may be formed between the film and the substrate.

In the case where the pattern forming method of the present invention further includes a step of performing development by using an alkali developer, the alkali developer which can be used includes, for example, an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

This alkaline aqueous solution may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

As for the rinsing solution in the rinsing treatment performed after the alkali development, pure water is used, and the pure water may be used after adding thereto a surfactant in an appropriate amount.

After the development or rinsing, a treatment of removing the developer or rinsing solution adhering on the pattern by a supercritical fluid may be performed.

On the other hand, in the invention, the resin (D) is preferably stable to an alkali developer. For example, when a film of the resin (D) having a thickness of 100 nm is formed and subjected to alkali development, film thickness change is preferably 3 nm/min or less, and more preferably 1 to 2 nm/min.

As for the developer which can be used in the step of performing development by using a developer containing an organic solvent (hereinafter, sometimes referred to as an "organic developer") in the pattern forming method of the present invention, a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the percentage water content in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the total amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone and methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant can be added in an appropriate amount, if desired.

The surfactant is not particularly limited but, for example, ionic or nonionic fluorine-containing and/or silicon-containing surfactants can be used. Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the total amount of the developer.

Moreover, as shown in Japanese Patent 5056974, paragraphs [0041] to [0063], the organic developer may contain a nitrogen-containing compound.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddling method), a method of spraying the developer on the substrate surface (spraying method), and a method of continuously ejecting the developer on the substrate spinning at a constant speed while scanning with a developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using a developer containing an organic solvent, a step of stopping the development by replacing the solvent with another solvent may be practiced.

The pattern forming method preferably includes a step of rinsing the film with a rinsing solution after the step of performing development by using a developer containing an organic solvent.

The rinsing solution used in the rinsing step after the step of performing development by using a developer containing an organic solvent is not particularly limited as long as it does not dissolve the resist pattern, and a solution containing a general organic solvent may be used. As the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the developer containing an organic solvent.

After the step of performing development by using a developer containing an organic solvent, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The percentage water content in the rinsing solution is preferably 10 mass % or less, more preferably 5 mass % or less, still more preferably 3 mass % or less. By setting the percentage water content to 10 mass % or less, good development characteristics can be obtained.

The vapor pressure at 20° C. of the rinsing solution used after the step of performing development by using a developer containing an organic solvent is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto a surfactant in an appropriate amount.

In the rinsing step, the wafer after development using a developer containing an organic solvent is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotation speed of 2,000 to 4,000 rpm. It is also preferred to include a heating step (Post Bake) after the rinsing step. The developer and rinsing solution remaining between patterns and in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronic device, OA•media-related device, optical device and communication device).

EXAMPLES

The invention will be described in further detail with reference to examples, but the invention is by no means restricted thereto.

Synthesis Example

Synthesis of Resin A-1

Cyclohexanone (22.11 parts by mass) was heated to 80° C. under nitrogen flow. While stirring the solution, a mixed solution containing 5.69 parts by mass of the monomer represented by the following formula M-1, 5.46 parts by mass of the monomer represented by the following formula M-2, 41.07 parts by mass of cyclohexanone, and 0.59 parts by mass of dimethyl-2,2'-azobisisobutyrate (V-601, manufactured by Wako Pure Chemical Industries) was dropwise added over 4 hours. After completion of dropping, the solution was further stirred for 2 hours at 80° C. After being allowed to be cooled, the reaction solution was reprecipitated by hexane/ethyl acetate (mass ratio: 9/1), filtered, and the obtained solid was subjected to vacuum drying to thereby obtain 8.85 parts by mass of resin (A-1) of the invention.

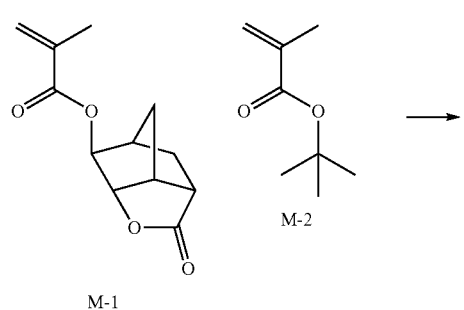

The weight average molecular weight (Mw: in terms of polystyrene) of the obtained resin found by GPC (carrier: tetrahydrofuran (THF)) was Mw: 11,500, polydispersity Mw/Mn was 1.62. The composition ratio measured by $^{13}$C-NMR was 40/60.

<Resin (A)>

Resins A-2 to A-8 were synthesized in the similar manner. The composition ratio of the repeating unit (molar ratio, corresponding from the left side in order), weight average molecular weight, and polydispersity in the synthesized resins A-2 to A-8 (including resin A-1) were shown in the following table.

TABLE 4

| Resin (D) | Structural Formula | Composition Ratio (mol %) | Mw | Mw/Mn |
|---|---|---|---|---|
| A-1 | | 40/60 | 11,500 | 1.62 |
| A-2 | | 40/60 | 20,500 | 1.72 |
| A-3 | | 40/40/20 | 12,700 | 1.75 |

TABLE 4-continued

| Resin (D) | Structural Formula | Composition Ratio (mol %) | Mw | Mw/Mn |
|---|---|---|---|---|
| A-4 | | 40/40/20 | 9,900 | 1.88 |
| A-5 | | 40/10/35/15 | 10,600 | 1.71 |
| A-6 | | 20/20/40/20 | 10,800 | 1.66 |
| A-7 | | 20/20/40/20 | 11,300 | 1.79 |

TABLE 4-continued

| Resin (D) | Structural Formula | Composition Ratio (mol %) | Mw | Mw/Mn |
|---|---|---|---|---|
| A-8 | (structures shown) | 10/20/60/10 | 10,700 | 1.65 |

Synthesis Example

Synthesis of Resin D-1

Cyclohexanone (13.01 parts by mass) was heated to 85° C. under nitrogen flow. While stirring the solution, a mixed solution containing 4.55 parts by mass of 2,2,3,3-tetrafluoropropyl methacrylate, 24.16 parts by mass of cyclohexanone, and 1.04 parts by mass of dimethyl-2,2'-azobisisobutyrate (V-601, manufactured by Wako Pure Chemical Industries) was dropwise added thereto over 4 hours. After completion of dropping, the solution was further stirred for 2 hours at 85° C. After being allowed to be cooled, the reaction solution was reprecipitated by methanol/water (mass ratio: 95/5), filtered, and the obtained solid was subjected to vacuum drying to thereby obtain 10.3 parts by mass of resin (D-1) of the invention.

The weight average molecular weight (Mw: in terms of polystyrene) of the obtained resin found by GPC (carrier: tetrahydrofuran (THF)) was Mw: 10,200, polydispersity Mw/Mn was 1.62.

Synthesis Example

Synthesis of Resin D-5

Propylene glycol monomethyl ether (2.86 parts by mass) was heated to 85° C. under nitrogen flow. While stirring the solution, a mixed solution containing 8.01 parts by mass of 2,2,3,3-tetrafluoropropyl methacrylate, 11.06 parts by mass of 2,4-dimethyl-3-pentyl methacrylate, 5.31 parts by mass of propylene glycol monomethyl ether, and 0.35 parts by mass of dimethyl-2,2'-azobisisobutyrate (V-601, manufactured by Wako Pure Chemical Industries) was dropwise added thereto over 4 hours. After completion of dropping, the solution was further stirred for 2 hours at 85° C. After being allowed to be cooled, the reaction solution was reprecipitated by methanol/water (mass ratio: 95/5), filtered, and the obtained solid was subjected to vacuum drying to thereby obtain 11.3 parts by mass of resin (D-5) of the invention.

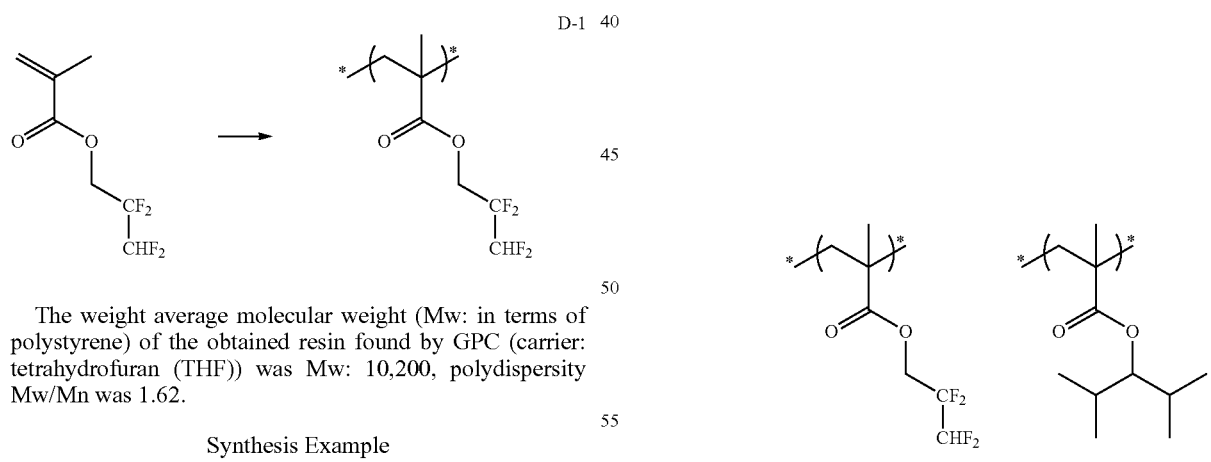

The weight average molecular weight (Mw: in terms of polystyrene) of the obtained resin found by GPC (carrier: tetrahydrofuran (THF)) was Mw: 31,200, polydispersity Mw/Mn was 1.61. The composition ratio measured by $^{13}$C-NMR was 40/60.

<Resin (D)>

Resins D-2 to D-4, D-6 to D-13, and Comparative Compound 1 were synthesized in the similar manner.

TABLE 5

| Resin (D) | Structural Formula | Composition Ratio (mol %) | Mw | Mw/Mn |
|---|---|---|---|---|
| D-1 | (acrylate with -O-CH₂-CF₂-CHF₂ side chain) | 100 | 10,200 | 1.62 |
| D-2 | (methacrylate with -O-CH₂-CF₂-CF₂-CH₃ side chain) | 100 | 25,700 | 1.57 |
| D-3 | (methacrylate with -O-CH₂CH₂-O-C(=O)-CF₂-CH₃) / (acrylate with -O-CH₂-CF₂-CHF₂) | 50/50 | 27,100 | 1.69 |
| D-4 | (acrylate with -O-CH₂-CF₂-CF₂-CH₃) / (methacrylate with t-butyl ester) | 40/60 | 15,900 | 1.86 |
| D-5 | (acrylate with -O-CH₂-CF₂-CHF₂) / (acrylate with -O-CH(iPr)₂) | 40/60 | 31,200 | 1.61 |

TABLE 5-continued

| Resin (D) | Structural Formula | Composition Ratio (mol %) | Mw | Mw/Mn |
|---|---|---|---|---|
| D-6 | | 45/45/10 | 28,600 | 1.58 |
| D-7 | | 40/30/25/5 | 21,500 | 1.92 |
| D-8 | | 95/5 | 41,800 | 1.74 |
| D-9 | | 80/17/3 | 8,900 | 1.59 |

TABLE 5-continued

| Resin (D) | Structural Formula | Composition Ratio (mol %) | Mw | Mw/Mn |
|---|---|---|---|---|
| D-10 | | 97/3 | 9,800 | 1.66 |
| D-11 | | 45/5/50 | 24,300 | 1.68 |
| D-12 | | 3/67/30 | 35,100 | 1.71 |
| D-13 | | 30/70 | 9,400 | 1.8 |

TABLE 6
| Resin | Structural Formula | Composition Ratio (mol %) | Mw | Mw/Mn |
|---|---|---|---|---|
| Comparative Compound 1 | | 80/20 | 18,700 | 1.68 |
<Acid Generator>
The following compounds were used as acid generators.
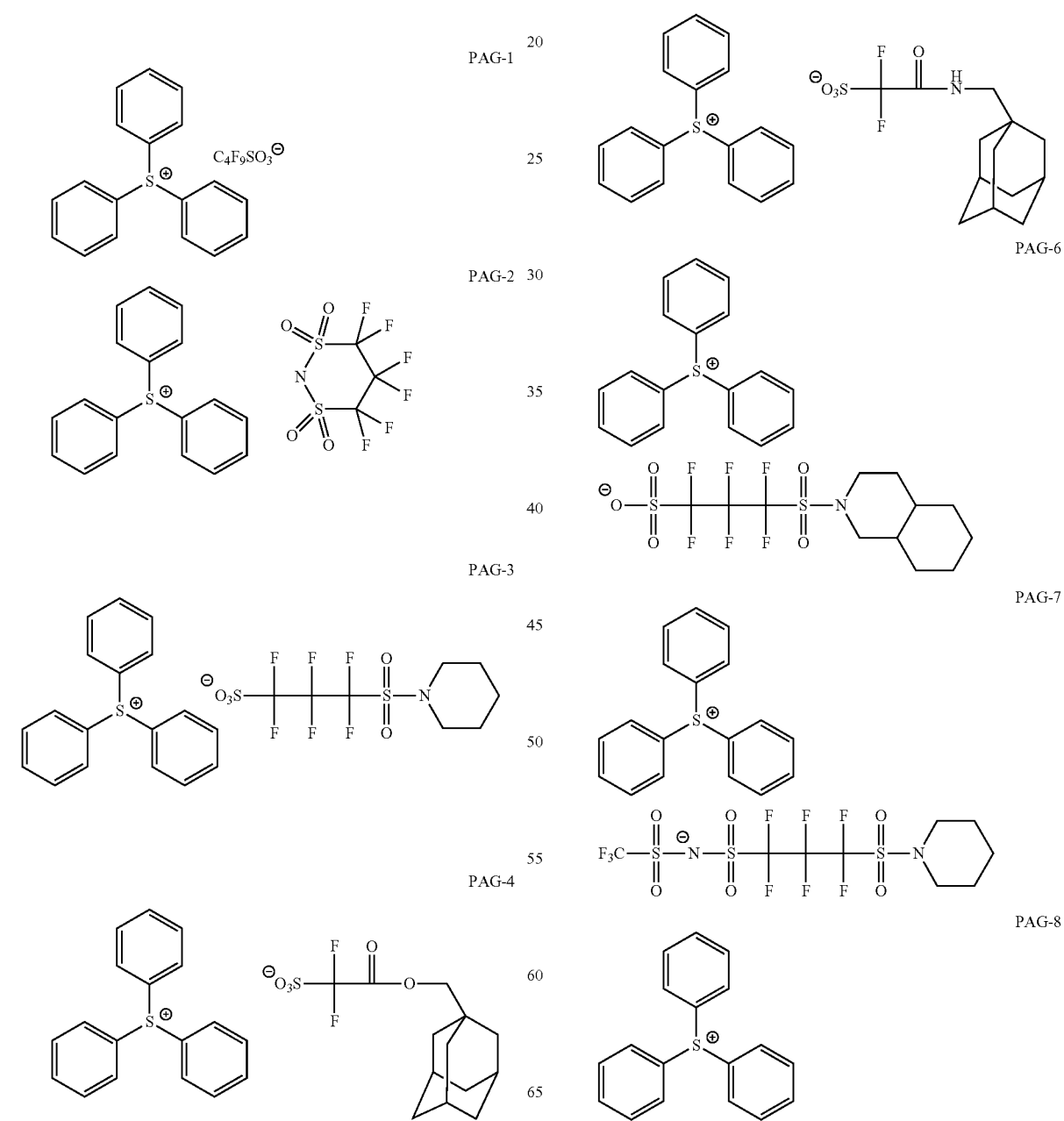

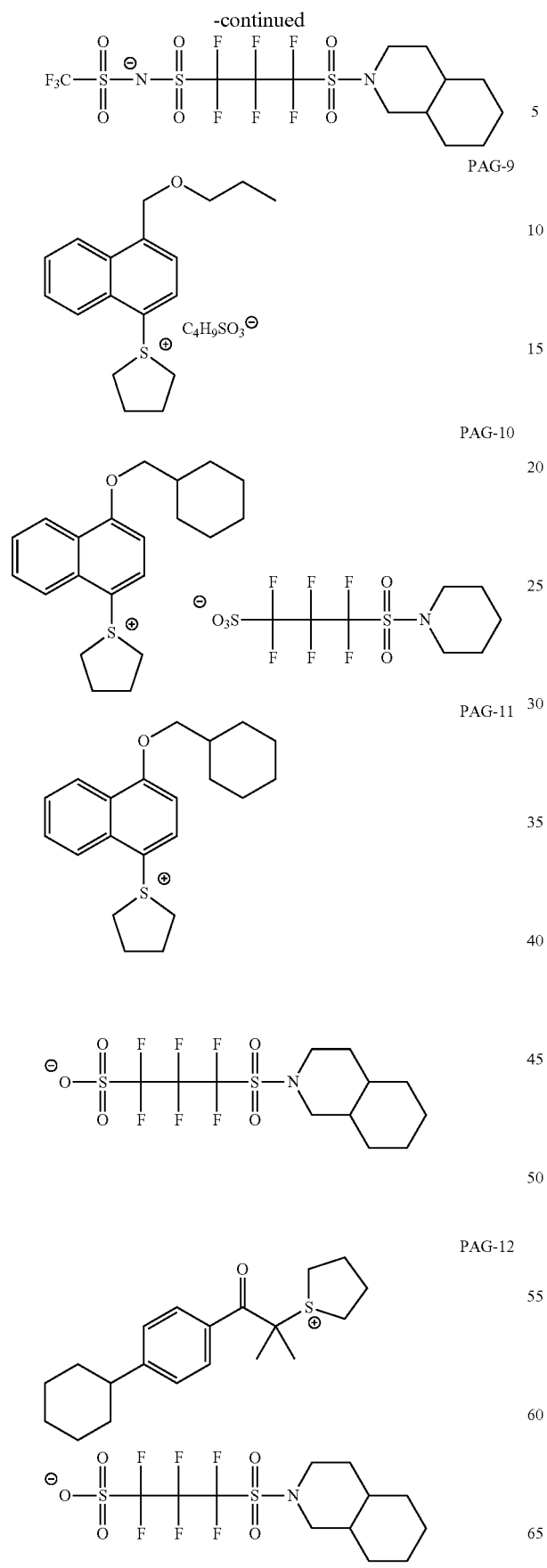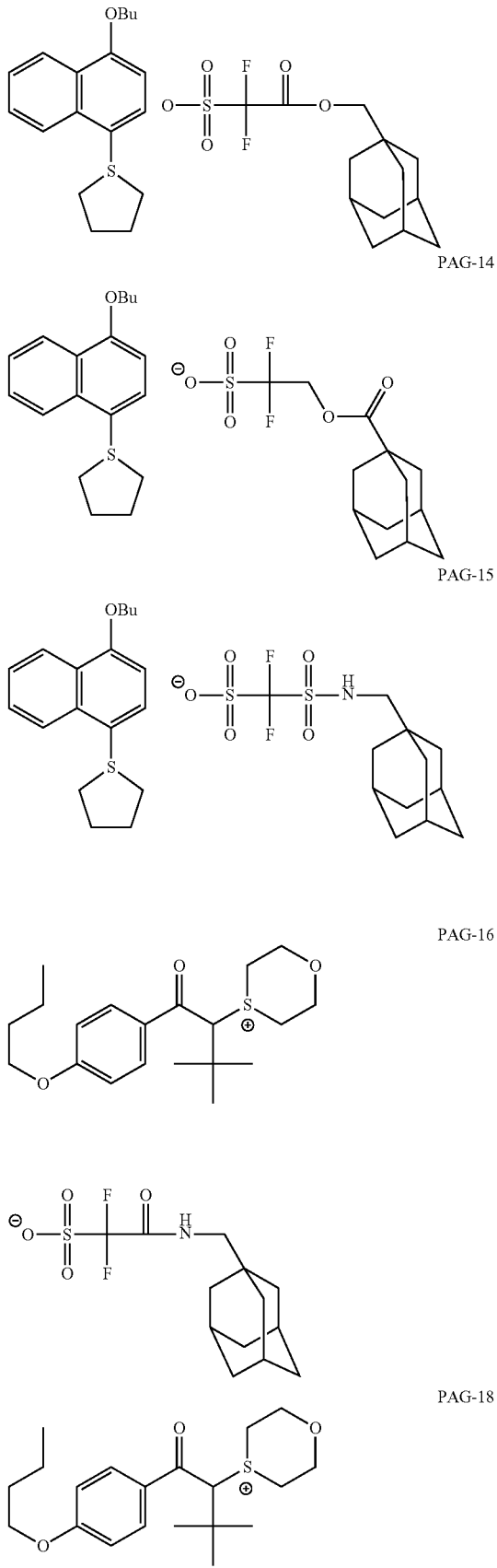

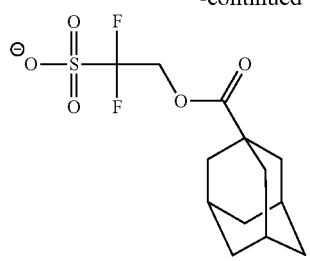
PAG-19
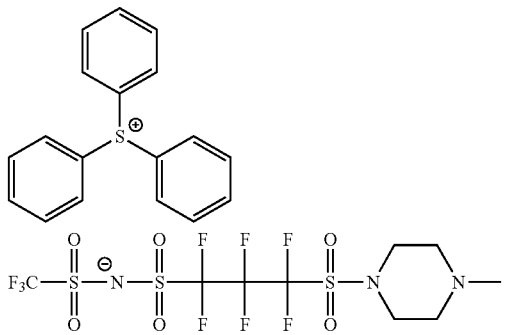
N-1
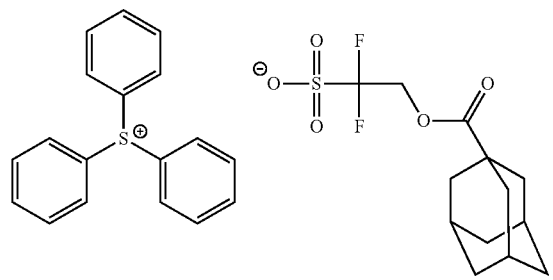
PAG-20
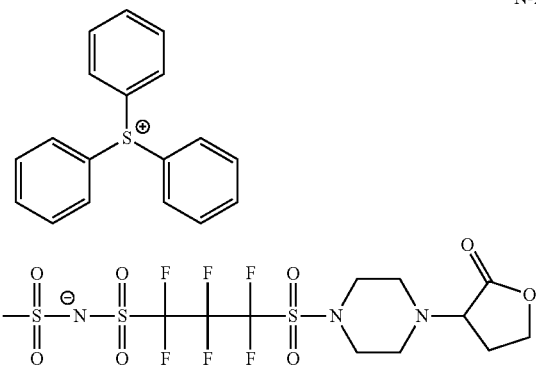
N-2
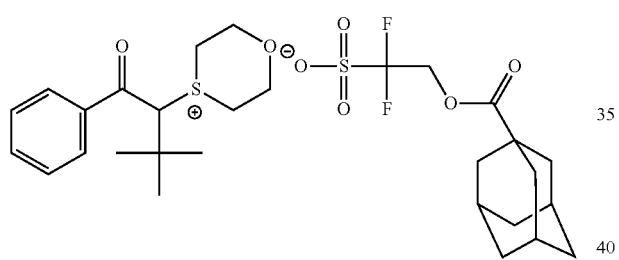
PAG-21
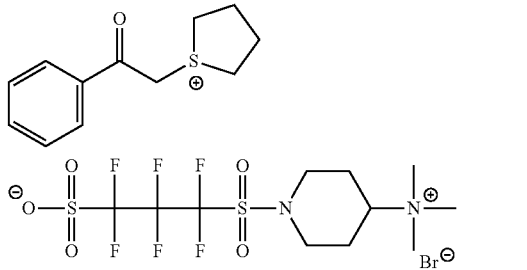
N-3
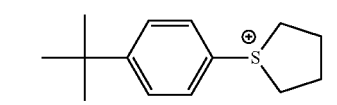
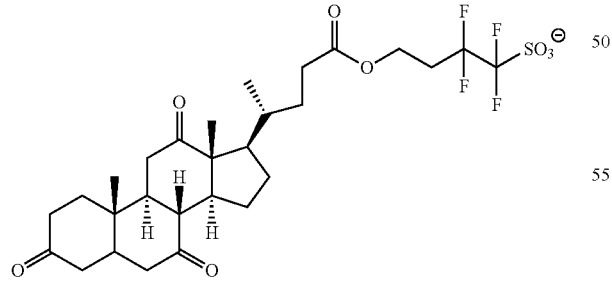
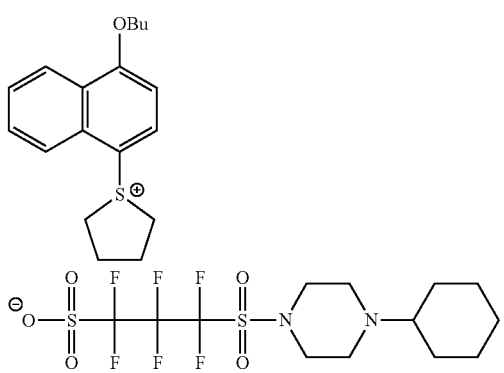
N-4
<Basic Compound (N) Whose Basicity Decreases Upon Irradiation with an Actinic Ray or Radiation, and Basic Compound (N')>
The following compounds were used as the basic compound whose basicity decreases upon irradiation with an actinic ray or radiation, or the basic compound.
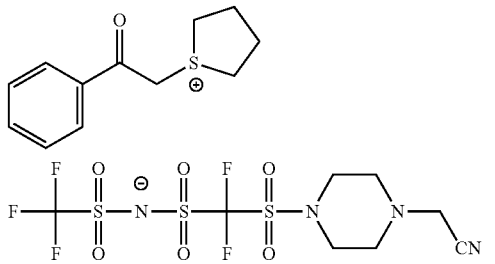
N-5

193
-continued
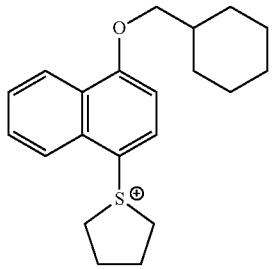
N-6
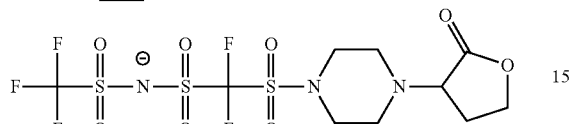
N-7
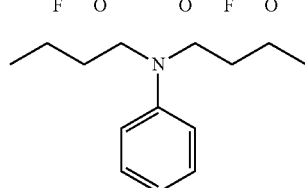
N-8
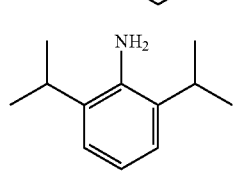
N-9
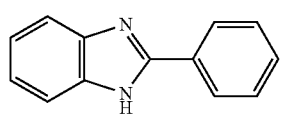
N-10
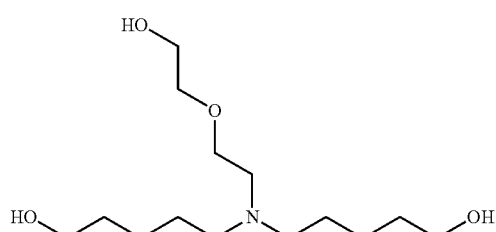
194
-continued
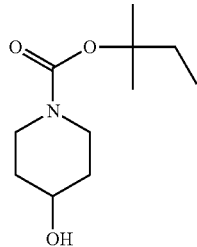
N-11
N-12
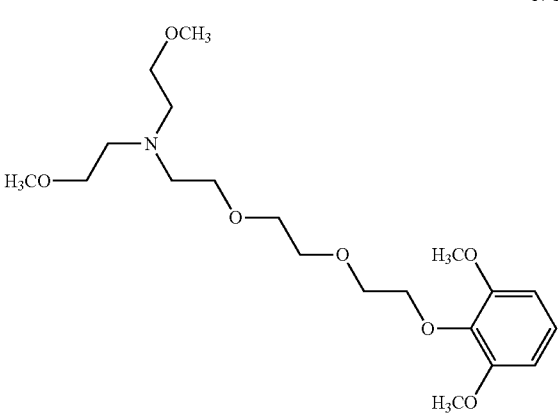
N-13
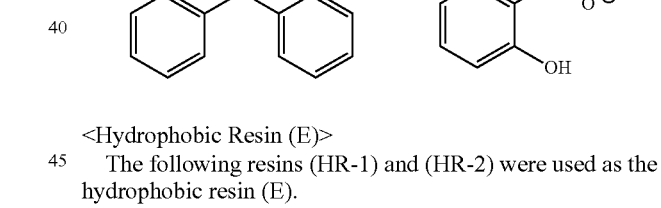
<Hydrophobic Resin (E)>
The following resins (HR-1) and (HR-2) were used as the hydrophobic resin (E).
TABLE 7
| Resin | Structural Formula | Composition Ratio (mol %) | Mw | Mw/Mn |
|---|---|---|---|---|
| HR-1 |  | 10/90 | 35,000 | 1.75 |

TABLE 7-continued

| Resin | Structural Formula | Composition Ratio (mol %) | Mw | Mw/Mn |
|---|---|---|---|---|
| HR-2 | (structure) | 20/80 | 24,500 | 1.79 |

<Surfactant>

As the surfactants, the followings were prepared.

W-1: Megaface F176 (manufactured by DIC Corp.; fluorine-containing)

W-2: Megaface R08 (manufactured by DIC Corp.; fluorine- and silicon-containing)

W-3: Polysiloxane polymer KP-341 (manufactured by Shin-Etsu Chemical Co., Ltd.; silicon-containing)

W-4: Troysol S-366 (manufactured by Troy Chemical)

W-5: KH-20 (manufactured by Asahi Glass Co., Ltd.)

W-6: PolyFox PF6320 (manufactured by OMNOVA Solutions Inc., fluorine-containing)

<Solvent>

As the solvents, the followings were prepared.

SL-1: Polypropylene glycol monomethyl ether acetate (PGMEA)

SL-2: Polypropylene glycol monomethyl ether propionate

SL-3: 2-Heptanone

SL-4: Ethyl lactate

SL-5: Polypropylene glycol monomethyl ether (PGME)

SL-6: Cyclohexanone

SL-7: γ-Butyrolactone

SL-8: Propylene carbonate

<Developer>

As the developer, the followings were prepared.

SG-1: Butyl acetate

SG-2: Methyl amyl ketone

SG-3: Ethyl-3-ethoxy propionate

SG-4: Pentyl acetate

SG-5: Cyclohexanone

<Rinsing Solution>

As the rinsing solution, the followings were used.

SR-1: 4-Methyl-2-pentanol

SR-2: 1-Hexanol

SR-3: Butyl acetate

SR-4: Methyl amyl ketone

SR-5: Ethyl-3-ethoxy propionate

Examples 1 to 26 and Comparative Examples 1 and 2

ArF Immersion Exposure (Preparation of Resist)

The components shown in the following table were dissolved in the solvent shown in the same table to give a solid content of 5.0 mass %, and the obtained solution is filtered through a polyethylene filter having a pore size of 0.03 μm to prepare an actinic ray-sensitive or radiation-sensitive resin composition (resist composition). An organic antireflection film, ARC29SR (manufactured by Nissan Chemical Industries, Ltd.), was coated on a silicon wafer and baked at 205° C. for 60 seconds to form an antireflection film having a thickness of 0110 nm, and the actinic ray-sensitive or radiation-sensitive resin composition was coated thereon and baked (PB: Prebake) at 90° C. for 60 seconds to form a resist film having a thickness of 120 nm.

The obtained wafer was subjected to pattern exposure by using an ArF excimer laser immersion scanner (XT1700i, manufactured by ASML, NA: 1.20, C-Quad, outer sigma: 0.960, inner sigma: 0.709, XY deflection). As the reticle, a 6% halftone mask having a line size of 50 nm and line/space of 1/1 was used. As the immersion liquid, ultrapure water was used. Thereafter, the resist film was heated at 95° C. for 60 seconds (PEB: Post Exposure Bake), developed by puddling the organic solvent-based developer shown in the following table for 30 seconds, and then rinsed by puddling the rinsing solution shown in the following table for 30 seconds while spinning the wafer at a rotational speed of 1,000 rpm, and spin-dried to obtain a resist pattern of a 1/1 line and space of a line width of 50 nm.

[Bridge Defect]

The number of development defect (number/cm$^2$) per a unit area of the resist was measured by using a defect inspecting apparatus KLA230 (trade name, manufactured by KLA Tencor Japan, and setting the pixel size of the defect inspecting apparatus at 0.16 μm and the threshold value at 20, and then classified into micro bridge defect and blob defect by performing defect review. Development defects (number/cm$^2$) extracted from the difference caused by overlapping a comparative image and pixel unit were inspected and the number of development defects per a unit area was computed.

In the following table, the value was shown as a relative value standardizing the bridge defect number of Comparative Example 1 as 1. The smaller the numerical value, the more excellent was the bridge defect decreasing performance.

[Measurement of the Number of Particles in the Resist Composition]

The actinic ray-sensitive or radiation-sensitive resin composition was filtered through an optimizer D (a polyethylene membrane filter having a pore size of 0.05 μm, manufactured by Nippon Microlith). After the actinic ray-sensitive or radiation-sensitive resist composition was preserved for 3 months at 35° C., in-liquid particle number of the particles having a particle size of 0.2 μm or more in 1 mL of the liquid was measured by using an in-liquid particle size counter KS-40B (manufactured by Rion Co., Ltd.). The value shown in the table was a relative value by standardizing the particle number of Comparative Example 1 (the resin (D), not containing the resin (E)) as 1. The smaller the numerical value, the less was the particle number and excellent as performance.

The results of these evaluations were shown in the following table.

TABLE 8

| Example No. | Resin (A) | (g) | Compound (B) | (g) | Compound (N) | (g) | Compound (N') | (g) | Resin (D)/Resin (E) | (g) |
|---|---|---|---|---|---|---|---|---|---|---|
| Example 1 | A-1 | 10 | PAG-18 | 0.99 | | | N-9 | 0.14 | D-1 | 0.50 |
| Example 2 | A-2 | 10 | PAG-4 | 1.30 | N-1 | 0.70 | | | D-2 | 0.50 |
| Example 3 | A-3 | 10 | PAG-14 | 1.50 | N-4 | 0.72 | N-11 | 0.14 | D-3 | 0.10 |
| Example 4 | A-4 | 10 | PAG-7 | 1.47 | | | N-10/N-12 | 0.04/1.0 | D-4 | 0.55 |
| Example 5 | A-5 | 10 | PAG-16 | 1.10 | N-3 | 0.84 | | | D-5 | 0.25 |
| Example 6 | A-2 | 10 | PAG-8 | 1.85 | | | N-7 | 0.14 | D-6 | 0.03 |
| Example 7 | A-4 | 10 | PAG-3 | 1.36 | N-2 | 0.54 | | | D-7 | 0.40 |
| Example 8 | A-2 | 10 | PAG-9/PAG-13 | 1.0/0.4 | N-5 | 0.08 | | | D-7 | 0.60 |
| Example 9 | A-3 | 10 | PAG-3/PAG-5 | 0.8/0.6 | N-1 | 0.71 | | | D-8 | 0.45 |
| Example 10 | A-2 | 10 | PAG-2 | 1.00 | | | N-8 | 0.14 | D-9 | 0.25 |
| Example 11 | A-5 | 10 | PAG-16/PAG-18 | 0.7/0.7 | | | N-11 | 0.14 | D-10 | 0.70 |
| Example 12 | A-1 | 10 | PAG-11 | 1.45 | N-6 | 0.70 | | | D-1/D-7 | 0.18/0.2 |
| Example 13 | A-4 | 10 | PAG-13 | 1.40 | N-6 | 0.70 | | | D-4/D-13 | 0.2/0.2 |
| Example 14 | A-1 | 10 | PAG-4 | 1.40 | | | N-9 | 0.14 | D-5/HR-1 | 0.2/0.2 |
| Example 15 | A-3 | 10 | PAG-14 | 1.40 | | | N-9 | 0.14 | D-8/HR-2 | 0.2/0.2 |
| Example 16 | A-5 | 10 | PAG-17/PAG-20 | 0.7/0.7 | | | N-9 | 0.14 | D-11 | 0.70 |
| Example 17 | A-1 | 10 | PAG-6/PAG-19 | 0.7/0.7 | N-1 | 0.70 | | | D-12 | 0.70 |
| Example 18 | A-1/A-3 | 5/5 | PAG-17/PAG-12 | 0.3/1.0 | N-4 | 0.72 | | | D-11/D-3 | 0.3/0.2 |
| Example 19 | A-2/A-5 | 2/8 | PAG-1/PAG-4 | 0.8/0.6 | N-6 | 0.70 | | | D-12/D-5 | 0.03/0.4 |
| Example 20 | A-4/A-5 | 4/6 | PAG-10/PAG-15 | 0.7/0.7 | | | N-9 | 0.14 | D-1/D-10 | 0.25/0.1 |
| Example 21 | A-6 | 10 | PAG-19/PAG-20 | 1.0/1.0 | N-13 | 0.80 | | | D-1 | 0.55 |
| Example 22 | A-7 | 10 | PAG-20 | 2.10 | | | N-8 | 0.14 | D-12 | 0.80 |
| Example 23 | A-8 | 10 | PAG-15 | 2.00 | N-2 | 0.54 | | | D-10 | 0.60 |
| Example 24 | A-1 | 10 | PAG-16 | 1.89 | N-13 | 0.60 | N-8 | 0.14 | D-4 | 0.55 |
| Example 25 | A-7 | 10 | PAG-20 | 1.90 | N-13 | 0.80 | N-9 | 0.14 | D-12 | 0.70 |
| Example 26 | A-7 | 10 | PAG-21 | 2.10 | | | N-8 | 0.14 | D-12 | 0.80 |
| Comp. Ex. 1 | A-1 | 10 | PAG-4 | 1.24 | | | N-9 | 0.14 | None | |
| Comp. Ex. 2 | A-1 | 10 | PAG-4 | 1.24 | | | N-9 | 0.14 | Comparative Compound 1 | 0.48 |

| Example No. | Solvent | Mass Ratio | Surfactant | (g) | Developer | Mass Ratio | Rinsing Solution | Mass Ratio | Number of Particles (after normalization) | Bridge Defect (after normalization) |
|---|---|---|---|---|---|---|---|---|---|---|
| Example 1 | SL-1/SL-5 | 90/10 | W-1 | 0.003 | SG-1 | 100 | SR-1 | 100 | 3.36 | 0.18 |
| Example 2 | SL-1 | 100 | W-1 | 0.003 | SG-1/SG-5 | 95/5 | SR-1 | 100 | 1.98 | 0.16 |
| Example 3 | SL-1/SL-7 | 97/3 | None | None | SG-1 | 100 | SR-1 | 100 | 2.91 | 0.15 |
| Example 4 | SL-1/SL-6 | 80/20 | W-3 | 0.003 | SG-1 | 100 | SR-1/SR-4 | 90/10 | 1.96 | 0.12 |
| Example 5 | SL-1 | 100 | W-1 | 0.003 | SG-1 | 100 | SR-1 | 100 | 1.24 | 0.11 |
| Example 6 | SL-1/SL-4 | 90/10 | W-1 | 0.003 | SG-1 | 100 | SR-1 | 100 | 4.38 | 0.19 |
| Example 7 | SL-2/SL-6 | 70/30 | W-5 | 0.003 | SG-1/SG-4 | 50/50 | SR-2 | 100 | 4.89 | 0.20 |
| Example 8 | SL-1/SL-2 | 50/50 | W-1 | 0.003 | SG-1 | 100 | SR-1 | 100 | 4.11 | 0.21 |
| Example 9 | SL-1/SL-5 | 87/13 | W-3 | 0.003 | SG-1 | 100 | No rinsing process | | 5.80 | 0.24 |
| Example 10 | SL-1 | 100 | W-1 | 0.003 | SG-1 | 100 | SR-1/SR-5 | 90/10 | 1.47 | 0.08 |
| Example 11 | SL-1 | 100 | W-2 | 0.003 | SG-1 | 100 | SR-1 | 100 | 3.16 | 0.17 |
| Example 12 | SL-1 | 100 | W-1 | 0.003 | SG-1/SG-3 | 90/10 | SR-1 | 100 | 3.31 | 0.19 |
| Example 13 | SL-2 | 100 | W-2 | 0.003 | SG-1/SG-4 | 50/50 | SR-2 | 100 | 2.07 | 0.15 |
| Example 14 | SL-1/SL-2 | 50/50 | W-3 | 0.003 | SG-1 | 100 | SR-1/SR-5 | 90/10 | 3.44 | 0.18 |
| Example 15 | SL-1/SL-5 | 90/10 | W-4 | 0.003 | SG-1 | 100 | SR-1 | 100 | 2.51 | 0.14 |
| Example 16 | SL-1 | 100 | W-1 | 0.003 | SG-1 | 100 | SR-1 | 100 | 3.91 | 0.20 |
| Example 17 | SL-1 | 100 | W-1 | 0.003 | SG-1 | 100 | SR-1 | 100 | 1.87 | 0.17 |
| Example 18 | SL-1/SL-3 | 90/10 | W-6 | 0.003 | SG-1 | 100 | SR-1 | 100 | 2.93 | 0.14 |
| Example 19 | SL-1/SL-8 | 95/5 | W-2 | 0.003 | SG-1 | 100 | SR-1 | 100 | 1.40 | 0.15 |
| Example 20 | SL-1 | 100 | W-5 | 0.003 | SG-1 | 100 | SR-1 | 100 | 1.87 | 0.18 |
| Example 21 | SL-1 | 100 | W-1 | 0.003 | SG-1 | 100 | SR-1 | 100 | 2.98 | 0.18 |
| Example 22 | SL-1/SL-5/SL-6 | 60/20/20 | W-1 | 0.003 | SG-1 | 100 | SR-1 | 100 | 2.20 | 0.15 |
| Example 23 | SL-2 | 100 | W-2 | 0.003 | SG-1/SG-4 | 50/50 | SR-2 | 100 | 2.91 | 0.17 |
| Example 24 | SL-1/SL-5/SL-6 | 60/20/20 | W-4 | 0.003 | SG-1 | 100 | SR-1/SR-5 | 90/10 | 1.71 | 0.20 |
| Example 25 | SL-1/SL-4 | 90/10 | W-1 | 0.003 | SG-1 | 100 | No rinsing process | | 1.51 | 0.15 |
| Example 26 | SL-1/SL-5/SL-6 | 60/20/20 | W-1 | 0.003 | SG-1 | 100 | SR-1 | 100 | 3.33 | 0.30 |
| Comp. Ex. 1 | SL-1/SL-5 | 60/40 | W-1 | 0.003 | SG-1 | 100 | SR-1 | 100 | 1.00 | 1.00 |
| Comp. Ex. 2 | SL-1/SL-5 | 60/40 | W-1 | 0.003 | SG-1 | 100 | SR-1 | 100 | 14.02 | 1.72 |

As is apparent from the results in the above table, generation of bridge defects is conspicuous in Comparative Example 1 where the resin (D) having a fluorine atom and not having a $CF_3$ partial structure is not used. Particle generation and occurrence of bridge defect are also conspicuous in Comparative Example 2 where the resin not having a repeating unit not having a $CF_3$ partial structure and having a repeating unit having a $CF_3$ partial structure is used in the amount exceeding 10 mol %.

On the other hand, in Examples 1 to 26 where the resin (D) having a repeating unit having a fluorine atom and not having a $CF_3$ partial structure is used, both particle generation and bridge defect generation are little.

By using the resist in Example 1 and referring to U.S. Pat. No. 8,227,183B, Example 7 and the like, line and space mask pattern was exposed and then performed both alkali development and butyl acetate development. In this evaluation, pattern of the pitch of ½ of mask pattern was able to be formed.

Also, in Example 1, evaluation was performed similarly except for adding a small amount of tri-n-octylamine to the developer (butyl acetate). Also good pattern forming was able to be conducted.

A composition was prepared and evaluated in the same manner as in Examples 24 and 25 except for changing compound N-13 to Compound Cl-1, Compound Cl-7, respectively. It was confirmed that the obtained resist performance was almost the same level as in Examples 24 and 25.

INDUSTRIAL APPLICABILITY

According to the invention, a pattern forming method excellent in reduction of bridge defect and restrained in generation of particles in pattern formation of a fine pattern having a line width of 50 nm or less by a developing method using an organic developer, an actinic ray-sensitive or radiation-sensitive resin composition for use in the same method, a resist film, a manufacturing method of an electronic device, and an electronic device can be provided.

This application is based on a Japanese patent application filed on May 23, 2012 (Japanese Patent Application No. 2012-118056), US provisional application filed on May 23, 2012 (U.S. Provisional Application No. 61/650,710), and Japanese patent application filed on Mar. 8, 2013 (Japanese Patent Application No. 2013-046376), and the contents thereof are incorporated herein by reference.

The invention claimed is:

1. A pattern forming method comprising:
   (i) a step of forming a film by an actinic ray-sensitive or radiation-sensitive resin composition,
   (ii) a step of exposing the film, and
   (iii) a step of performing development by using a developer containing an organic solvent to form a negative pattern,
   wherein:
   the actinic ray-sensitive or radiation-sensitive resin composition contains (A) a resin capable of increasing the polarity by an action of an acid to decrease the solubility in a developer containing an organic solvent, (B) a compound capable of generating an acid upon irradiation with an actinic ray or radiation, (C) a solvent, and (D) a resin having a repeating unit having a fluorine atom and not having a $CF_3$ partial structure, and
   the repeating unit having a fluorine atom and not having a $CF_3$ partial structure in the resin (D) is a repeating unit having a linear or branched fluorinated alkyl group not having a $CF_3$ partial structure.

2. The pattern forming method as claimed in claim 1, wherein the fluorinated alkyl group not having a $CF_3$ partial structure is a linear fluorinated alkyl group.

3. The pattern forming method as claimed in claim 1, wherein the repeating unit having a fluorine atom and not having a $CF_3$ partial structure in the resin (D) is a repeating unit represented by the following formula (1):

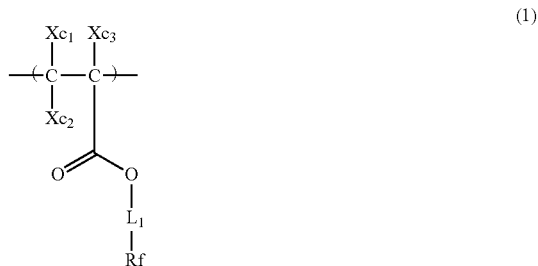

wherein each of $Xc_1$, $Xc_2$ and $Xc_3$ independently represents a hydrogen atom, a halogen atom, or an alkyl group not having a $CF_3$ partial structure;
$L_1$ represents a single bond or a divalent linking group not having a $CF_3$ partial structure; and
Rf represents a fluorinated alkyl group not having a $CF_3$ partial structure.

4. The pattern forming method as claimed in claim 3, wherein the terminal structure of the fluorinated alkyl group Rf not having a $CF_3$ partial structure is a $CH_3$ structure, a $CH_2F$ structure or a $CHF_2$ structure.

5. The pattern forming method as claimed in claim 3, wherein $L_1$ does not have an ester bond.

6. The pattern forming method as claimed in claim 1, wherein the resin (D) has a repeating unit represented by the following formula (2):

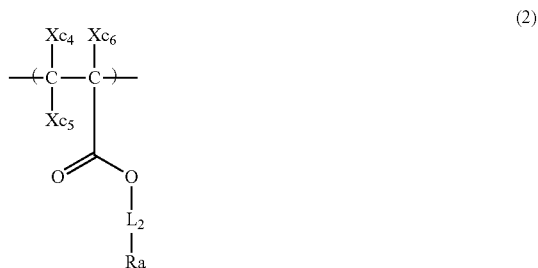

wherein each of $Xc_4$, $Xc_5$ and $Xc_6$ independently represents a hydrogen atom, a halogen atom, or an alkyl group not having a $CF_3$ partial structure;
$L_2$ represents a single bond or a divalent linking group not having a $CF_3$ partial structure; and
Ra represents a group having at least one $CH_3$ partial structure.

7. The pattern forming method as claimed in claim 6, wherein Ra in the repeating unit represented by formula (2) is a group having at least one structure represented by the following any of formulae (D3) to (D6):

-continued (D5)

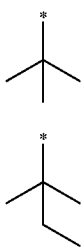

(D6)

wherein * represents a bond to be connected to other atom in the group having at least one structure represented by any of formulae (D3) to (D6), or to $L_2$ in the above formula (2).

8. The pattern forming method as claimed in claim 6, wherein the mass percentage content (%) in the repeating unit represented by formula (2), which is accounted for by the $CH_3$ partial structure of the repeating unit represented by formula (2), is 18.0% or more.

9. The pattern forming method as claimed in claim 1, wherein the weight average molecular weight of the resin (D) is 15,000 to 40,000.

10. The pattern forming method as claimed in claim 1, wherein the developer is a developer containing at least one organic solvent selected from the group consisting of a ketone-based solvent, an ester-based solvent, an alcohol-based solvent, an amide-based solvent, and an ether-based solvent.

11. The pattern forming method as claimed in claim 1, which further contains:
(iv) a step of performing rinsing by using a rinsing solution containing an organic solvent.

12. The pattern forming method as claimed in claim 1, wherein the actinic ray-sensitive or radiation-sensitive resin composition further contains a compound represented by the following formula (F):

(F)

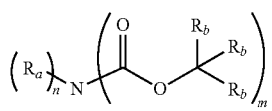

wherein in formula (F), each Ra independently represents a hydrogen atom, an alkyl group, a cycloalkyl group, an aryl group, or an aralkyl group, provided that when n=2, two Ra's may be the same or different, and two Ra's may combine with each other to form a divalent heterocyclic hydrocarbon group or a derivative thereof;

each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group;

at least two Rb's may combine to form an alicyclic hydrocarbon group, an aromatic hydrocarbon group, a heterocyclic hydrocarbon group, or a derivative thereof; and n represents an integer of 0 to 2, m represents an integer of 1 to 3, and n+m=3.

13. The pattern forming method as claimed in claim 1, wherein the repeating unit having a fluorine atom and not having a $CF_3$ partial structure in the resin (A) is a repeating unit represented by any of the following formulae:

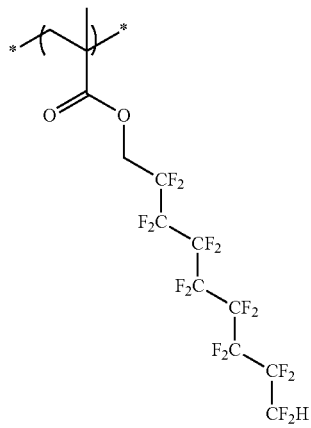

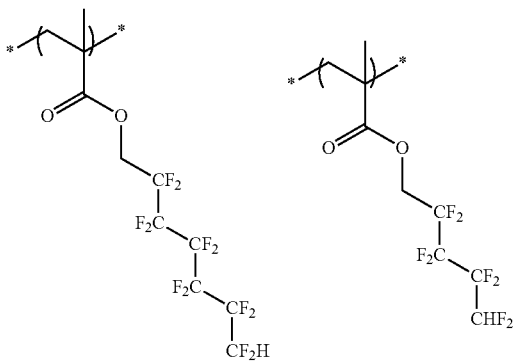

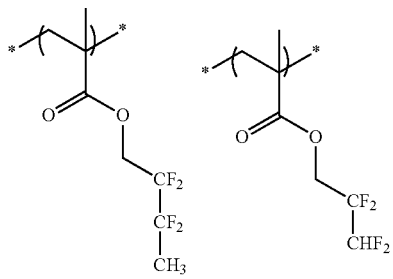

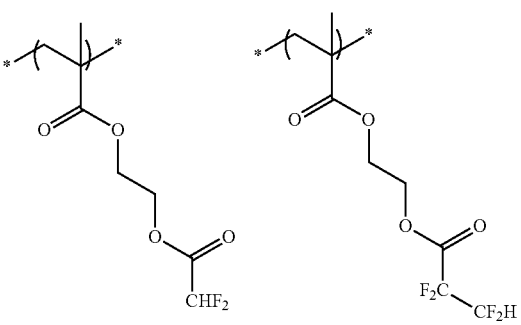

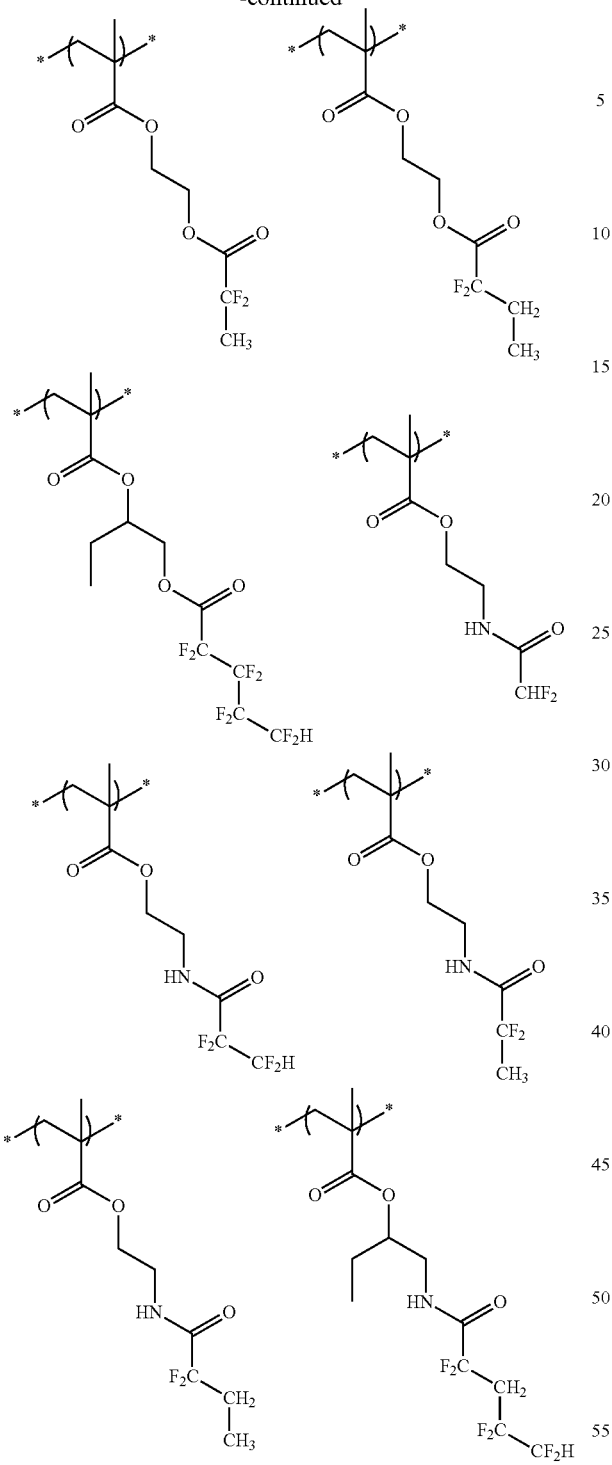

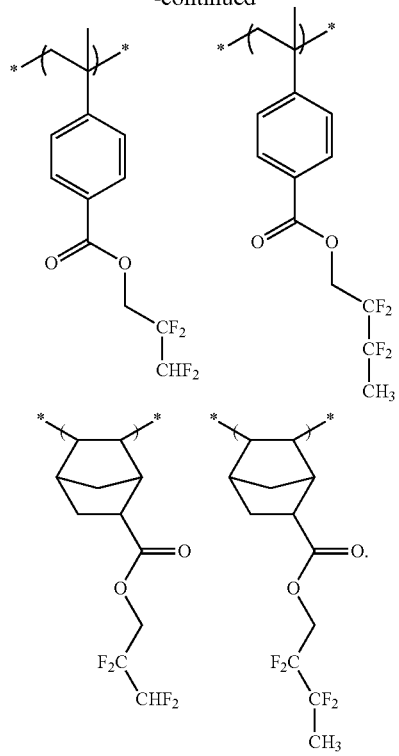

14. An actinic ray-sensitive or radiation-sensitive resin composition comprising:
   (A) a resin capable of increasing the polarity by an action of an acid to decrease the solubility in a developer containing an organic solvent,
   (B) a compound capable of generating an acid upon irradiation with an actinic ray or radiation,
   (C) a solvent, and
   (D) a resin having a repeating unit having a fluorine atom and not having a $CF_3$ partial structure,
   wherein the repeating unit having a fluorine atom and not having a $CF_3$ partial structure in the resin (D) is a repeating unit having a linear or branched fluorinated alkyl group not having a $CF_3$ partial structure.

15. A resist film formed with the actinic ray-sensitive or radiation-sensitive resin composition as claimed in claim 14.

16. A method for manufacturing an electronic device, comprising employing the pattern forming method according to claim 1 to form a negative pattern on an inorganic or coating-type inorganic substrate suitable for use in a process of producing a semiconductor, a liquid crystal device or a circuit board.

* * * * *